United States Patent
Bhutta et al.

(10) Patent No.: US 11,101,110 B2
(45) Date of Patent: Aug. 24, 2021

(54) IMPEDANCE MATCHING NETWORK AND METHOD

(71) Applicant: Reno Technologies, Inc., Wilmington, DE (US)

(72) Inventors: Imran Ahmed Bhutta, Moorestown, NJ (US); Ronald Anthony Decker, Turnersville, NJ (US); Michael Gilliam Ulrich, Delran, NJ (US); Bala Kandampalayam, Lansdale, PA (US)

(73) Assignee: RENO TECHNOLOGIES, INC.

( * ) Notice: Subject to any disclaimer, the term of this patent is extended or adjusted under 35 U.S.C. 154(b) by 0 days.

(21) Appl. No.: 16/926,002

(22) Filed: Jul. 10, 2020

(65) Prior Publication Data

US 2020/0343076 A1    Oct. 29, 2020

Related U.S. Application Data

(63) Continuation-in-part of application No. 16/839,424, filed on Apr. 3, 2020, now Pat. No. 10,741,364.
(Continued)

(51) Int. Cl.
*H03H 7/40*    (2006.01)
*H01J 37/32*   (2006.01)
(Continued)

(52) U.S. Cl.
CPC .. *H01J 37/32183* (2013.01); *H01L 21/02274* (2013.01); *H01L 21/28556* (2013.01); *H01L 21/31116* (2013.01); *H01L 21/31138* (2013.01); *H01L 21/32136* (2013.01); *H01L 21/67069* (2013.01); *H03H 7/38* (2013.01);
(Continued)

(58) Field of Classification Search
CPC .. H03H 7/38; H03H 7/40; H03H 11/28; H01J 37/82183; H01J 2237/332; H01J 2237/334; H01L 21/02274
See application file for complete search history.

(56) References Cited

U.S. PATENT DOCUMENTS 3,828,281 A   8/1974 Chambers
4,110,700 A   8/1978 Rosen et al.
(Continued)

FOREIGN PATENT DOCUMENTS

EP    0840349         5/1998
EP    0840350         5/1998
WO    WO 2006096589   9/2006

*Primary Examiner* — Stephen E. Jones
(74) *Attorney, Agent, or Firm* — The Belles Group, P.C.

(57) ABSTRACT

In one embodiment, the present disclosure may be directed to an impedance matching network that includes an electronically variable capacitor (EVC). The EVC includes discrete capacitors and corresponding switches, each switch configured to switch in and out one of the discrete capacitors to alter a capacitance of the EVC. The switches are operably coupled to a power supply providing a blocking voltage to the switches. A control circuit determines a blocking voltage value of the power supply. Upon determining the blocking voltage value is at or below a predetermined first level, the control circuit causes a limited altering of the capacitance of the EVC, the limited altering limiting the number or type of discrete capacitors to switch in or out based on the extent to which the blocking voltage value is at or below the first level.

20 Claims, 22 Drawing Sheets

Related U.S. Application Data which is a continuation of application No. 16/804,324, filed on Feb. 28, 2020, now Pat. No. 10,714,314, which is a continuation-in-part of application No. 16/685,698, filed on Nov. 15, 2019, which is a continuation-in-part of application No. 16/592,453, filed on Oct. 3, 2019, which is a continuation-in-part of application No. 16/524,805, filed on Jul. 29, 2019, now Pat. No. 10,727,029, which is a continuation-in-part of application No. 16/502,656, filed on Jul. 3, 2019, which is a continuation-in-part of application No. 16/029,742, filed on Jul. 9, 2018, now Pat. No. 10,483,090.

(60) Provisional application No. 62/873,370, filed on Jul. 12, 2019, provisional application No. 62/812,019, filed on Feb. 28, 2019, provisional application No. 62/812,025, filed on Feb. 28, 2019, provisional application No. 62/812,047, filed on Feb. 28, 2019, provisional application No. 62/767,587, filed on Nov. 15, 2018, provisional application No. 62/741,073, filed on Oct. 4, 2018, provisional application No. 62/782,915, filed on Dec. 20, 2018, provisional application No. 62/711,141, filed on Jul. 27, 2018, provisional application No. 62/693,625, filed on Jul. 3, 2018, provisional application No. 62/530,446, filed on Jul. 10, 2017.

(51) Int. Cl.
*H03H 7/38* (2006.01)
*H01L 21/02* (2006.01)
*H01L 21/311* (2006.01)
*H01L 21/3213* (2006.01)
*H01L 21/67* (2006.01)
*H01L 21/285* (2006.01)

(52) U.S. Cl.
CPC .......... *H03H 7/40* (2013.01); *H01J 2237/332* (2013.01); *H01J 2237/334* (2013.01)

(56) References Cited

U.S. PATENT DOCUMENTS

| | | |
|---|---|---|
| 4,679,007 A | 7/1987 | Reese et al. |
| 4,692,643 A | 9/1987 | Tokunaga et al. |
| 4,751,408 A | 6/1988 | Rambert |
| 4,929,855 A | 5/1990 | Ezzeddine |
| 5,012,123 A | 4/1991 | Ayasli et al. |
| 5,079,507 A | 1/1992 | Ishida et al. |
| 5,654,679 A | 8/1997 | Mavretic et al. |
| 5,815,047 A | 9/1998 | Sorensen et al. |
| 5,849,136 A | 12/1998 | Mintz et al. |
| 5,880,921 A | 3/1999 | Tham et al. |
| 5,889,252 A | 3/1999 | Williams et al. |
| 5,971,591 A | 10/1999 | Vona et al. |
| 6,046,641 A | 4/2000 | Chawla et al. |
| 6,137,367 A | 10/2000 | Ezzedine et al. |
| 6,252,354 B1 | 6/2001 | Collins et al. |
| 6,400,012 B1 | 6/2002 | Miller et al. |
| 6,424,232 B1 | 7/2002 | Mavretic et al. |
| 6,583,572 B2 | 6/2003 | Veltrop et al. |
| 6,621,372 B2 | 9/2003 | Kondo et al. |
| 6,657,395 B2 | 12/2003 | Windhorn |
| 6,677,828 B1 | 1/2004 | Harnett et al. |
| 6,703,080 B2 | 3/2004 | Reyzelman et al. |
| 6,791,274 B1 | 9/2004 | Hauer et al. |
| 6,794,951 B2 | 9/2004 | Finley |
| 6,818,562 B2 | 11/2004 | Todorow et al. |
| 6,888,313 B2 | 5/2005 | Blackburn et al. |
| 6,888,396 B2 | 5/2005 | Hajimiri et al. |
| 6,946,847 B2 | 9/2005 | Nishimori et al. |
| 6,967,547 B2 | 11/2005 | Pellegrini et al. |
| 7,004,107 B1 | 2/2006 | Raoux et al. |
| RE39,051 E | 3/2006 | Harnett |
| 7,071,786 B2 | 7/2006 | Inoue et al. |
| 7,095,178 B2 | 8/2006 | Nakano et al. |
| 7,113,761 B2 | 9/2006 | Bickham et al. |
| 7,122,965 B2 | 10/2006 | Goodman |
| 7,164,236 B2 | 1/2007 | Mitrovic et al. |
| 7,199,678 B2 | 4/2007 | Matsuno |
| 7,251,121 B2 | 7/2007 | Bhutta |
| 7,298,091 B2 | 11/2007 | Pickard et al. |
| 7,298,128 B2 | 11/2007 | Bhutta |
| 7,304,438 B2 | 12/2007 | Kishinevsky |
| 7,332,981 B2 | 2/2008 | Matsuno |
| 7,439,610 B2 | 10/2008 | Weigand |
| 7,480,571 B2 | 1/2009 | Howald et al. |
| 7,495,524 B2 | 2/2009 | Omae et al. |
| 7,498,908 B2 | 3/2009 | Gurov |
| 7,514,935 B2 | 4/2009 | Pankratz |
| 7,518,466 B2 | 4/2009 | Sorensen et al. |
| 7,535,312 B2 | 5/2009 | McKinzie, III |
| 7,602,127 B2 | 10/2009 | Coumou |
| 7,642,879 B2 | 1/2010 | Matsuno |
| 7,666,464 B2 | 2/2010 | Collins et al. |
| 7,714,676 B2 | 5/2010 | McKinzie, III |
| 7,728,602 B2 | 6/2010 | Valcore et al. |
| 7,745,955 B2 | 6/2010 | Kirchmeier et al. |
| 7,755,300 B2 | 7/2010 | Kishinevsky et al. |
| 7,764,140 B2 | 7/2010 | Nagarkatti et al. |
| 7,777,567 B2 | 8/2010 | Polizze |
| 7,852,170 B2 | 12/2010 | McKinzie, III |
| 7,863,996 B2 | 1/2011 | Cotter et al. |
| 7,868,556 B2 | 1/2011 | Xia |
| 7,872,523 B2 | 1/2011 | Sivakumar et al. |
| 7,917,104 B2 | 3/2011 | Manssen et al. |
| 7,969,096 B2 | 6/2011 | Chen |
| 8,008,982 B2 | 8/2011 | Mckinzie, III |
| 8,031,926 B2 | 10/2011 | Sutko et al. |
| 8,040,068 B2 | 10/2011 | Coumou et al. |
| RE42,917 E | 11/2011 | Hauer et al. |
| 8,089,026 B2 | 1/2012 | Sellers |
| 8,102,954 B2 | 1/2012 | Coumou |
| 8,110,991 B2 | 2/2012 | Coumou |
| 8,203,859 B2 | 6/2012 | Omae et al. |
| 8,217,731 B2 | 7/2012 | Mckinzie, III |
| 8,217,732 B2 | 7/2012 | Mckinzie, III |
| 8,228,112 B2 | 7/2012 | Reynolds |
| 8,237,501 B2 | 8/2012 | Owen |
| 8,264,154 B2 | 9/2012 | Banner et al. |
| 8,278,909 B2 | 10/2012 | Fletcher |
| 8,289,029 B2 | 10/2012 | Coumou |
| 8,299,867 B2 | 10/2012 | Mckinzie, III |
| 8,314,561 B2 | 11/2012 | Fisk et al. |
| 8,330,432 B2 | 12/2012 | Van Zyl et al. |
| 8,334,657 B2 | 12/2012 | Xia |
| 8,334,700 B2 | 12/2012 | Coumou et al. |
| 8,335,479 B2 | 12/2012 | Koya et al. |
| 8,344,559 B2 | 1/2013 | Van Zyl et al. |
| 8,344,801 B2 | 1/2013 | Owen et al. |
| 8,368,308 B2 | 2/2013 | Banna et al. |
| 8,368,469 B2 | 2/2013 | Mohammadi et al. |
| 8,395,322 B2 | 3/2013 | Coumou |
| 8,416,008 B2 | 4/2013 | Van Zyl et al. |
| 8,436,643 B2 | 5/2013 | Mason |
| 8,461,842 B2 | 6/2013 | Thuringer et al. |
| 8,466,736 B1 | 6/2013 | Reynolds |
| 8,487,706 B2 | 7/2013 | Li et al. |
| 8,502,689 B2 | 8/2013 | Chen et al. |
| 8,513,889 B2 | 8/2013 | Zhang et al. |
| 8,520,413 B2 | 8/2013 | Tran et al. |
| 8,536,636 B2 | 9/2013 | Englekirk |
| 8,552,665 B2 | 10/2013 | Larson et al. |
| 8,558,633 B2 | 10/2013 | Mckinzie, III |
| 8,559,907 B2 | 10/2013 | Burgener et al. |
| 8,564,381 B2 | 10/2013 | Mckinzie |
| 8,569,842 B2 | 10/2013 | Weis et al. |
| 8,576,010 B2 | 11/2013 | Yanduru |
| 8,576,013 B2 | 11/2013 | Coumou |
| 8,587,321 B2 | 11/2013 | Chen et al. |

(56) References Cited

U.S. PATENT DOCUMENTS

| | | |
|---|---|---|
| 8,620,236 B2 | 12/2013 | Manssen et al. |
| 8,624,501 B2 | 1/2014 | Nagarkatti et al. |
| 8,633,782 B2 | 1/2014 | Nagarkatti et al. |
| 8,638,159 B2 | 1/2014 | Ranta et al. |
| 8,649,754 B2 | 2/2014 | Burgener et al. |
| 8,659,335 B2 | 2/2014 | Nagarkatti et al. |
| 8,674,606 B2 | 3/2014 | Carter et al. |
| 8,680,928 B2 | 3/2014 | Jeon et al. |
| 8,686,796 B2 | 4/2014 | Presti |
| 8,710,926 B2 | 4/2014 | Nagarkatti et al. |
| 8,716,984 B2 | 5/2014 | Mueller et al. |
| 8,723,423 B2 | 5/2014 | Hoffman et al. |
| 8,742,669 B2 | 6/2014 | Carter et al. |
| 8,773,019 B2 | 7/2014 | Coumou et al. |
| 8,779,859 B2 | 7/2014 | Su et al. |
| 8,781,415 B1 | 7/2014 | Coumou et al. |
| 8,815,329 B2 | 8/2014 | Ilic et al. |
| 8,847,561 B2 | 9/2014 | Karlieek et al. |
| 8,884,180 B2 | 11/2014 | Ilic et al. |
| 8,884,525 B2 | 11/2014 | Hoffman et al. |
| 8,890,537 B2 | 11/2014 | Valcore, Jr. et al. |
| 8,912,835 B2 | 12/2014 | Nagarkatti et al. |
| 8,928,329 B2 | 1/2015 | Downing et al. |
| 9,083,343 B1 | 7/2015 | Li et al. |
| 9,190,993 B1 | 11/2015 | Li |
| 9,306,533 B1 | 4/2016 | Anton |
| 10,269,540 B1 | 4/2019 | Carter et al. |
| 10,483,090 B2 | 11/2019 | Bhutta et al. |
| 2002/0060914 A1 | 5/2002 | Porter et al. |
| 2002/0185227 A1 | 12/2002 | MacGearailt |
| 2003/0007372 A1 | 1/2003 | Porter et al. |
| 2003/0046013 A1 | 3/2003 | Gerrish |
| 2006/0170367 A1 | 8/2006 | Bhutta |
| 2006/0198077 A1 | 9/2006 | Bhutta |
| 2006/0232471 A1 | 10/2006 | Coumou |
| 2007/0075784 A1 | 4/2007 | Pettersson et al. |
| 2007/0139122 A1 | 6/2007 | Nagarkatti et al. |
| 2008/0179948 A1 | 7/2008 | Nagarkatti et al. |
| 2008/0180179 A1 | 7/2008 | Polizzo |
| 2008/0197854 A1 | 8/2008 | Valcore et al. |
| 2009/0207537 A1 | 8/2009 | Coumou |
| 2010/0001796 A1 | 1/2010 | Sivakumar et al. |
| 2010/0073104 A1 | 3/2010 | Cotter et al. |
| 2010/0123502 A1 | 5/2010 | Bhutta et al. |
| 2010/0194195 A1 | 8/2010 | Coumou et al. |
| 2010/0201370 A1 | 8/2010 | Coumou et al. |
| 2010/0231296 A1 | 9/2010 | Nagarkatti et al. |
| 2011/0241781 A1 | 10/2011 | Owen et al. |
| 2011/0247696 A1 | 10/2011 | Zolock et al. |
| 2012/0013253 A1 | 1/2012 | Coumou |
| 2012/0062322 A1 | 3/2012 | Owen |
| 2012/0188007 A1 | 7/2012 | Van Zyl et al. |
| 2012/0262064 A1 | 10/2012 | Nagarkatti et al. |
| 2013/0043854 A1 | 2/2013 | Tran et al. |
| 2013/0169359 A1 | 7/2013 | Coumou |
| 2013/0193867 A1 | 8/2013 | Van Zyl et al. |
| 2013/0207738 A1 | 8/2013 | Mason |
| 2013/0222055 A1 | 8/2013 | Coumou et al. |
| 2013/0257311 A1 | 10/2013 | Tran et al. |
| 2013/0314163 A1 | 11/2013 | Costa |
| 2013/0320853 A1 | 12/2013 | Carter et al. |
| 2014/0009248 A1 | 1/2014 | Granger-Jones |
| 2014/0028389 A1 | 1/2014 | Coumou |
| 2014/0028398 A1 | 1/2014 | Owen |
| 2014/0049250 A1 | 2/2014 | Brown et al. |
| 2014/0055034 A1 | 2/2014 | Coumou |
| 2014/0061156 A1 | 3/2014 | Brouk et al. |
| 2014/0062303 A1 | 3/2014 | Hoffman et al. |
| 2014/0097908 A1 | 4/2014 | Fisk, II et al. |
| 2014/0117861 A1 | 5/2014 | Finley et al. |
| 2014/0117872 A1 | 5/2014 | Finley |
| 2014/0118031 A1 | 5/2014 | Rughoonundon et al. |
| 2014/0210345 A1 | 7/2014 | Hoffman |
| 2014/0210551 A1 | 7/2014 | Mueller |
| 2014/0218076 A1 | 8/2014 | Coumou et al. |
| 2014/0220913 A1 | 8/2014 | Coumou et al. |
| 2014/0231243 A1 | 8/2014 | Finley |
| 2014/0232266 A1 | 8/2014 | Finley et al. |
| 2014/0266492 A1 | 9/2014 | Radomski et al. |
| 2014/0306742 A1 | 10/2014 | Menzer et al. |
| 2014/0320013 A1 | 10/2014 | Coumou et al. |
| 2015/0115289 A1 | 4/2015 | Fursin et al. |
| 2015/0348854 A1 | 12/2015 | Kapoor et al. |
| 2017/0345620 A1 | 11/2017 | Coumou et al. |
| 2018/0076788 A1 | 3/2018 | Decker et al. |
| 2019/0272978 A1 | 9/2019 | Bhutta et al. |
| 2020/0144032 A1 | 5/2020 | Ulrich |

IMPEDANCE MATCHING NETWORK AND METHOD

CROSS REFERENCE TO RELATED APPLICATIONS

The present application is a continuation in part of U.S. patent application Ser. No. 16/839,424, filed Apr. 3, 2020, which is a continuation of U.S. patent application Ser. No. 16/804,324, filed Feb. 28, 2020, which is a continuation in part of U.S. patent application Ser. No. 16/685,698, filed Nov. 15, 2019, which is a continuation in part of U.S. patent application Ser. No. 16/592,453, filed Oct. 3, 2019, which is a continuation in part of U.S. patent application Ser. No. 16/524,805, filed Jul. 29, 2019, which is a continuation in part of U.S. patent application Ser. No. 16/502,656, filed Jul. 3, 2019, which is a continuation in part of U.S. patent application Ser. No. 16/029,742, filed Jul. 9, 2018, which claims the benefit of U.S. Provisional Patent Application No. 62/530,446, filed Jul. 10, 2017. U.S. patent application Ser. No. 16/502,656 further claims the benefit of U.S. Provisional Patent Application No. 62/693,625, filed Jul. 3, 2018. U.S. patent application Ser. No. 16/524,805 further claims the benefit of U.S. Provisional Patent Application No. 62/711,141, filed Jul. 27, 2018. U.S. patent application Ser. No. 16/592,453 further claims the benefit of U.S. Provisional Patent Application No. 62/741,073, filed Oct. 4, 2018, and U.S. Provisional Patent Application No. 62/782,915, filed Dec. 20, 2018. U.S. patent application Ser. No. 16/685,698 further claims the benefit of 62/767,587, filed Nov. 15, 2018. U.S. patent application Ser. No. 16/804,324 further claims the benefit of U.S. Provisional Patent Application No. 62/812,019, filed Feb. 28, 2019, U.S. Provisional Patent Application No. 62/812,025, filed Feb. 28, 2019, and U.S. Provisional Patent Application No. 62/812,047, filed Feb. 28, 2019. The present application further claims the benefit of U.S. Provisional Patent Application No. 62/873,370, filed Jul. 12, 2019. The disclosures of the foregoing references are incorporated herein by reference in their entireties.

BACKGROUND

The semiconductor device fabrication process uses plasma processing at different stages of fabrication to make a semiconductor device such as a microprocessor, a memory chip, or another integrated circuit or device. Plasma processing involves energizing a gas mixture by imparting energy to the gas molecules by the introduction of RF (radio frequency) energy into the gas mixture. This gas mixture is typically contained in a vacuum chamber, also called a plasma chamber, and the RF energy is introduced through electrodes or other means in the chamber. In a typical plasma process, the RF generator generates power at the desired RF frequency and power, and this power is transmitted through the RF cables and networks to the plasma chamber.

To provide efficient transfer of power from the RF generator to the plasma chamber, an RF matching network is positioned between the RF generator and the plasma chamber. The purpose of the RF matching network is to transform the plasma impedance to a value suitable for the RF generator. In many cases, particularly in the semiconductor fabrication processes, the RF power is transmitted through 50 Ohm coaxial cables and the system impedance (output impedance) of the RF generators is also 50 Ohm. On the other hand, the impedance of the plasma, driven by the RF power, varies. The impedance on the input side of the RF matching network must be transformed to non-reactive 50 Ohm (i.e., 50+j0) for maximum power transmission. RF matching network perform this task of continuously transforming the plasma impedance to 50 Ohm for the RF generator.

A typical RF matching network is composed of variable capacitors and a microprocessor-based control circuit to control the capacitors. The value and size of the variable capacitors are influenced by the power handling capability, frequency of operation, and impedance range of the plasma chamber. The predominant variable capacitor in use in RF matching networks is the vacuum variable capacitor (VVC). The VVC is an electromechanical device, consisting of two concentric metallic rings that move in relation to each other to change the capacitance. In complex semiconductor processes, where the impedance changes are very rapid, the rapid and frequent movements put stresses on the VVC leading to their failures. VVC-based RF matching networks are one of the last electromechanical components in the semiconductor fabrication process.

As semiconductor devices shrink in size and become more complex, however, the feature geometries become very small. As a result, the processing time to fabricate these features becomes small, typically in the 5-6 second range. Current RF matching networks take 1-2 seconds to tune the process and this results in unstable process parameters for a significant portion of the process time. Electronically variable capacitor (EVC) technology (see, e.g., U.S. Pat. No. 7,251,121, incorporated herein by reference) enables a reduction in this semiconductor processing tune time from 1-2 seconds to less than 500 microseconds. EVC-based matching networks are a type of solid state matching network. Their decreased tune time greatly increases the available stable processing time, thereby improving yield and performance.

While EVC technology is known, it has yet to be developed into an industry-accepted replacement for VVCs. However, because an EVC is purely an electronic device, an EVC is not a one-for-one replacement for a VVC in an RF matching network. Further advancements are therefore needed to more fully take advantage of using EVCs as part of an RF matching network.

BRIEF SUMMARY

The present disclosure may be directed, in one aspect, to an impedance matching network, the network comprising a radio frequency (RF) input configured to operably couple to an RF source; an RF output configured to operably couple to a plasma chamber; an electronically variable capacitor (EVC) comprising discrete capacitors and corresponding switches, each switch configured to switch in and out one of the discrete capacitors to alter a capacitance of the EVC, wherein the switches are operably coupled to a power supply configured to provide a blocking voltage to the switches; and a control circuit operably coupled to the EVC, the control circuit configured to determine a blocking voltage value of the power supply based on a measured parameter related to the matching network; and upon determining the blocking voltage value is at or below a predetermined first level, cause a limited altering of the capacitance of the EVC, the limited altering limiting the number or type of discrete capacitors to switch in or out based on the extent to which the blocking voltage value is at or below the first level.

In another aspect, a method for impedance matching comprises operably coupling a radio frequency (RF) input of a matching network to an RF source, and operably coupling an RF output of the matching network to a plasma chamber, wherein the matching network comprises an electronically variable capacitor (EVC) comprising discrete capacitors and corresponding switches, each switch configured to switch in and out one of the discrete capacitors to alter a capacitance of the EVC, wherein the switches are operably coupled to a power supply configured to provide a blocking voltage to the switches; determining a blocking voltage value of the power supply based on a measured parameter related to the matching network; and upon determining the blocking voltage value is at or below a predetermined first level, causing a limited altering of the capacitance of the EVC, the limited altering limiting the number or type of discrete capacitors to switch in or out based on the extent to which the blocking voltage value is at or below the first level.

In another aspect, a semiconductor processing tool comprises a plasma chamber configured to deposit a material onto a substrate or etch a material from a substrate and an impedance matching network as described above.

In another aspect, a method of manufacturing a semiconductor comprises placing a substrate in a plasma chamber configured to deposit a material layer onto the substrate or etch a material layer from the substrate; coupling an impedance matching network as described above between an RF source and the plasma chamber; and performing impedance matching as described above.

BRIEF DESCRIPTION OF THE DRAWINGS

The present disclosure will become more fully understood from the detailed description and the accompanying drawings, wherein.

DETAILED DESCRIPTION

Figure 1:
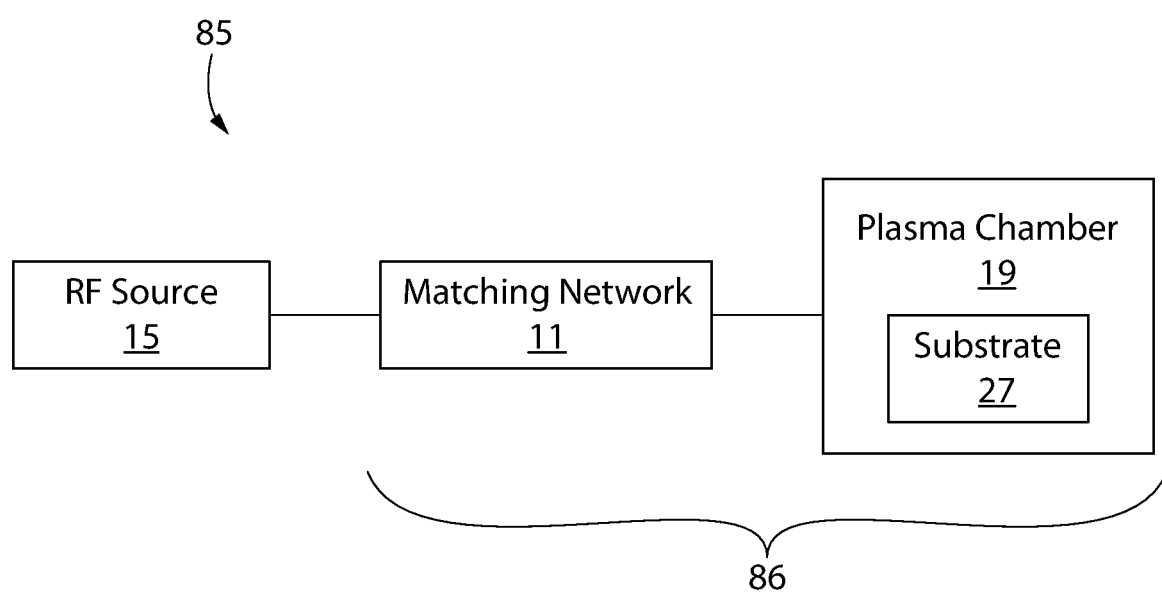
FIG. 1 is a block diagram of an embodiment of a semiconductor processing system.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present inventions. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

Features of the present inventions may be implemented in software, hardware, firmware, or combinations thereof. The computer programs described herein are not limited to any particular embodiment, and may be implemented in an operating system, application program, foreground or background processes, driver, or any combination thereof. The computer programs may be executed on a single computer or server processor or multiple computer or server processors.

Processors described herein may be any central processing unit (CPU), microprocessor, micro-controller, computational, or programmable device or circuit configured for executing computer program instructions (e.g., code). Various processors may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc.

Computer-executable instructions or programs (e.g., software or code) and data described herein may be programmed into and tangibly embodied in a non-transitory computer-readable medium that is accessible to and retrievable by a respective processor as described herein which configures and directs the processor to perform the desired functions and processes by executing the instructions encoded in the medium. A device embodying a programmable processor configured to such non-transitory computer-executable instructions or programs may be referred to as a "programmable device", or "device", and multiple programmable devices in mutual communication may be referred to as a "programmable system." It should be noted that non-transitory "computer-readable medium" as described herein may include, without limitation, any suitable volatile or non-volatile memory including random access memory (RAM) and various types thereof, read-only memory (ROM) and various types thereof, USB flash memory, and magnetic or optical data storage devices (e.g., internal/external hard disks, floppy discs, magnetic tape CD-ROM, DVD-ROM, optical disk, ZIP™ drive, Blu-ray disk, and others), which may be written to and/or read by a processor operably connected to the medium.

In certain embodiments, the present invention may be embodied in the form of computer-implemented processes and apparatuses such as processor-based data processing and communication systems or computer systems for practicing those processes. The present invention may also be embodied in the form of software or computer program code embodied in a non-transitory computer-readable storage medium, which when loaded into and executed by the data processing and communications systems or computer systems, the computer program code segments configure the processor to create specific logic circuits configured for implementing the processes.

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

In the following description, where circuits are shown and described, one of skill in the art will recognize that, for the sake of clarity, not all peripheral circuits or components are shown in the figures or described in the description. Further, the terms "couple" and "operably couple" can refer to a direct or indirect coupling of two components of a circuit.

The following description of the preferred embodiment(s) is merely exemplary in nature and is in no way intended to limit the invention or inventions. The description of illustrative embodiments is intended to be read in connection with the accompanying drawings, which are to be considered part of the entire written description. In the description of the exemplary embodiments disclosed herein, any reference to direction or orientation is merely intended for convenience of description and is not intended in any way to limit the scope of the present invention. Relative terms such as "lower," "upper," "horizontal," "vertical," "above," "below," "up," "down," "left," "right," "top," "bottom," "front" and "rear" as well as derivatives thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," "secured" and other similar terms refer to a relationship wherein structures are secured or attached to one another either directly or indirectly through intervening structures, as well as both movable or rigid attachments or relationships, unless expressly described otherwise. The discussion herein describes and illustrates some possible non-limiting combinations of features that may exist alone or in other combinations of features. Furthermore, as used herein, the term "or" is to be interpreted as a logical operator that results in true whenever one or more of its operands are true. Furthermore, as used herein, the phrase "based on" is to be interpreted as meaning "based at least in part on," and therefore is not limited to an interpretation of "based entirely on."

As used throughout, ranges are used as shorthand for describing each and every value that is within the range. Any value within the range can be selected as the terminus of the range. In addition, all references cited herein are hereby incorporated by referenced in their entireties. In the event of a conflict in a definition in the present disclosure and that of a cited reference, the present disclosure controls.

Semiconductor Processing System

Referring to FIG. 1, a semiconductor device processing system 5 utilizing an RF generator 15 is shown. The system 85 includes an RF generator 15 and a semiconductor processing tool 86. The semiconductor processing tool 86 includes a matching network 11 and a plasma chamber 19. In other embodiments, the generator 15 or other power source can form part of the semiconductor processing tool.

The semiconductor device can be a microprocessor, a memory chip, or other type of integrated circuit or device. A substrate 27 can be placed in the plasma chamber 19, where the plasma chamber 19 is configured to deposit a material layer onto the substrate 27 or etch a material layer from the substrate 27. Plasma processing involves energizing a gas mixture by imparting energy to the gas molecules by introducing RF energy into the gas mixture. This gas mixture is typically contained in a vacuum chamber (the plasma chamber 19), and the RF energy is typically introduced into the plasma chamber 19 through electrodes. Thus, the plasma can be energized by coupling RF power from an RF source 15 into the plasma chamber 19 to perform deposition or etching.

In a typical plasma process, the RF generator 15 generates power at a radio frequency—which is typically within the range of 3 kHz and 300 GHz—and this power is transmitted through RF cables and networks to the plasma chamber 19. In order to provide efficient transfer of power from the RF generator 15 to the plasma chamber 19, an intermediary circuit is used to match the fixed impedance of the RF generator 15 with the variable impedance of the plasma chamber 19. Such an intermediary circuit is commonly referred to as an RF impedance matching network, or more simply as an RF matching network. The purpose of the RF matching network 11 is to transform the variable plasma impedance to a value that more closely matches the fixed impedance of the RF generator 15. Commonly owned U.S. patent application Ser. No. 14/669,568, the disclosure of which is incorporated herein by reference in its entirety, provides an example of such a matching network.

Matching Network

Figure 2:
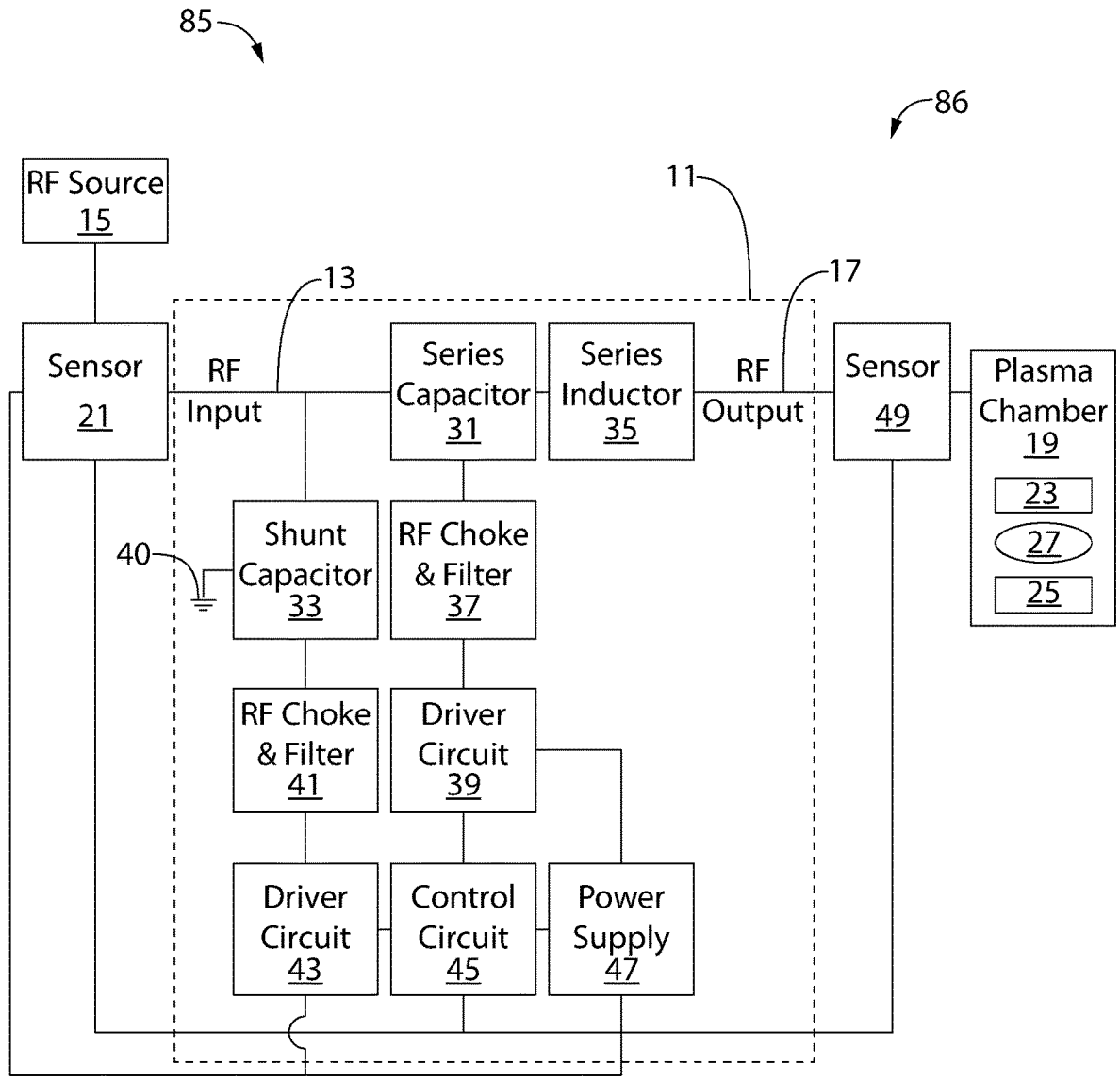
FIG. 2 is a block diagram of an embodiment of a semiconductor processing system having an L-configuration matching network.

FIG. 2 is a block diagram of an embodiment of a semiconductor processing system 85 having a processing tool 86 that includes an L-configuration RF impedance matching network 11. The matching network 11 has an RF input 13 connected to an RF source 15 and an RF output 17 connected to a plasma chamber 19. An RF input sensor 21 can be connected between the RF impedance matching network 11 and the RF source 15. An RF output sensor 49 can be connected between the RF impedance matching network 11 and the plasma chamber 19 so that the RF output from the impedance matching network, and the plasma impedance presented by the plasma chamber 19, may be monitored. Certain embodiments may include only one of the input sensor 21 and the output sensor 49. The functioning of these sensors 21, 49 are described in greater detail below.

As discussed above, the RF impedance matching network 11 serves to help maximize the amount of RF power transferred from the RF source 15 to the plasma chamber 19 by matching the impedance at the RF input 13 to the fixed impedance of the RF source 15. The matching network 11 can consist of a single module within a single housing designed for electrical connection to the RF source 15 and plasma chamber 19. In other embodiments, the components of the matching network 11 can be located in different housings, some components can be outside of the housing, and/or some components can share a housing with a component outside the matching network.

As is known in the art, the plasma within a plasma chamber 19 typically undergoes certain fluctuations outside of operational control so that the impedance presented by the plasma chamber 19 is a variable impedance. Since the variable impedance of the plasma chamber 19 cannot be fully controlled, and an impedance matching network may be used to create an impedance match between the plasma chamber 19 and the RF source 15. Moreover, the impedance of the RF source 15 may be fixed at a set value by the design of the particular RF source 15. Although the fixed impedance of an RF source 15 may undergo minor fluctuations during use, due to, for example, temperature or other environmental variations, the impedance of the RF source 15 is still considered a fixed impedance for purposes of impedance matching because the fluctuations do not significantly vary the fixed impedance from the originally set impedance value. Other types of RF source 15 may be designed so that the impedance of the RF source 15 may be set at the time of, or during, use. The impedance of such types of RF sources 15 is still considered fixed because it may be controlled by a user (or at least controlled by a programmable controller) and the set value of the impedance may be known at any time during operation, thus making the set value effectively a fixed impedance.

The RF source 15 may be an RF generator of a type that is well-known in the art, and generates an RF signal at an appropriate frequency and power for the process performed within the plasma chamber 19. The RF source 15 may be electrically connected to the RF input 13 of the RF impedance matching network 11 using a coaxial cable, which for impedance matching purposes would have the same fixed impedance as the RF source 15.

The plasma chamber 19 includes a first electrode 23 and a second electrode 25, and in processes that are well known in the art, the first and second electrodes 23, 25, in conjunction with appropriate control systems (not shown) and the plasma in the plasma chamber, enable one or both of deposition of materials onto a substrate 27 and etching of materials from the substrate 27.

In the exemplified embodiment, the RF impedance matching network 11 includes a series variable capacitor 31, a shunt variable capacitor 33, and a series inductor 35 to form an 'L' type matching network. The shunt variable capacitor 33 is shown shunting to a reference potential, in this case ground 40, between the series variable capacitor 31 and the series inductor 35, and one of skill in the art will recognize that the RF impedance matching network 11 may be configured with the shunt variable capacitor 33 shunting to a reference potential at the RF input 13 or at the RF output 17.

Figure 3:
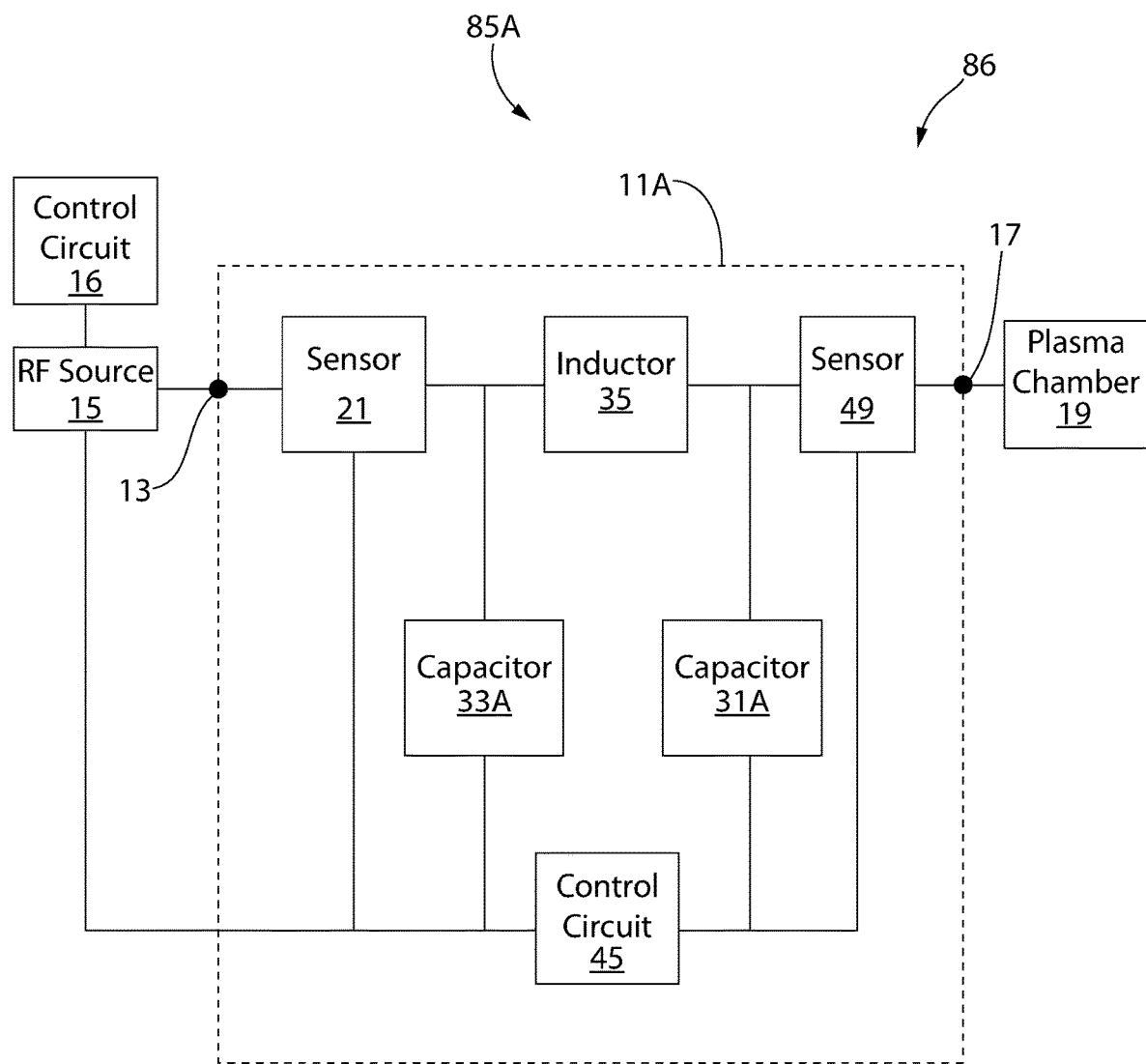
FIG. 3 is a block diagram of an embodiment of a semiconductor processing system having a pi-configuration matching network.

Alternatively, the RF impedance matching network 11 may be configured in other matching network configurations, such as a 'T' type configuration or a "Π" or 'pi' type configuration, as will be shown in FIG. 3. In certain embodiments, the variable capacitors and the switching circuit described below may be included in any configuration appropriate for an RF impedance matching network.

In the exemplified embodiment, each of the series variable capacitor 31 and the shunt variable capacitor 33 may be an electronic variable capacitor (EVC), as described in U.S. Pat. No. 7,251,121, the EVC being effectively formed as a capacitor array formed by a plurality of discrete capacitors. The series variable capacitor 31 is coupled in series between the RF input 13 and the RF output 17 (which is also in parallel between the RF source 15 and the plasma chamber 19). The shunt variable capacitor 33 is coupled in parallel between the RF input 13 and ground 40. In other configurations, the shunt variable capacitor 33 may be coupled in parallel between the RF output 19 and ground 40. Other configurations may also be implemented without departing from the functionality of an RF matching network. In still other configurations, the shunt variable capacitor 33 may be coupled in parallel between a reference potential and one of the RF input 13 and the RF output 19.

The series variable capacitor 31 is connected to a series RF choke and filter circuit 37 and to a series driver circuit 39. Similarly, the shunt variable capacitor 33 is connected to a shunt RF choke and filter circuit 41 and to a shunt driver circuit 43. Each of the series and shunt driver circuits 39, 43 are connected to a control circuit 45, which is configured with an appropriate processor and/or signal generating circuitry to provide an input signal for controlling the series and shunt driver circuits 39, 43. A power supply 47 is connected to each of the RF input sensor 21, the series driver circuit 39, the shunt driver circuit 43, and the control circuit 45 to provide operational power, at the designed currents and voltages, to each of these components. The voltage levels provided by the power supply 47, and thus the voltage levels employed by each of the RF input sensor 21, the series driver circuit 39, the shunt driver circuit 43, and the control circuit 45 to perform the respective designated tasks, is a matter of design choice. In other embodiments, a variety of electronic components can be used to enable the control circuit 45 to send instructions to the variable capacitors. Further, while the driver circuit and RF choke and filter are shown as separate from the control circuit 45, these components can also be considered as forming part of the control circuit 45.

In the exemplified embodiment, the control circuit 45 includes a processor. The processor may be any type of properly programmed processing device, such as a computer or microprocessor, configured for executing computer program instructions (e.g., code). The processor may be embodied in computer and/or server hardware of any suitable type (e.g., desktop, laptop, notebook, tablets, cellular phones, etc.) and may include all the usual ancillary components necessary to form a functional data processing device including without limitation a bus, software and data storage such as volatile and non-volatile memory, input/output devices, graphical user interfaces (GUIs), removable data storage, and wired and/or wireless communication interface devices including Wi-Fi, Bluetooth, LAN, etc. The processor of the exemplified embodiment is configured with specific algorithms to enable matching network to perform the functions described herein.

With the combination of the series variable capacitor 31 and the shunt variable capacitor 33, the combined impedances of the RF impedance matching network 11 and the plasma chamber 19 may be controlled, using the control circuit 45, the series driver circuit 39, the shunt driver circuit 43, to match, or at least to substantially match, the fixed impedance of the RF source 15.

The control circuit 45 is the brains of the RF impedance matching network 11, as it receives multiple inputs, from sources such as the RF input sensor 21 and the series and shunt variable capacitors 31, 33, makes the calculations necessary to determine changes to the series and shunt variable capacitors 31, 33, and delivers commands to the series and shunt variable capacitors 31, 33 to create the impedance match. The control circuit 45 is of the type of control circuit that is commonly used in semiconductor fabrication processes, and therefore known to those of skill in the art. Any differences in the control circuit 45, as compared to control circuits of the prior art, arise in programming differences to account for the speeds at which the RF impedance matching network 11 is able to perform switching of the variable capacitors 31, 33 and impedance matching.

Each of the series and shunt RF choke and filter circuits 37, 41 are configured so that DC signals may pass between the series and shunt driver circuits 39, 43 and the respective series and shunt variable capacitors 31, 33, while at the same time the RF signal from the RF source 15 is blocked to prevent the RF signal from leaking into the outputs of the series and shunt driver circuits 39, 43 and the output of the control circuit 45. The series and shunt RF choke and filter circuits 37, 41 are of a type known to those of skill in the art.

FIG. 3 is a block diagram of an embodiment of a semiconductor processing system 85A having a pi-configuration matching network 11A, as opposed to the L-configuration matching network of FIG. 2. For ease of understanding, this figure omits the RF chokes and filters, driver circuits, and power supplies of FIG. 2. Where FIG. 3 uses reference numbers identical to those of FIG. 2, it is understood that the relevant components can have features similar to those discussed with regard to FIG. 2.

The most significant difference between the L- and pi-configuration is that the L-configuration utilizes a series capacitor 31 and shunt capacitor 33, while the pi-configuration utilizes two shunt capacitors 31A, 33A. Nevertheless, the control circuit can alter the capacitance of these shunt variable capacitors 31A, 33A to cause an impedance match. Each of these shunt variable capacitors 31A, 33A can be an EVC, as discussed above. They can be controlled by a choke, filter, and driver similar to the methods discussed above with respect to FIG. 2.

EVC Capacitor Arrays

Figure 4:
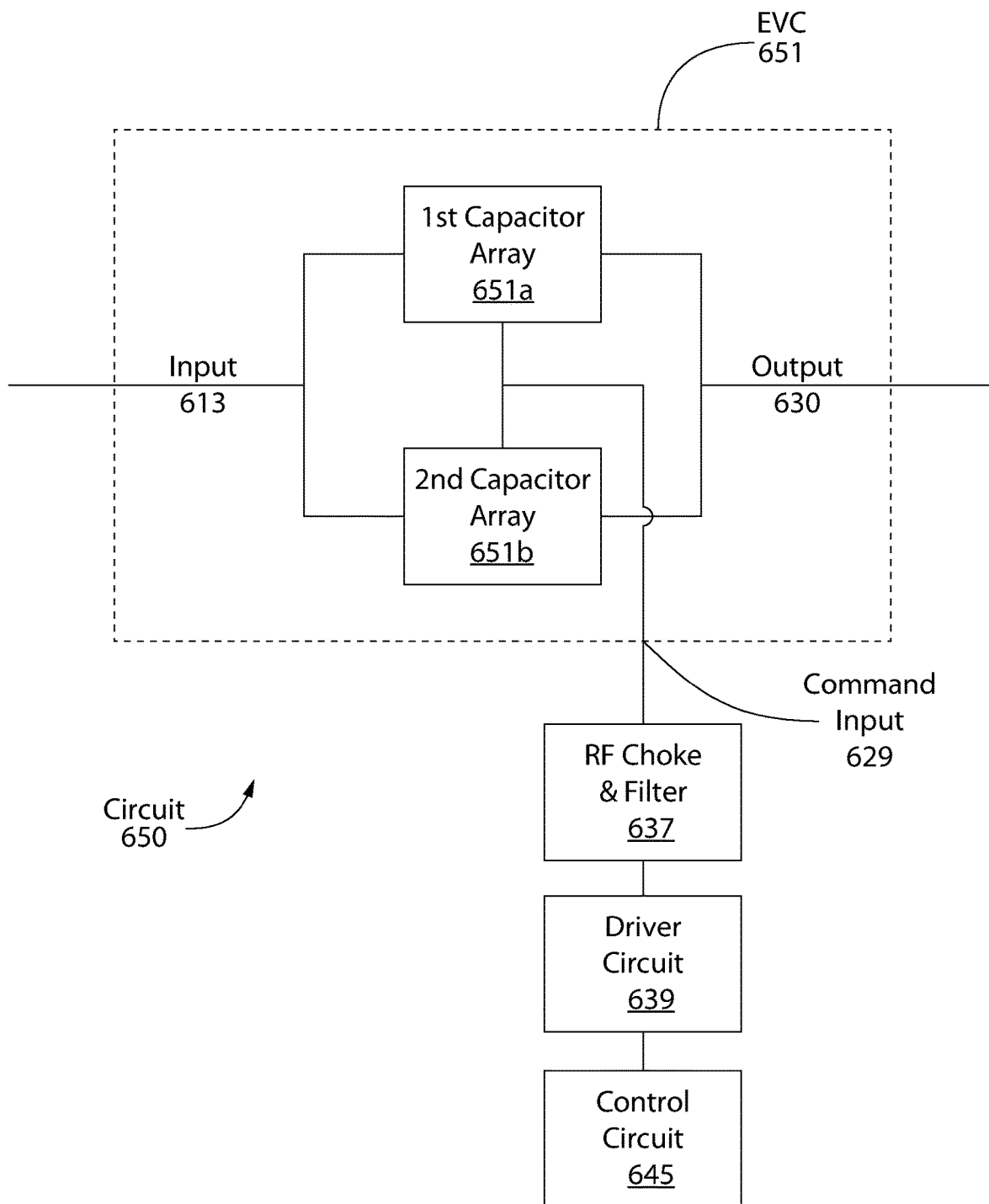
FIG. 4 is a block diagram of an embodiment of an electronic circuit for providing a variable capacitance using an electronically variable capacitor having two capacitor arrays.

FIG. 4 shows an electronic circuit 650 for providing a variable capacitance according to one embodiment. The circuit 650 utilizes an EVC 651 that includes two capacitor arrays 651a, 651b. The first capacitor array 651a has a first plurality of discrete capacitors, each having a first capacitance value. The second capacitor array 651b has a second plurality of discrete capacitors, each having a second capacitance value. The first capacitance value is different from the second capacitance value such that the EVC 651 can provide coarse and fine control of the capacitance produced by the EVC 651. The first capacitor array and the second capacitor array are coupled in parallel between a signal input 613 and a signal output 630.

The first and second capacitance values can be any values sufficient to provide the desired overall capacitance values for the EVC 651. In one embodiment, the second capacitance value is less than or equal to one-half (½) of the first capacitance value. In another embodiment, the second capacitance value is less than or equal to one-third (⅓) of the first capacitance value. In yet another embodiment, the second capacitance value is less than or equal to one-fourth (¼) of the first capacitance value.

The electronic circuit 650 further includes a control circuit 645, which can have features similar to control circuit 45 discussed above. The control circuit 645 is operably coupled to the first capacitor array 651a and to the second capacitor array 651b by a command input 629, the command input 629 being operably coupled to the first capacitor array 651a and to the second capacitor array 651b. In the exemplified embodiment, the command input 629 has a direct electrical connection to the capacitor arrays 651a, 651b, though in other embodiments this connection can be indirect. The coupling of the control circuit 645 to the capacitor arrays 651a, 651b will be discussed in further detail below.

The control circuit 645 is configured to alter the variable capacitance of the EVC 651 by controlling on and off states of (a) each discrete capacitor of the first plurality of discrete capacitors and (b) each discrete capacitor of the second plurality of discrete capacitors. As stated above, the control circuit 645 can have features similar to those described with respect to control circuit 45 of FIGS. 2-3. For example, the control circuit 645 can receive inputs from the capacitor arrays 651a, 651b, make calculations to determine changes to capacitor arrays 651a, 651b, and delivers commands to the capacitor arrays 651a, 651b for altering the capacitance of the EVC 651. EVC 651 of FIG. 4 can include a plurality of electronic switches. Each electronic switch can be configured to activate and deactivate one or more discrete capacitors.

As with the control circuit 45 of FIGS. 2-3, the control circuit 645 can also be connected to a driver circuit 639 and an RF choke and filter circuit 637. The control circuit 645, driver circuit 639, and RF choke and filter circuit 637 can have capabilities similar to those discussed with regard to FIG. 2-3. In the exemplified embodiment, the driver circuit 639 is operatively coupled between the control circuit 645 and the first and second capacitor arrays 651a, 651b. The driver circuit 639 is configured to alter the variable capacitance based upon a control signal received from the control circuit 645. The RF filter 637 is operatively coupled between the driver circuit 639 and the first and second capacitor arrays 651a, 651b. In response to the control signal sent by the control unit 645, the driver circuit 639 and RF filter 637 are configured to send a command signal to the command input 629. The command signal is configured to alter the variable capacitance by instructing at least one of the electronic switches to activate or deactivate (a) at least one the discrete capacitors of the first plurality of discrete capacitors or (b) at least one of the discrete capacitors of the second plurality of discrete capacitors.

In the exemplified embodiment, the driver circuit 639 is configured to switch a high voltage source on or off in less than 15 μsec, the high voltage source controlling the electronic switches of each of the first and second capacitor arrays for purposes of altering the variable capacitance. The EVC 651, however, can be switched by any of the means or speeds discussed in the present application.

The control circuit 645 can be configured to calculate coarse and fine capacitance values to be provided by the respective capacitor arrays 651*a*, 651*b*. In the exemplified embodiment, the control circuit 645 is configured to calculate a coarse capacitance value to be provided by controlling the on and off states of the first capacitor array 651*a*. Further, the control circuit is configured to calculate a fine capacitance value to be provided by controlling the on and off states of the second capacitor array 651*b*. In other embodiments, the capacitor arrays 651*a*, 651*b* can provide alternative levels of capacitance. In other embodiments, the EVC can utilize additional capacitor arrays.

EVC 651 of FIG. 4 can be used in most systems requiring a varying capacitance. For example, EVC 651 can be used as the series EVC and/or shunt EVC in matching network 11 of FIG. 2, or as one or both of the shunt EVCs in matching network 11A of FIG. 3. It is often desired that the differences between the capacitance values allow for both a sufficiently fine resolution of the overall capacitance of the circuit and a wide range of capacitance values to enable a better impedance match at the input of a RF matching network, and EVC 651 allows this.

EVC 651 can also be used in a system or method for fabricating a semiconductor, a method for controlling a variable capacitance, and/or a method of controlling an RF impedance matching network. Such methods can include altering at least one of the series variable capacitance and the shunt variable capacitance to the determined series capacitance value and the shunt capacitance value, respectively. This altering can be accomplishing by controlling, for each of the series EVC and the shunt EVC, on and off states of each discrete capacitor of each plurality of discrete capacitors. In other embodiments, EVC 651 and circuit 650 can be used in other methods and systems to provide a variable capacitance.

Switching In and Out Discrete Capacitors to Vary EVC Capacitance

As discussed above, an EVC is a type of variable capacitor that can use multiple switches, each used to create an open or short circuit, with individual series capacitors to change the capacitance of the variable capacitor. The switches can be mechanical (such as relays) or solid state (such as PIN diodes, transistors, or other switching devices). The following is a discussion of methods for setting up an EVC or other variable capacitor to provide varying capacitances.

In what is sometimes referred to as an "accumulative setup" of an EVC or other variable capacitor, the approach to linearly increase the capacitor value from the minimum starting point (where all switches are open) is to incrementally increase the number of fine tune capacitors that are switched into the circuit. Once the maximum number of fine tune capacitors is switched into circuit, a coarse tune capacitor is switched in, and the fine tune capacitors are switched out. The process starts over with increasing the number of fine tune capacitors that are switched into circuit, until all fine and coarse tune capacitors are switched in, at which point another coarse tune capacitor is switched in and the fine tune capacitors are switched out. This process can continue until all the coarse and fine capacitors are switched in.

In this embodiment, all of the fine tune capacitors have the same or a substantially similar value, and all the coarse tune capacitors have the same or a substantially similar value. Further, the capacitance value of one coarse tune capacitor about equals the combined capacitance value of all fine tune capacitors plus an additional fine tune capacitor into the circuit, thus enabling a linear increase in capacitance. The embodiments, however, are not so limited. The fine tune capacitors (and coarse capacitors) need not have the same or a substantially similar value. Further, the capacitance value of one coarse tune capacitor need not equal the combined capacitance value of all fine tune capacitors plus an additional fine tune capacitor. In one embodiment, the coarse capacitance value and the fine capacitance value have a ratio substantially similar to 10:1. In another embodiment, the second capacitance value is less than or equal to one-half ($\frac{1}{2}$) of the first capacitance value. In another embodiment, the second capacitance value is less than or equal to one-third ($\frac{1}{3}$) of the first capacitance value. In yet another embodiment, the second capacitance value is less than or equal to one-fourth ($\frac{1}{4}$) of the first capacitance value.

An example of the aforementioned embodiment in an ideal setting would be if the fine tune capacitors were equal to 1 pF, and the coarse tune capacitors were equal to 10 pF. In this ideal setup, when all switches are open, the capacitance is equal to 0 pF. When the first switch is closed, there is 1 pF in the circuit. When the second switch is closed there is 2 pF in the circuit, and so on, until nine fine tune switches are closed, giving 9 pF. Then, the first 10 pF capacitor is switched into circuit and the nine fine tune switches are opened, giving a total capacitance of 10 pF. The fine tune capacitors are then switched into circuit from 11 pF to 19 pF. Another coarse tune capacitor can then be switched into circuit and all fine tune capacitors can be switched out of circuit giving 20 pF. This process can be repeated until the desired capacitance is reached.

This can also be taken one step further. Using the previous example, having nine 1 pF capacitors and also nine 10 pF capacitors, the variable capacitor circuit can have even larger values, 100 pF, to switch in and out of circuit. This would allow the previous capacitor array to go up to 99 pF, and then the 100 pF capacitor can be used for the next increment. This can be repeated further using larger increments, and can also be used with any counting system. According to the accumulative setup, increasing the total capacitance of a variable capacitor is achieved by switching in more of the coarse capacitors or more of the fine capacitors than are already switched in without switching out a coarse capacitor that is already switched in. Further, when the variable total capacitance is increased and the control circuit does not switch in more of the coarse capacitors than are already switched in, then the control circuit switches in more fine capacitors than are already switched in without switching out a fine capacitor that is already switched in.

Figure 5:
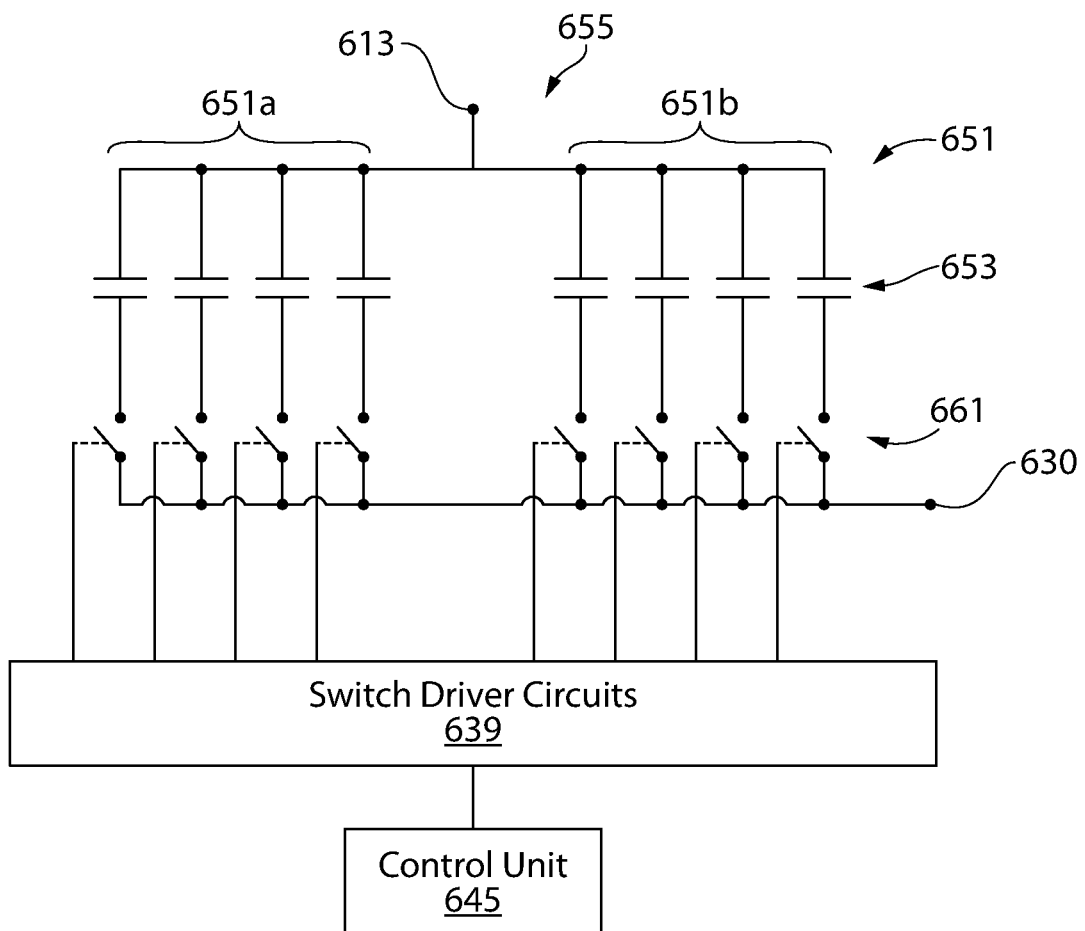
FIG. 5 is a block diagram of an embodiment of a variable capacitance system for switching in and out discrete capacitors of an electronically variable capacitor.

FIG. 5 is a schematic of a variable capacitance system 655 according to an accumulative setup. Where this figure uses reference numbers identical to those of FIG. 4, it is understood that the relevant components can have features similar to those discussed in FIG. 4. The variable capacitance system 655 comprises a variable capacitor 651 for providing a varying capacitance. The variable capacitor 651 has an input 613 and an output 630. The variable capacitor 651 includes a plurality of discrete capacitors 653 operably coupled in parallel. The plurality of capacitors 653 includes first (fine) capacitors 651*a* and second (coarse) capacitors 651B. Further, the variable capacitor 651 includes a plurality of switches 661. Of the switches 661, one switch is operably coupled in series to each of the plurality of capacitors to switch in and out each capacitor, thereby enabling the variable capacitor 651 to provide varying total capacitances. The variable capacitor 651 has a variable total capacitance that is increased when discrete capacitors 653 are switched in and decreased when the discrete capacitors 653 are switched out.

The switches 661 can be coupled to switch driver circuits 639 for driving the switches on and off. The variable capacitance system 655 can further include a control unit 645 operably coupled to the variable capacitor 651. Specifically, the control unit 645 can be operably coupled to the driver circuits 639 for instructing the driver circuits 639 to switch one or more of the switches 661, and thereby turn one or more of the capacitors 653 on or off. In one embodiment, the control unit 645 can form part of a control unit that controls a variable capacitor, such as a control unit that instructs the variable capacitors of a matching network to change capacitances to achieve an impedance match. The driver circuits 639 and control unit 645 can have features similar to those discussed above with reference to FIG. 4, and thus can also utilize an RF choke and filter as discussed above.

In one embodiment, the control circuit 645 is configured to determine a desired coarse capacitance for the coarse capacitors; determine a desired fine capacitance for the fine capacitors; and after calculating the desired coarse capacitance and the desired fine capacitance, alter the total variable capacitance by switching in or out at least one of the fine capacitors; and switching in or out at least one of the coarse capacitors. In other embodiments, coarse tuning and fine tuning can occur at different stages.

In the exemplified embodiment, the first capacitors 651*a* are fine capacitors each having a capacitance value substantially similar to a fine capacitance value, and the second capacitors 651*b* are coarse capacitors each having a capacitance value substantially similar to a coarse capacitance value, the coarse capacitance value being greater than the fine capacitance value. For purposes of this application, capacitances and other values are considered to be substantially similar if one value is not 15 percent (15%) greater than or less than another value.

The variable capacitance system 655 can form part of an impedance matching network, including but not limited to, the impedance matching networks of FIGS. 1-3. The variable capacitance system can also form part of a method for controlling an impedance matching network (such as the impedance matching networks of FIGS. 1-3). The method can include providing the RF impedance matching network comprising determining an increased total capacitance to be provided by one of the EVCs; and increasing the variable total capacitance of the one EVC by switching in more of the coarse capacitors or more of the fine capacitors than are already switched in without switching out a coarse capacitor that is already switched in. Further, the variable capacitance system can form part of a method and system for fabricating a semiconductor (see FIGS. 1-3).

Using the variable capacitance system discussed above with an impedance matching network can provide several advantages over other approaches. An alternative to the above approach would be to have all the capacitor values be different, with the first value equal to the minimum desired change in capacitance. Then each successive capacitor value is increased to double the change in capacitance from the previous up until the maximum desired capacitor value, when all capacitors are switched in. This approach can result in using less capacitors to switch in and out of circuit to achieve the same resolution and range. A potential problem with this setup, however, is that, once the capacitor reaches a certain value, the voltage and/or current on that particular capacitor or the current on the switch can be higher than the specification allows for. This forces the EVC to use multiple capacitors in parallel for each switch of lower value. This problem is particularly acute where high voltages and/or currents are being used. The accumulative setup discussed above avoids putting this degree of stress on its capacitors and switches by switching in additional capacitors, rather than replacing lower-capacitance capacitors with higher-capacitance capacitors.

Determining Capacitance Values to Achieve Match

Figure 6:
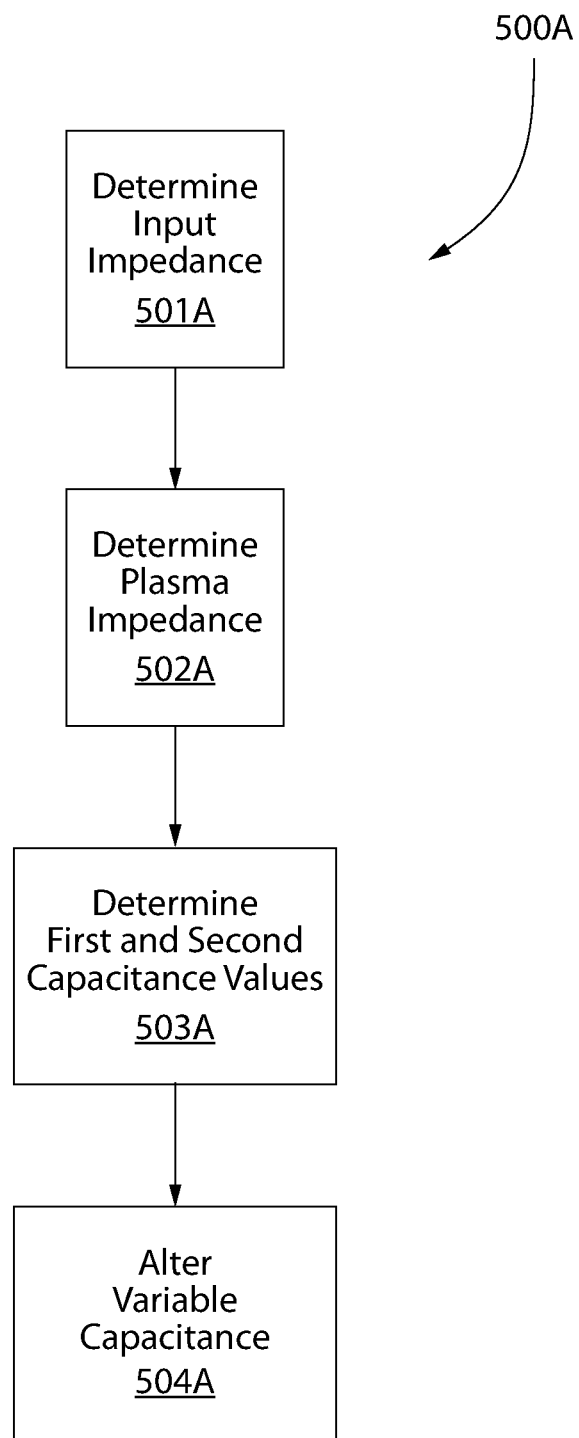
FIG. 6 is a flow chart showing an embodiment of a process for matching an impedance by altering a variable capacitance.

FIG. 6 is a flow chart showing a process 500A for matching an impedance according to one embodiment. The matching network can include components similar to those discussed above. In one embodiment, the matching network of FIG. 2 is utilized. In the first step of the exemplified process 500A of FIG. 6, an input impedance at the RF input 13 is determined (step 501A). The input impedance is based on the RF input parameter detected by the RF input sensor 21 at the RF input 13. The RF input sensor 21 can be any sensor configured to detect an RF input parameter at the RF input 13. The input parameter can be any parameter measurable at the RF input 13, including a voltage, a current, or a phase at the RF input 13. In the exemplified embodiment, the RF input sensor 21 detects the voltage, current, and phase at the RF input 13 of the matching network 11. Based on the RF input parameter detected by the RF input sensor 21, the control circuit 45 determines the input impedance.

Next, the control circuit 45 determines the plasma impedance presented by the plasma chamber 19 (step 502A). In one embodiment, the plasma impedance determination is based on the input impedance (determined in step 501A), the capacitance of the series EVC 31, and the capacitance of the shunt EVC 33. In other embodiments, the plasma impedance determination can be made using the output sensor 49 operably coupled to the RF output, the RF output sensor 49 configured to detect an RF output parameter. The RF output parameter can be any parameter measurable at the RF output 17, including a voltage, a current, or a phase at the RF output 17. The RF output sensor 49 may detect the output parameter at the RF output 17 of the matching network 11. Based on the RF output parameter detected by the RF output sensor 21, the control circuit 45 may determine the plasma impedance. In yet other embodiments, the plasma impedance determination can be based on both the RF output parameter and the RF input parameter.

Once the variable impedance of the plasma chamber 19 is known, the control circuit 45 can determine the changes to make to the variable capacitances of one or both of the series and shunt EVCs 31, 33 for purposes of achieving an impedance match. Specifically, the control circuit 45 determines a first capacitance value for the series variable capacitance and a second capacitance value for the shunt variable capacitance (step 503A). These values represent the new capacitance values for the series EVC 31 and shunt EVC 33 to enable an impedance match, or at least a substantial impedance match. In the exemplified embodiment, the determination of the first and second capacitance values is based on the variable plasma impedance (determined in step 502A) and the fixed RF source impedance.

Once the first and second capacitance values are determined, the control circuit 45 generates a control signal to alter at least one of the series variable capacitance and the shunt variable capacitance to the first capacitance value and the second capacitance value, respectively (step 504A). This is done at approximately $t=-5$ μsec. The control signal instructs the switching circuit to alter the variable capacitance of one or both of the series and shunt EVCs 31, 33.

This alteration of the EVCs 31, 33 takes about 9-11 μsec total, as compared to about 1-2 sec of time for an RF matching network using VVCs. Once the switch to the different variable capacitances is complete, there is a period of latency as the additional discrete capacitors that make up the EVCs join the circuit and charge. This part of the match tune process takes about 55 μsec. Finally, the RF power profile 403 is shown decreasing, at just before t=56 μsec, from about 380 mV peak-to-peak to about 100 mV peak-to-peak. This decrease in the RF power profile 403 represents the decrease in the reflected power 407, and it takes place over a time period of about 10 μsec, at which point the match tune process is considered complete.

The altering of the series variable capacitance and the shunt variable capacitance can comprise sending a control signal to the series driver circuit 39 and the shunt driver circuit 43 to control the series variable capacitance and the shunt variable capacitance, respectively, where the series driver circuit 39 is operatively coupled to the series EVC 31, and the shunt driver circuit 43 is operatively coupled to the shunt EVC 43. When the EVCs 31, 33 are switched to their desired capacitance values, the input impedance may match the fixed RF source impedance (e.g., 50 Ohms), thus resulting in an impedance match. If, due to fluctuations in the plasma impedance, a sufficient impedance match does not result, the process of 500A may be repeated one or more times to achieve an impedance match, or at least a substantial impedance match.

Using an RF matching network 11, such as that shown in FIG. 2, the input impedance can be represented as follows:

$$Z_{in} = \frac{(Z_P + Z_L + Z_{series})Z_{shunt}}{Z_P + Z_L + Z_{series} + Z_{shunt}}$$

where $Z_{in}$ is the input impedance, $Z_P$ is the plasma impedance, $Z_L$ is the series inductor impedance, $Z_{series}$ is the series EVC impedance, and $Z_{shunt}$ is the shunt EVC impedance. In the exemplified embodiment, the input impedance ($Z_{in}$) is determined using the RF input sensor 21. The EVC impedances ($Z_{series}$ and $Z_{shunt}$) are known at any given time by the control circuitry, since the control circuitry is used to command the various discrete capacitors of each of the series and shunt EVCs to turn ON or OFF. Further, the series inductor impedance ($Z_L$) is a fixed value. Thus, the system can use these values to solve for the plasma impedance ($Z_P$).

Based on this determined plasma impedance ($Z_P$) and the known desired input impedance ($Z'_{in}$) (which is typically 50 Ohms), and the known series inductor impedance ($Z_L$), the system can determine a new series EVC impedance ($Z'_{series}$) and shunt EVC impedance ($Z'_{shunt}$).

$$Z'_{in} = \frac{(Z_P + Z_L + Z'_{series})Z'_{shunt}}{Z_P + Z_L + Z'_{series} + Z'_{shunt}}$$

Based on the newly calculated series EVC variable impedance ($Z'_{series}$) and shunt EVC variable impedance ($Z'_{shunt}$), the system can then determine the new capacitance value (first capacitance value) for the series variable capacitance and a new capacitance value (second capacitance value) for the shunt variable capacitance. When these new capacitance values are used with the series EVC 31 and the shunt EVC 33, respectively, an impedance match may be accomplished.

The exemplified method of computing the desired first and second capacitance values and reaching those values in one step is significantly faster than moving the two EVCs step-by-step to bring either the error signals to zero, or to bring the reflected power/reflection coefficient to a minimum. In semiconductor plasma processing, where a faster tuning scheme is desired, this approach provides a significant improvement in matching network tune speed.

Determining Capacitance Values Using Parameter Matrix

Figure 7:
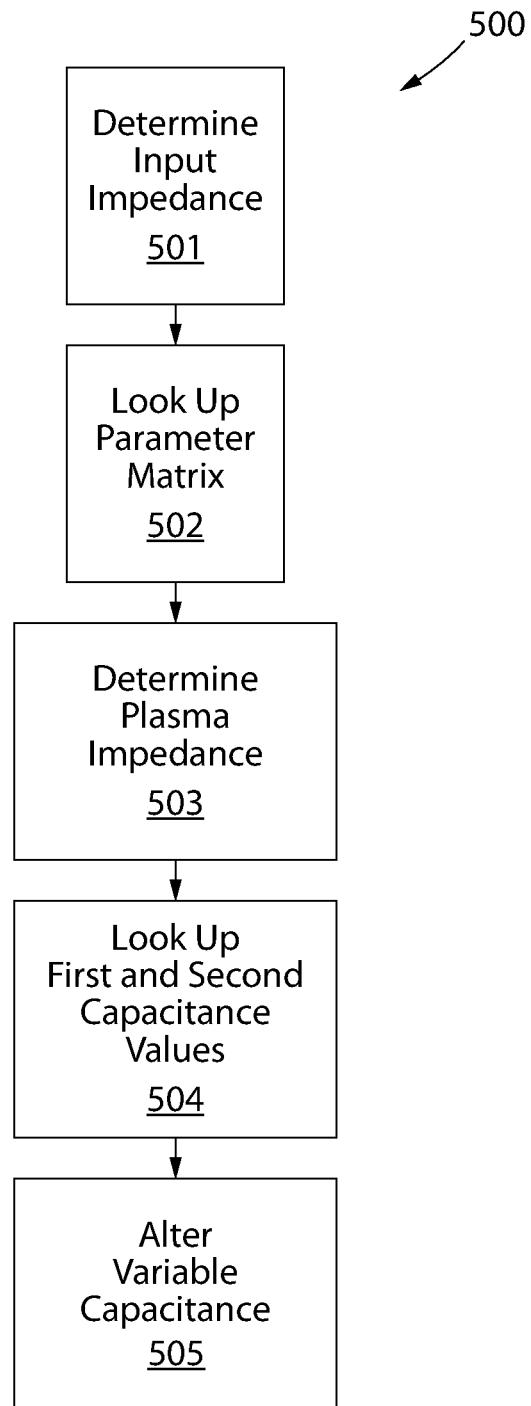
FIG. 7 is a flow chart showing another embodiment of a process for matching an impedance using a parameter matrix to alter a variable capacitance.

FIG. 7 provides an alternative process 500 for matching an impedance that uses a parameter matrix. In the exemplified process, the control circuit 45 (see FIG. 2 for matching network components) is configured and/or programmed to carry out each of the steps. As one of two initial steps, RF parameters are measured at the RF input 13 by the RF input sensor 21, and the input impedance at the RF input 13 is calculated (step 501) using the measured RF parameters. For this exemplified process 500, the forward voltage and the forward current are measured at the RF input 13. In certain other embodiments, the RF parameters may be measured at the RF output 17 by the RF output sensor 49, although in such embodiments, different calculations may be required than those described below. In still other embodiments, RF parameters may be measured at both the RF input 13 and the RF output 17.

The impedance matching circuit, coupled between the RF source 15 and the plasma chamber 19, may be characterized by one of several types of parameter matrices known to those of skill in the art, including two-port parameter matrices. An S-parameter matrix and a Z-parameter matrix are two examples of such parameter matrices. Other examples include, but are not limited to, a Y-parameter matrix, a G-parameter matrix, an H-parameter matrix, a T-parameter matrix, and an ABCD-parameter matrix. Those of skill in the art will recognize also that these various parameter matrices may be mathematically converted from one to the other for an electrical circuit such as a matching network. The second initial step of the exemplified process 500 is to look up (step 502) the parameter matrix for the existing configuration of the impedance matching circuit in a parameter lookup table. The existing configuration of the impedance matching circuit is defined by existing operational parameters of the impedance matching circuit, particularly the existing array configurations for both of the series EVC 31 and the shunt EVC 33. In order to achieve an impedance match, the existing configuration of the impedance matching circuit is altered to a new configuration of the impedance matching circuit as part of the exemplified process 500.

The parameter lookup table includes a plurality of parameter matrices, with each parameter matrix being associated with a particular configuration of the series EVC 31 and the shunt EVC 33. The parameter lookup table may include one or more of the aforementioned types of parameter matrices. In the exemplified process 500, the parameter lookup table includes at least a plurality of S-parameter matrices. In certain embodiments, the parameter lookup table may include at least a plurality of Z-parameter matrices. In embodiments in which the parameter lookup table includes multiple types of parameter matrices, the different types of parameter matrices are associated within the parameter lookup table in such a way so as to eliminate the need for mathematical conversions between the different types of parameter matrices. For example, the T-parameter matrix may be included as part of the parameter lookup table, with each T-parameter matrix associated with the associated S-parameter matrix that would result from conversion between the two matrices.

The input impedance calculation (step 501) and the parameter matrix look up (step 502) may be performed in any order. With the input impedance calculated (step 501) and the parameter matrix for the existing configuration of the impedance matching circuit identified within the parameter lookup table (step 502) done, the plasma or load impedance may then be calculated (step 503) using the calculated input impedance and the parameter matrix for the existing configuration. Next, from the calculated plasma impedance, the match configurations for the series EVC 31 and the shunt EVC 33 that would achieve an impedance match, or at least a substantial impedance match, between the RF source 15 and the plasma chamber 19 are looked up (step 504) in an array configuration lookup table. These match configurations from the array configuration lookup table are the array configurations which will result in new capacitance values for the series EVC 31 and shunt EVC 33, with an impedance match being achieved with the new array configurations and associated new capacitance values. The array configuration lookup table is a table of array configurations for the series EVC 31 and the shunt EVC 33, and it includes each possible array configuration of the series EVC 31 and the shunt EVC 33 when used in combination. As an alternative to using an array configuration lookup table, the actual capacitance values for the EVCs 31, 33 may be calculated during the process—however, such real-time calculations of the capacitance values are inherently slower than looking up the match configurations in the array configuration lookup table. After the match configurations for the series EVC 31 and the shunt EVC 33 are identified in the array configuration lookup table, then one or both of the series array configuration and the shunt array configuration are altered (step 505) to the respective identified match configurations for the series EVC 31 and the shunt EVC 33.

The altering (step 505) of the series array configuration and the shunt array configuration may include the control circuit 45 sending a control signal to the series driver circuit 39 and the shunt driver circuit 43 to control the series array configuration and the shunt array configuration, respectively, where the series driver circuit 39 is operatively coupled to the series EVC 31, and the shunt driver circuit 43 is operatively coupled to the shunt EVC 43. When the EVCs 31, 33 are switched to the match configurations, the input impedance may match the fixed RF source impedance (e.g., 50 Ohms), thus resulting in an impedance match. If, due to fluctuations in the plasma impedance, a sufficient impedance match does not result, the process of 500 may be repeated one or more times to achieve an impedance match, or at least a substantial impedance match.

The lookup tables used in the process described above are compiled in advance of the RF matching network being used in conjunction with the plasma chamber 19. In creating the lookup tables, the RF matching network 11 is tested to determine at least one parameter matrix of each type and the load impedance associated with each array configuration of the series EVC 31 and the shunt EVC 33 prior to use with a plasma chamber. The parameter matrices resulting from the testing are compiled into the parameter lookup table so that at least one parameter matrix of each type is associated with a respective array configuration of the EVCs 31, 33. Similarly, the load impedances are compiled into the array configuration lookup table so that each parameter matrix is associated with a respective array configuration of the EVCs 31, 33. The pre-compiled lookup tables may take into consideration the fixed RF source impedance (e.g., 50 Ohms), the power output of the RF source, and the operational frequency of the RF source, among other factors that are relevant to the operation of the RF matching network. Each lookup table may therefore have tens of thousands of entries, or more, to account for all the possible configurations of the EVCs 31, 33. The number of possible configurations is primarily determined by how many discrete capacitors make up each of the EVCs 31, 33. In compiling the lookup tables, consideration may be given to possible safety limitations, such as maximum allowed voltages and currents at critical locations inside the matching network, and this may serve to exclude entries in one or more of the lookup tables for certain configurations of the EVCs 31, 33.

As is known in the art, the S-parameter matrix is composed of components called scatter parameters, or S-parameters for short. An S-parameter matrix for the impedance matching circuit has four S-parameters, namely $S_{11}$, $S_{12}$, $S_{21}$, and $S_{22}$, each of which represents a ratio of voltages at the RF input 13 and the RF output 17. All four of the S-parameters for the impedance matching circuit are determined and/or calculated in advance, so that the full S-parameter matrix is known. The parameters of the other types of parameter matrices may be similarly determined and/or calculated in advance and incorporated into the parameter matrix. For example, a Z-parameter matrix for the impedance matching circuit has four Z-parameters, namely $Z_{11}$, $Z_{12}$, $Z_{21}$, and $Z_{22}$.

By compiling the parameter lookup table in this manner, the entire time cost of certain calculations occurs during the testing phase for the RF matching network, and not during actual use of the RF matching network 11 with a plasma chamber 19. Moreover, because locating a value in a lookup table can take less time than calculating that same value in real time, using the lookup table can aid in reducing the overall time needed to achieve an impedance match. In a plasma deposition or etching process which includes potentially hundreds or thousands of impedance matching adjustments throughout the process, this time savings can help add directly to cost savings for the overall fabrication process.

From the beginning of the match tune process, which starts with the control circuit determining the variable impedance of the plasma chamber and determining the series and shunt match configurations, to the end of the match tune process, when the RF power reflected back toward the RF source decreases, the entire match tune process of the RF impedance matching network using EVCs has an elapsed time of approximately 110 µsec, or on the order of about 150 µsec or less. This short elapsed time period for a single iteration of the match tune process represents a significant increase over a VVC matching network. Moreover, because of this short elapsed time period for a single iteration of the match tune process, the RF impedance matching network using EVCs may iteratively perform the match tune process, repeating the two determining steps and the generating another control signal for further alterations to the array configurations of one or both of the electronically variable capacitors. By iteratively repeating the match tune process, it is anticipated that a better impedance match may be created within about 2-4 iterations of the match tune process. Moreover, depending upon the time it takes for each repetition of the match tune process, it is anticipated that 3-4 iterations may be performed in 500 µsec or less. Given the 1-2 sec match time for a single iteration of a match tune process for RF impedance matching networks using VVCs, this ability to perform multiple iterations in a fraction of the time represents a significant advantage for RF impedance matching networks using EVCs.

Those of skill in the art will recognize that several factors may contribute to the sub-millisecond elapsed time of the impedance matching process for an RF impedance matching network using EVCs. Such factors may include the power of the RF signal, the configuration and design of the EVCs, the type of matching network being used, and the type and configuration of the driver circuit being used. Other factors not listed may also contribute to the overall elapsed time of the impedance matching process. Thus, it is expected that the entire match tune process for an RF impedance matching network having EVCs should take no more than about 500 μsec to complete from the beginning of the process (i.e., measuring by the control circuit and calculating adjustments needed to create the impedance match) to the end of the process (the point in time when the efficiency of RF power coupled into the plasma chamber is increased due to an impedance match and a reduction of the reflected power). Even at a match tune process on the order of 500 μsec, this process time still represents a significant improvement over RF impedance matching networks using VVCs.

Table 1 presents data showing a comparison between operational parameters of one example of an EVC versus one example of a VVC. As can be seen, EVCs present several advantages, in addition to enabling fast switching for an RF impedance matching network:

TABLE 1

| Parameter | EVC | Typical 1000 pF Vacuum Capacitors |
|---|---|---|
| Capacitance | 20 pF~1400 pF | 15 pF~1000 pF |
| Reliability | High | Low |
| Response Time | ~500 μ sec | 1 s~2 s |
| ESR | ~13 mW | ~20 mW |
| Voltage | 7 kV | 5 kV |
| Current Handling Capability | 216 A rms | 80 A rms |
| Volume | 4.5 in³ | 75 in³ |

As is seen, in addition to the fast switching capabilities made possible by the EVC, EVCs also introduce a reliability advantage, a current handling advantage, and a size advantage. Additional advantages of the RF impedance matching network using EVCs and/or the switching circuit itself for the EVCs include:

The disclosed RF impedance matching network does not include any moving parts, so the likelihood of a mechanical failure reduced to that of other entirely electrical circuits which may be used as part of the semiconductor fabrication process. For example, the typical EVC may be formed from a rugged ceramic substrate with copper metallization to form the discrete capacitors. The elimination of moving parts also increases the resistance to breakdown due to thermal fluctuations during use.

The EVC has a compact size as compared to a VVC, so that the reduced weight and volume may save valuable space within a fabrication facility.

The design of the EVC introduces an increased ability to customize the RF matching network for specific design needs of a particular application. EVCs may be configured with custom capacitance ranges, one example of which is a non-linear capacitance range. Such custom capacitance ranges can provide better impedance matching for a wider range of processes. As another example, a custom capacitance range may provide more resolution in certain areas of impedance matching. A custom capacitance range may also enable generation of higher ignition voltages for easier plasma strikes.

The short match tune process (~500 μsec or less) allows the RF impedance matching network to better keep up with plasma changes within the fabrication process, thereby increasing plasma stability and resulting in more controlled power to the fabrication process.

The use of EVCs, which are digitally controlled, non-mechanical devices, in an RF impedance matching network provides greater opportunity to fine tune control algorithms through programming.

EVCs exhibit superior low frequency (kHz) performance as compared to VVCs.

Alternating Frequency of RF Source to Fine Tune Match

Figure 8:
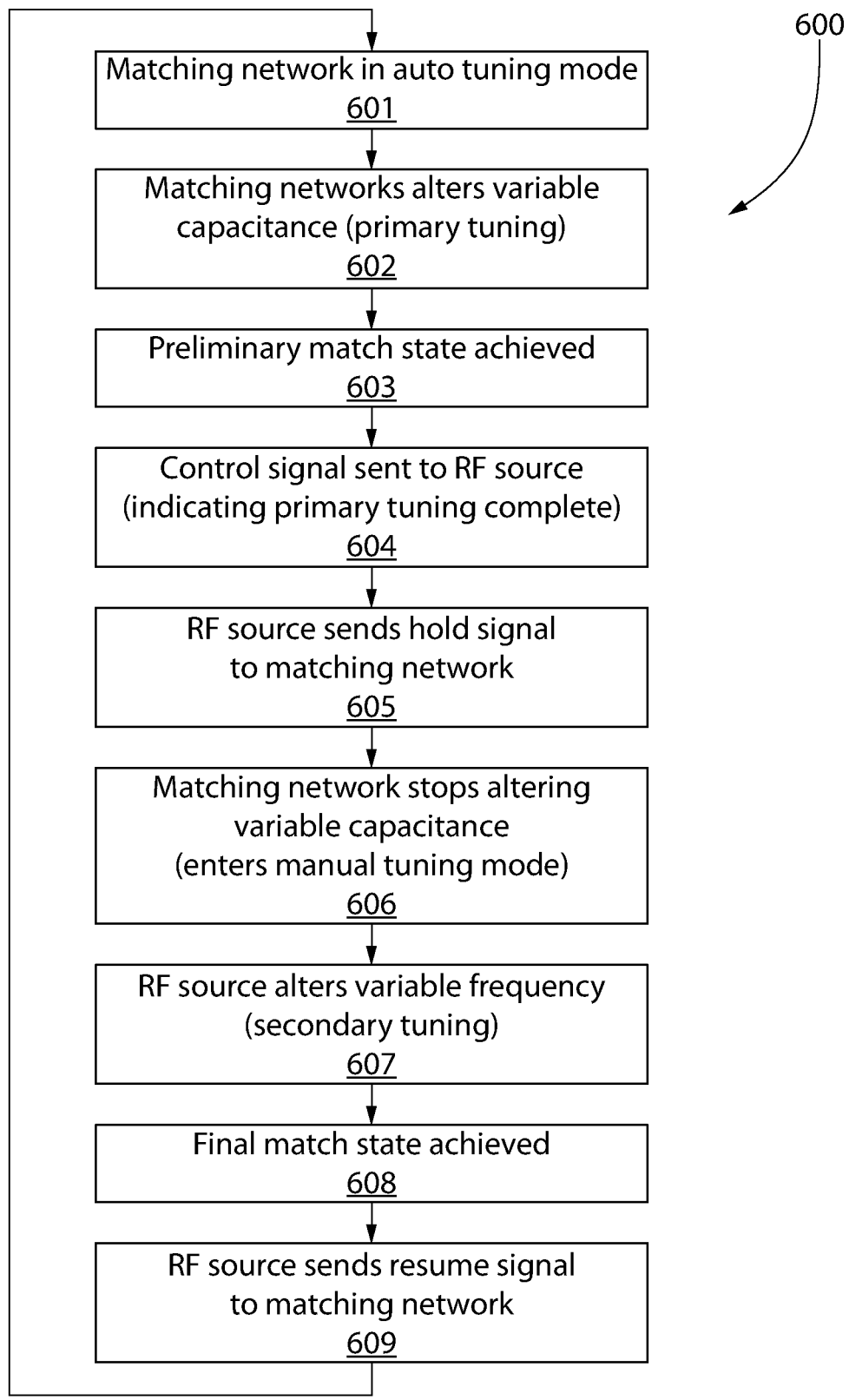
FIG. 8 is a flow chart showing another embodiment of a process for matching an impedance where a frequency of an RF source is also altered.

FIG. 8 is a flow chart showing a process 600 for matching an impedance according to another embodiment. Since EVCs can provide only discretized capacitance values, a matching network that varies only EVCs to create an impedance match can only match based on these discretized values. For example, if a plasma impedance occurs such that the series and/or shunt capacitance values needed to bring the input impedance of the matching network to a desired non-reactive 50 Ohms lies in-between the discretized values, the EVC-based matching network will not be able to tune the input impedance of the matching network to the non-reactive 50 Ohms. The process 600 of FIG. 8 addresses such a circumstance by also altering a frequency of the RF source (sometimes referred to as the "RF generator") to carry out the impedance match.

The RF source, matching network, and plasma chamber of process 600 can be configured similarly to the system of FIG. 2. Accordingly, reference will be made to the components of the system of FIG. 2, though this figure represents just one embodiment of the invention.

As with previously discussed embodiments, the matching network 11 of process 600 can include an RF input 13 configured to receive an RF signal from an RF source 15, and an RF output 17 configured to operably couple to a plasma chamber 19. The matching network can further include at least one EVC 31, 33, and a control circuit 45 for instructing the at least one EVC 31, 33 to alter its variable capacitance. The RF source 15 (including its control circuitry) and the RF matching network 11 can be in the same enclosure or separate enclosures.

In the process 600, the matching network 11 is initially in an auto tuning mode (step 601). In this mode, the matching network 11 can be configured to carry out automated tuning by altering at least one capacitance value in a manner similar to that described in the foregoing embodiments. In this mode, the process 600 performs tuning referred to as primary tuning (step 602). In the exemplified embodiment, the primary tuning includes altering the series and/or shunt capacitance values in an attempt to achieve an impedance match. In the exemplified embodiment, the desired input impedance (the desired impedance at the input of the matching network 11) is a fixed, non-reactive 50 Ohm, sometimes referred to as the RF source impedance. In other embodiments, the desired input impedance can be any other impedance value, and can be variable.

In the exemplified embodiment, the primary tuning will bring the input impedance relatively close to a non-reactive 50 Ohms, the matching network 11 being limited by the discretized capacitance values of the EVCs 31, 33. At this stage, a preliminary match is achieved (step 603). The preliminary match state will have an associated first reflection parameter value at the RF source output 15a (the RF source output 15a being connected to the matching network input 13). In the exemplified embodiment, the first reflection parameter value is a reflected power value. In other embodiments, the first reflection parameter value can be any reflection-related parameter associated with the preliminary match state. For example, the first reflection parameter value can be the reflection coefficient, which represents the ratio of the amplitude of the reflected wave to the incident wave, and is sometimes referred to as gamma. The first reflection parameter can be measured by sensor 21 at the RF source output 15a. In other embodiments, reflected power can be measured by a sensor or comparable device that is located proximate to the matching network input 13.

In one embodiment, the alteration of variable capacitance in auto tuning mode can include the steps of adjusting the variable capacitance, determining an intermediate reflection parameter value, and then reducing and/or increasing the variable capacitance based on the intermediate reflection parameter value. This process can be repeated such that there are several intermediate reflection parameter values, the adjustment of the one or more variable capacitances being based on these intermediate reflection parameter values. In other embodiments, the invention can omit the use of intermediate reflection parameter values.

Once the preliminary match state is achieved, the matching network 11 can provide a control signal to the RF source 15 indicating that primary tuning is complete and that a preliminary match has been achieved (step 604). The control signal can be any signal sufficient to provide indication that the preliminary match has been achieved.

In response, the RF source 15 can send a hold signal to the matching network 11 (step 605), the hold signal placing the matching network 11 in a manual tuning mode (step 606). In manual tuning mode, the matching network 11 will stop performing automated tuning (and therefore will not alter the variable capacitances) as long as the hold signal is present. In other embodiments, the matching network 11 can automatically enter manual tuning mode when the preliminary match has been achieved, and can return to auto tuning mode when receiving an instruction from the RF source 15.

Next, the variable frequency of the RF source 15 can be adjusted to perform secondary tuning (step 607). This secondary tuning can fine tune the input impedance of the matching network 1 to the desired non-reactive 50 Ohm, or other desired impedance, and can minimize the reflected power at the output of the RF source 15, thereby also decreasing the reflection coefficient. The RF source 15 can have standard control circuitry by which the frequency is varied and the signals discussed above are sent, received, and processed. The frequency can be altered by providing a command to a frequency generation circuit that forms part of the RF source, such as a Direct Digital Synthesizer.

Once the RF source 15 has completed altering the frequency for the secondary tuning, a final match state is achieved (step 608). The final match state will have an associated second reflection parameter value at the RF source output 15a. As with the first reflection parameter value, in the exemplified embodiment, the second reflection parameter value is a reflected power value. In other embodiments, the second reflection parameter value can be any reflection-related parameter associated with the preliminary match state, such as the reflection coefficient (discussed above). The second reflection parameter can be measured by a sensor 21 at the RF source output 15a. Since the final match state causes a more finely tuned match than the preliminary match state, the second reflection parameter value will be less than the first reflection parameter value.

The alteration of the variable RF source frequency can include reducing and/or increasing the variable RF source frequency based on an intermediate reflection parameter value. In one embodiment, the alteration of the variable source frequency includes reducing the variable RF source frequency by a first amount and determining the intermediate reflection parameter value at the RF source output. If the intermediate reflection parameter value decreases, the variable RF source frequency is again reduced by the first amount and a new intermediate reflection parameter value is measured. This process can repeat until the intermediate reflection parameter value increases. When the intermediate reflection parameter value increases, the variable source frequency can be increased by a second amount (the second amount being less than the first amount), and then a new intermediate reflection parameter value is determined. If the new intermediate reflection parameter value decreases, the variable source frequency is again increased by the second amount, and a new intermediate reflection parameter value is determined. This process can repeat until the new intermediate reflection parameter value increases or is zero, at which stage the process can stop or the variable source frequency can be returned to its previous value.

The invention is not limited to any one embodiment for tuning the frequency or variable capacitance. For example, the invention can use any variety of methods to step up and/or down the frequency in different increments based on the resulting reflected power. Further, the process 600 can have a minimum reflected parameter value (e.g., a minimum reflected power or minimum reflection coefficient). When the minimum reflected parameter value is achieved, the tuning can stop, regardless of whether the process is in primary or secondary tuning.

Returning to the exemplified embodiment, once the final match state is achieved, the RF source 15 can send a signal (sometimes referred to as a "resume signal") to the matching network 11 to place the matching network 11 back into auto tuning mode (step 609). The matching network 11 can then be ready for the next variation of the plasma impedance. Thus, when a plasma impedance of the plasma chamber 15 changes, the control circuit 45 can repeat the instruction to alter the variable capacitance and/or the instruction to alter the variable RF source frequency.

In other embodiments, the process 600 will not resume tuning until the reflection parameter value exceeds a predetermined value. Such a tuning restart threshold can be applied to the primary tuning, the secondary tuning, or both. Further, thresholds can be set such that, for small reflected power level raises, only secondary tuning is done (altering the RF source frequency), while, for larger reflected power levels, primary tuning is first carried out (altering capacitances), followed by secondary tuning (altering the RF source frequency).

Combining an EVC-based RF matching network with a variable frequency RF source provides several advantages for fast and precise RF matching. For example, with all components being electronic, the system has higher reliability than those using VVC technology, which are prone to mechanical failures. Further, the primary and second tuning can be performed quickly to enable matching within 500 µsec. Further, the combined EVC matching network and variable RF source can decrease the reflected power to the RF source to essentially 0 Watts.

Restricted Capacitor Switching

The matching networks discussed above can alter their variable capacitance values to achieve an impedance match. This process is sometimes referred to as tuning. The state of the impedance matching can be assessed based on a reflection parameter value. In the exemplified embodiments, the reflection parameter value is a reflected power value. More specifically, the reflection parameter value is a reflection coefficient value (sometimes referred to as "gamma"), which represents the ratio of the amplitude of a reflected wave to an incident wave. Referring to the system 85 of FIG. 2, the reflection parameter value can be measured by sensor 21 at the matching network input 13 (or RF source 15 output), or by sensor 49 at the matching network output 17 (or plasma chamber 19 input). Such a sensor can provide a signal to the control circuit 45 indicative of the reflection parameter value. In other embodiments, the reflection parameter value can be any reflection-related parameter associated with a match state.

In one approach to achieving an impedance match, a matching algorithm requires the control loop of the RF matching network to continue to tune until the reflection coefficient value at the input of the matching network is reduced below a certain level. This level is sometimes referred to as "gamma-stop." If the load impedance changes, the reflection coefficient at the input of the RF matching network can increase. If this reflection coefficient increases beyond a certain reflection coefficient value, sometimes referred to as "gamma-restart," then the RF matching network starts to tune again. In a solid-state RF matching network, there are typically no restrictions on how many switches can switch ON or OFF at any time, therefore based on the change in the reflection coefficient, the number of switches switching at any time can be significant and thus can result in perturbing the plasma to make it unstable.

In an alternative approach, an intermediate gamma value is utilized such that there are three gamma values: (1) a first reflection value (gamma-stop) at which tuning is stopped, (2) a second reflection value (gamma-restart-low) at which capacitor switching is limited, and (3) a third reflection value (gamma-restart-high) at which capacitor switching is unlimited.

Figure 9:
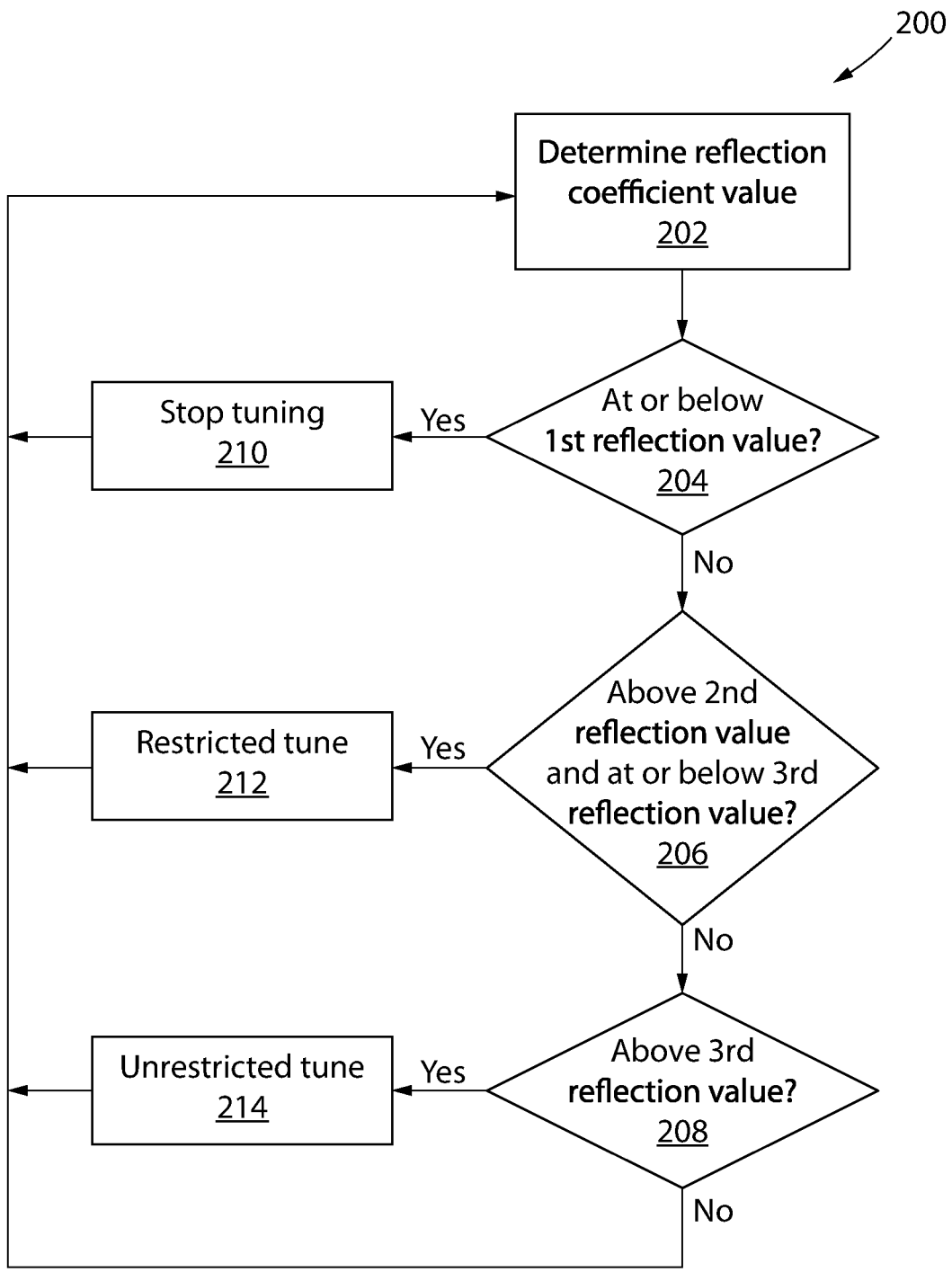
FIG. 9 is a flow chart showing another embodiment of a process for matching an impedance where capacitor switching can be restricted.

FIG. 9 is flow chart showing a process for matching an impedance where capacitor switching can be restricted using the above reflection values. In the exemplified embodiment, the reflection coefficient value is continuously monitored (operation 202). When the match is tuned and the reflection coefficient value (gamma) is not above the first reflection value (operation 204), no capacitors switch (operation 210). When the reflection coefficient value goes above the second reflection value (but is at or below the third reflection value) (operation 206), only a predetermined number of predetermined fine capacitors can switch at this time (restricted tune) (operation 212). Whether to turn these switches ON or OFF will depend upon what was the actual calculated position of the capacitors. When the reflection coefficient value goes above the third reflection value (operation 208), the capacitors can switch without any restrictions (unrestricted tune) (operation 214). For the purpose of this description, the fine capacitors can be any capacitors that are used to provide finer capacitance movement steps than the coarse capacitors. In one embodiment, the coarse capacitors have a capacitance at least twice as large as the capacitance of the fine capacitors.

In one example, the predetermined number is two (only two capacitors can switch when the reflection coefficient value initially exceeds the second reflection value), and the three reflection values are as follows: (1) first reflection value (gamma-stop)=0.031, (2) second reflection value (gamma-restart-low)=0.07, (3) third reflection value (gamma-restart-high)=0.10. In this example, the matched position is C4F5/C6F7 (i.e., 4 coarse capacitor switches ON and 5 fine capacitor switches ON for one solid state capacitor array, and 6 coarse capacitor switches ON and 7 fine capacitor switches ON for the second solid state capacitor array), and this positioning is determined before determining how to switch the discrete capacitors.

If the reflection coefficient value is calculated as 0.08, and the new tuned position is calculated to be C3F0/C7F1, then the match will go to C4F3/C6F9, rather than going directly to C3F0/C7F1. The control circuit can continuously monitor the reflection coefficient value (or other reflection parameter), and thus this loop can run as many times as needed until either the reflection coefficient value goes below the first reflection value or the reflection coefficient value goes above the third reflection value. If the reflection coefficient value goes above the third reflection value (i.e., 0.10), then the capacitor switches are not restricted and can directly switch to the calculated position. Note that the foregoing capacitor restrictions can also be applied to when the match is moving from a higher reflection coefficient value to a lower reflection coefficient value to provide a slower settling profile. Not also, while the embodiment described above discusses altering the tuning based on whether a reflection parameter is above, or at, or below a reflection parameter (or some combination thereof), other embodiments can use any one of these options (or a combination of options) provided different values are used as reference values for determining what type of tuning to use. For example, in one embodiment the system can carry out an unrestricted tune when the reflection parameter is above the third reflection value, while in another embodiment the system can carry out an unrestricted tune when the reflection parameter is at or above the third reflection value.

By the above multi-step reflection value approach, if something changes in the process that changes the impedance by a significant amount, then the match can respond faster, but if the change is small, then the match will not take big steps to cause the plasma to become unstable. This restricted capacitor switching approach can be used, for example, with the matching networks discussed above. A control circuit, such as control circuit 45 or 645 can be used to carry out the steps of determining or receiving the reflection parameter value and controlling the altering of the discrete capacitors based on that value. It is further noted that the restricted capacitor approach described above can be used in conjunction with the other impedance matching and capacitor-switching methods discussed herein. Further, the restricted capacitor switching approach can be used with a matching network that forms part of a semiconductor processing tool, such as that shown in FIGS. 1-3. Further, the restricted capacitor switching approach can be used with a matching network as part of a method of manufacturing a semiconductor.

Matching Using EVC and Frequency

In yet another embodiment, impedance matching can be carried out using an EVC and frequency considerations. According to one embodiment, a single EVC is used. For example, in FIG. 3, capacitor 33A can be an EVC, while capacitor 31A can be non-variable. (In other embodiments, more than one capacitor in the matching network can be variable.) The matching network can be calibrated such that post-calibration, at least one of the lookup tables (such as the lookup tables discussed above) contains information to provide the best combination of capacitor position and frequency for a load impedance to get the lowest input reflected power or input reflection coefficient (input gamma).

During operation, in one embodiment the matching network determines the input impedance based on the information provided by an input RF sensor, such as a VI (voltage-current) sensor located at the RF input of the matching network. The matching network then uses this input impedance information and the current EVC configuration (e.g., capacitor switch positions) and the frequency information to calculate the plasma chamber (load) impedance. Alternatively, rather than calculating the load impedance from input impedance and the calibration parameters of the match, the load impedance can be directly measured from an output sensor at the RF output of the matching network.

In the next step of this embodiment, the matching network uses the determined load impedance and the match lookup table to determine the new EVC configuration and the new frequency that would provide the lowest reflected power or lowest input reflection coefficient at the RF input for enabling an impedance match. Such an approach provides a much faster means for tuning compared to linearly changing the capacitor switch positions and frequency based on the polarity and magnitude of the input error signal.

When the matching network is coupled to a plasma chamber and operating, the RF source (e.g., an RF generator) or the customer's system can provide the matching network with the frequency signal through some communication port (e.g., analog). Alternately, the matching network can detect the frequency at its RF input port. Based on this specific frequency, the matching network can use the lookup table to determine what EVC configuration, for that frequency, provides the lowest input reflected power or input reflection coefficient (gamma) for enabling an impedance match. The matching network's control circuit can then choose this EVC position and command the discrete switches of the EVC to switch the EVC to this new configuration providing a new capacitance.

In another embodiment, the matching network can determine the best EVC configuration and frequency combination to provide the lowest input reflected power or input reflection coefficient (gamma). The matching network's control circuit can then move the EVC to the new configuration (e.g., desired switch positions) and at the same time command the RF generator to move to the desired frequency. For example, this method can use EVC technology for the EVC and frequency tuning for the other leg and make an 'L' or 'pi' type of match for higher power operation, up to 6 or 10 kW.

Returning to FIG. 3, this semiconductor processing system 85A can be understood as carrying out one or more of the embodiments discussed above. The matching network 11A has an input 13 coupled to an RF source 15 having a variable frequency, and an output coupled to a plasma chamber 19 having a variable chamber impedance. The matching network 11A further includes two capacitors, where capacitor 33A may be an EVC and capacitor 31A may be non-variable. The matching network 11A has a control circuit 45 coupled to at least one of sensors 21 and sensor 49, the one or more sensors configured to detect an RF parameter. The control circuit may use a match lookup table (such as one of the lookup tables discussed above) with a value based on the detected RF parameter to determine a match combination. The match combination includes both a new EVC configuration for providing a new EVC capacitance, and a new source frequency for the RF source. Once these determinations have been made, the control circuit 45 can alter the EVC 33A to the new EVC configuration (and thus provide a new capacitance) and alter the variable frequency of the RF source to the new source frequency.

In other embodiments, the match combination may instead be only a new EVC configuration, where the lookup table bases this configuration on the current frequency being provided by the RF source. In such an embodiment, the RF source may be controlled by a separate second control circuit 16.

In the exemplified embodiment, the value based on the detected RF parameter (used with the match lookup table) is the variable chamber impedance. In other embodiments, the RF parameter can be any RF parameter associated with the matching network or processing system. For example, the RF parameter may be detected at the RF input 13 (by sensor 21) or at the RF output 17 (by sensor 49). In some embodiments, the value based on the detected RF parameter can be the detected RF parameter itself.

In the exemplified embodiment, the EVC comprises discrete capacitors having different configurations defining ON and OFF states of the discrete capacitors, these different configurations causing the EVC to provide different capacitances. For example, each discrete capacitor may have a corresponding switch to activate or deactivate the discrete capacitor, the EVC being altered to a new EVC configuration by the switches activating or deactivating at least one of the discrete capacitors of the EVC. The corresponding switch may be in series with or parallel to the discrete capacitor.

In one embodiment, prior to an impedance match, the EVC has a first configuration defining ON and OFF states of the discrete capacitors, and the variable frequency of the RF source has a first frequency. The control circuit determines, based on the detected RF parameter, an input impedance at the RF input of the matching network. The control circuit then determines the variable chamber impedance from a parameter matrix lookup table using (1) the determined input impedance of the impedance matching network; (2) the first configuration of the EVC; and (3) the first frequency of the RF source. The control circuit then uses the determined variable chamber impedance with the match lookup table to determine the match combination. The sensor may be a voltage and current sensor positioned at the RF input of the matching network. Further, the parameter matrix lookup table may include two-port parameter matrices, such as S-parameter matrices or Z-parameter matrices.

In another embodiment, the RF sensor 21 is a phase or magnitude detector operably coupled to the RF input 13 of the matching network 11A, and the detected RF parameter used for the determination of the match combination is a phase error or a magnitude error. In another embodiment, the RF sensor is operably coupled to the RF input of the matching network, and the detected RF parameter is at least one of a voltage, a current, or a phase at the RF input. Further, the determination of the match combination may use the match lookup table with a reflection coefficient based on the at least one of the voltage, the current, or the phase, the reflection coefficient being the value based on the detected RF parameter. In yet another embodiment, the RF sensor 49 is operably coupled to the RF output 17 of the matching network, and the determination of the match combination uses the match lookup table with a load impedance based on the RF parameter detected by the RF sensor at the RF output.

Figure 10:
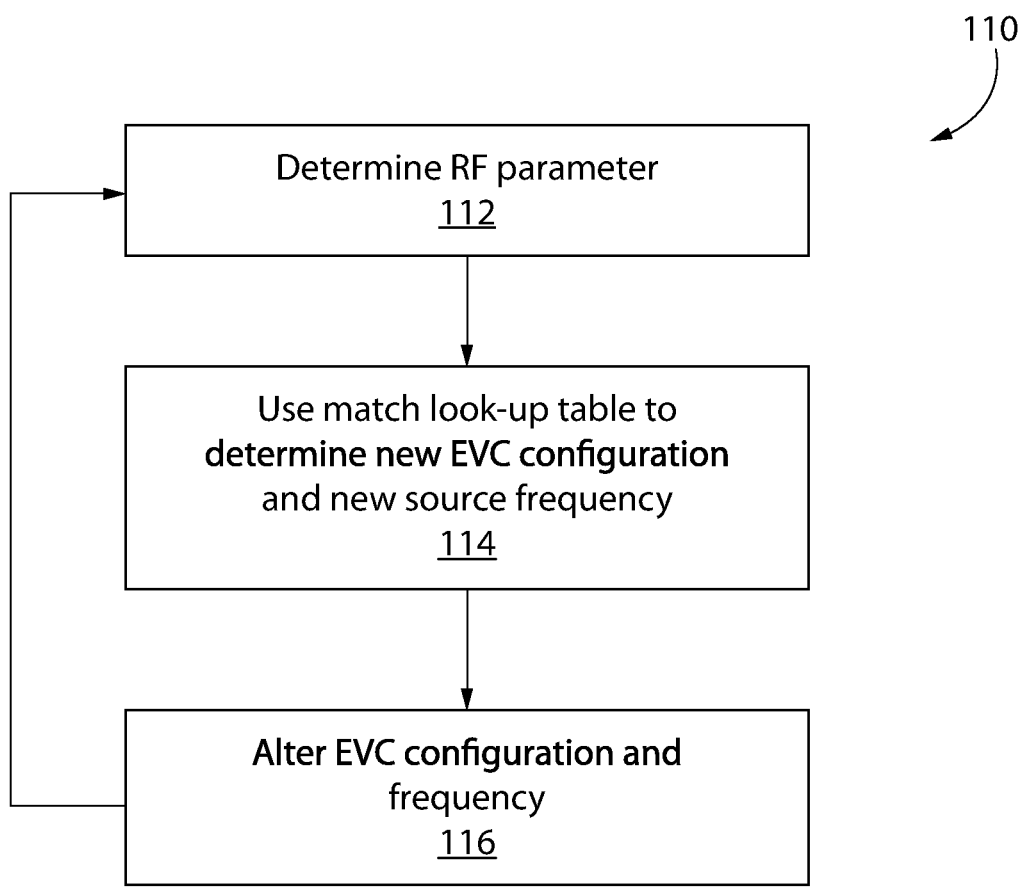
FIG. 10 is a flow chart showing an embodiment of a process for matching an impedance using a lookup table to alter an EVC configuration and an RF source frequency.

FIG. 10 is a flow chart showing an embodiment of a process 110 for matching an impedance using a lookup table to alter an EVC configuration and an RF source frequency. In a first step, the sensor detects an RF parameter (step 112). To cause an impedance match between the RF source and the plasma chamber, the control circuit determines, using a match lookup table with value based on the detected RF parameter, a match combination of a new EVC configuration for providing a new EVC capacitance, and a new source frequency for the RF source (step 114). The control circuit then alters the EVC to the new EVC configuration, and alters the variable frequency of the RF source to the new source frequency (step 116).

The above process may be carried out as part of a method of manufacturing a semiconductor. Such a manufacturing method may include placing a substrate in the plasma chamber configured to deposit a material layer onto the substrate or etch a material layer from the substrate; and energizing plasma within the plasma chamber by coupling RF power from the RF source into the plasma chamber to perform a deposition or etching. Further, the matching network described above may form part of a semiconductor processing tool (such as tool 86 in FIG. 3), the tool including the plasma chamber 19 and the matching network 11A.

Matching Using Independent EVC and Frequency Control

In yet another embodiment, impedance matching can be carried out using an EVC and frequency considerations where the EVC and the frequency are controlled separately. According to one embodiment, a single EVC is used. For example, in FIG. 3, capacitor 33A can be an EVC, while capacitor 31A can be non-variable. In other embodiments, more than one capacitor in the matching network can be variable, or capacitor 31A can be eliminated. The matching network can be calibrated such that post-calibration, at least one of the lookup tables (such as the lookup tables discussed above) contains information to provide the best capacitor positions for a load impedance to have the lowest input reflected power or input reflection coefficient (input gamma).

During operation, the matching network can determine the input impedance by those methods described above with respect to FIG. 10, such as by using a VI (voltage-current) sensor located at the RF input of the matching network. Also similar to the embodiments discussed above, the matching network can use the input impedance information and the current EVC configuration (e.g., capacitor switch positions) and the frequency information to calculate a load impedance. Alternatively, rather than calculating the load impedance from input impedance and the calibration parameters of the match, the load impedance can be directly measured from an output sensor at the RF output of the matching network. In the exemplified embodiment, the load impedance to be calculated or otherwise determined is the impedance at the EVC output (see, e.g., EVC output 41B of FIG. 12). In certain embodiments, this load impedance is the variable chamber impedance and the impedance of the frequency-sensitive circuit (see frequency-sensitive circuit 37B of FIG. 12), though the invention to a particular load impedance.

Similar to the embodiments related to FIG. 10, the matching network can use the determined load impedance and the match lookup table to determine a new EVC configuration to provide a lower reflected power or input reflection coefficient at the RF input for helping enable an impedance match. Unlike the embodiment of FIG. 10, however, the new frequency provided by the RF source is determined independently of the determination of the new EVC configuration.

Returning to FIG. 3, the semiconductor processing system 85A can be understood as carrying out one or more of the embodiments discussed above. The matching network 11A has an input 13 coupled to an RF source 15 having a variable frequency, and an output coupled to a plasma chamber 19 having a variable chamber impedance. The matching network 11A further includes two capacitors, where capacitor 33A may be an EVC and capacitor 31A may be non-variable. The matching network 11A has a first control circuit 45 coupled to at least one of sensors 21 and sensor 49, the one or more sensors configured to detect an RF parameter. The control first circuit 45 may use a match lookup table (such as one of the lookup tables discussed above) with a value based on the detected RF parameter to determine a new EVC configuration for providing a new EVC capacitance. Once these determinations have been made, the first control circuit 45 can alter the EVC 33A to the new EVC configuration and thereby assist in causing an impedance match between the RF source and the plasma chamber. In one embodiment, this altering of the EVC configuration can be understood as one step towards causing an impedance match (the change in frequency being a different and separate step). In these embodiments, the first control circuit 45 controlling the EVC is separate and distinct from a second control circuit 16 for controlling the frequency of the RF source.

In the exemplified embodiment, the second control circuit 16 alters the variable frequency of the RF source 15, independently from the first control circuit, to further cause the impedance match between the RF source and the plasma chamber. In one embodiment, this frequency altering can be understood as a second (and possibly final) step in causing an impedance match, though the time of occurrence of the two steps may to some extent overlap. The first control circuit 45 does not provide instructions to the second control circuit 16 for controlling the variable frequency of the RF source 15. The second control circuit's frequency alteration occurs independently from the first control circuit.

In certain embodiments, the second control circuit can form part of the RF source. In other embodiments, the second control circuit can form part of the matching network. In yet other embodiments, the second control circuit can be distinct from both the RF source and the matching network.

In the exemplified embodiment, the value based on the detected RF parameter (used with the match lookup table) is the load impedance (e.g., the impedance at the EVC 33A output). In other embodiments, the RF parameter can be any RF parameter associated with the matching network or processing system. For example, the RF parameter may be detected at the RF input 13 (by sensor 21) or at the RF output 17 (by sensor 49). In some embodiments, the value based on the detected RF parameter can be the detected RF parameter itself. As with earlier embodiments, the EVC comprises discrete capacitors having different configurations defining ON and OFF states of the discrete capacitors, these different configurations causing the EVC to provide different capacitances.

In one embodiment, prior to an impedance match, the EVC has a first configuration defining ON and OFF states of the discrete capacitors. The first control circuit determines, based on the detected RF parameter, an input impedance at the RF input of the matching network. The control circuit then determines the load impedance from a parameter matrix lookup table using (1) the determined input impedance of the impedance matching network; and (2) the first configuration of the EVC. The control circuit then uses the determined load impedance with the match lookup table to determine the new EVC configuration. The sensor may be a voltage and current sensor positioned at the RF input of the matching network. Further, the parameter matrix lookup table may include two-port parameter matrices, such as S-parameter matrices or Z-parameter matrices. Further, the RF sensor may have any of the characteristic discussed above with regard to the previous embodiments, and the determination of the EVC configuration may use the match lookup table with a reflection coefficient.

Figure 11:
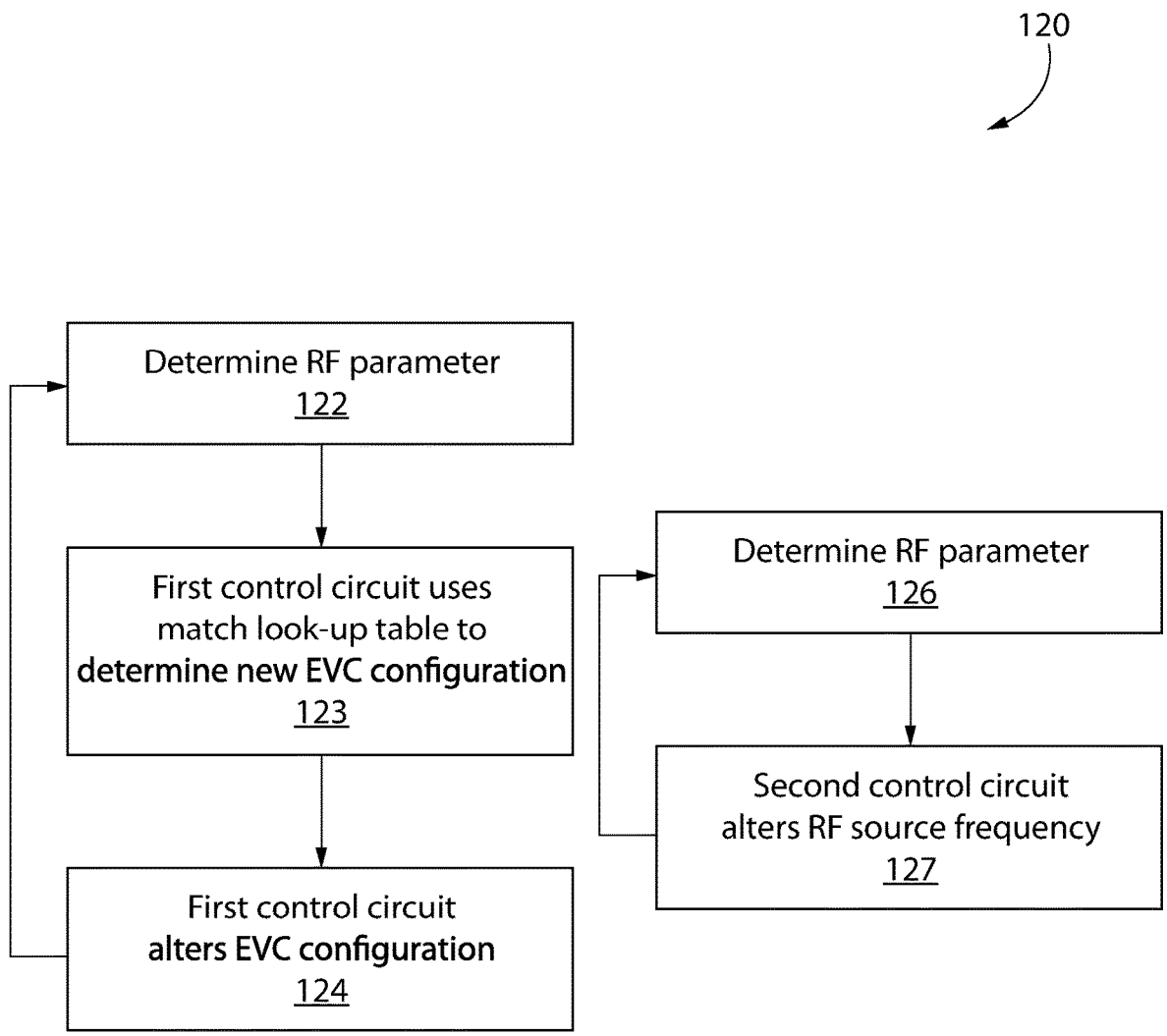
FIG. 11 is a flow chart showing an embodiment of a process for matching an impedance where capacitance and frequency are adjusted independently.

FIG. 11 is a flow chart showing an embodiment of a process 120 for matching an impedance where capacitance and frequency are adjusted independently. The process 120 includes an EVC subprocess 121 and a frequency subprocess 125 operating in parallel and independently. For the EVC subprocess 121, in a first step the sensor detects an RF parameter (step 122). To assist in causing an impedance match between the RF source and the plasma chamber, the first control circuit determines, using a match lookup table with value based on the detected RF parameter, a new EVC configuration for providing a new EVC capacitance (step 123). The first control circuit then alters the EVC to the new EVC configuration (step 124).

For the frequency subprocess 125, in a first step the second control circuit determines an RF parameter. In one embodiment, the RF parameter is a reflected power or reflection coefficient at the RF source output, though the invention is not so limited. In a second step, the second control circuit alters an RF source frequency based on the determined RF parameter.

The above process may be carried out as part of a method of manufacturing a semiconductor. Such a manufacturing method may include placing a substrate in the plasma chamber configured to deposit a material layer onto the substrate or etch a material layer from the substrate; and energizing plasma within the plasma chamber by coupling RF power from the RF source into the plasma chamber to perform a deposition or etching. Further, the matching network described above may form part of a semiconductor processing tool (such as tool 86 in FIG. 3), the tool including the plasma chamber 19 and the matching network 11A.

Figure 12:
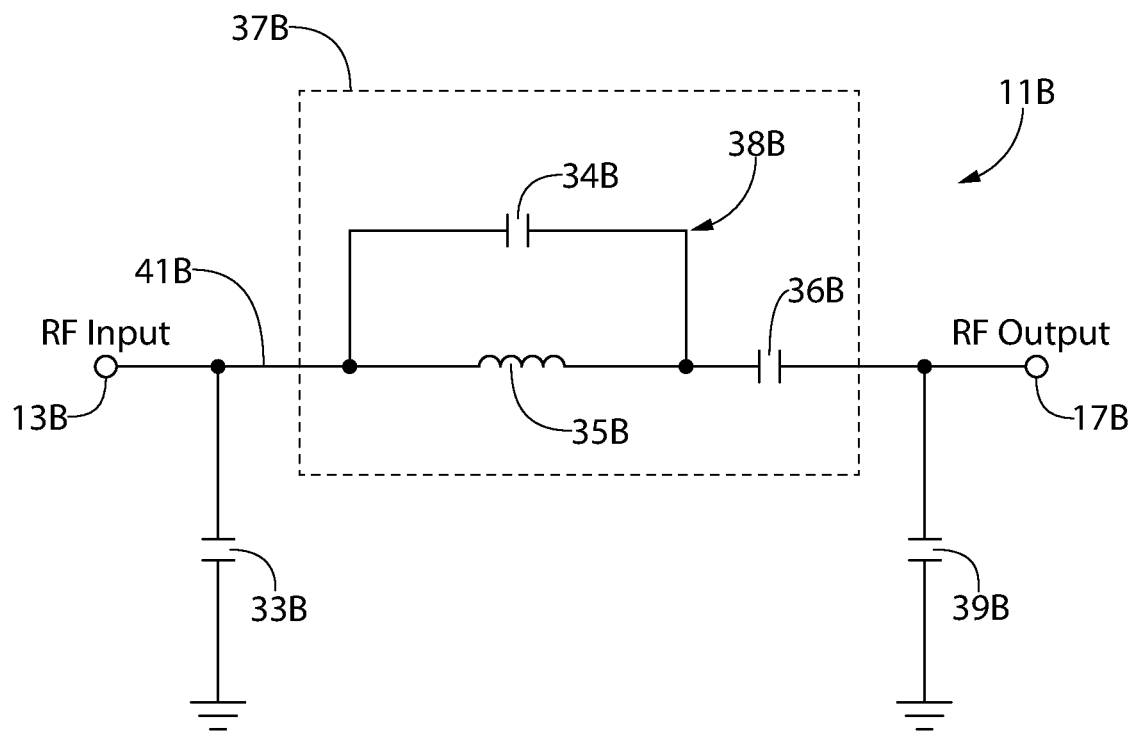
FIG. 12 is a schematic of an embodiment of a matching network having a frequency-sensitive circuit responsive to frequency adjustments.

FIG. 12 is a schematic of an embodiment of a matching network 11B having a frequency-sensitive circuit 37B responsive to frequency adjustments. The frequency-sensitive circuit is designed to have an impedance that can vary significantly when the variable frequency of the RF source is altered. In the exemplified embodiment, the frequency-sensitive circuit 37B includes an LC circuit 38B having a capacitor 34B and an inductor 35B. The frequency-sensitive circuit 37B can further include series capacitor 36B. In one embodiment, the variable chamber impedance can provide an inductance or capacitance for the LC circuit. The matching network 11B includes an input 13B and an output 17B. It further includes an EVC 33B having an EVC output 41B. A second capacitor 39B can also be included. This capacitor can be, for example, an EVC, a variable capacitor that is not an EVC (e.g., a vacuum variable capacitor), or a non-variable capacitor. As discussed, the determination of the new EVC configuration can use a match lookup table with a load impedance, and the load impedance in certain embodiments can be an impedance at an output 41B of the EVC, the EVC output impedance being the value based on the detected RF parameter. Further, the EVC output impedance can be the variable chamber impedance and the impedance of the frequency-sensitive circuit forming part of the impedance matching network.

The exemplified embodiment of FIG. 11 addresses the issue that the matching network may not be able control the frequency of the RF source. Further, communications between the match and generator may be slow, so they may not be able to send the frequency information fast enough for fast tuning. The current invention is based on the discovery that the matching network can match without knowledge of the frequency, or any frequency tuning being carried out by the generator. The matching network can view the frequency tuning elements as part of the load. Simulations were run to confirm the results, as well as testing units on static loads.

Simulations

Two tests were run, one on a 400 kHz variable matching network and the other on a 13.56 MHz variable matching network. The matching circuits were altered by adding capacitors around the inductor in both parallel and in series, as can be seen in FIG. 12. The frequency range for the 400 kHz unit is 360 kHz to 440 kHz, ±10%, and the shunt capacitor varies from 200 pF to 38,960 pF. For the 13.56 MHz unit, the frequency range is 12.88 MHz to 14.24 MHz, ±5%, and the capacitor range of 290 pF to 1910 pF. These are simplified models, as not all ESRs and other parasitics are accounted for.

As the frequency sweeps, the parallel capacitor gives the inductor a higher impedance at one end of the spectrum, while the series capacitor gives a lower inductance at the other end of the spectrum. In the case of the 13.56 MHz match, the circuit resonates and has a capacitive impedance at one end of the spectrum. This is what gives the frequency tuning its impedance variability on the imaginary axis.

The two matching circuits were then tested to verify that they were able to match fixed loads, and as a reference for later testing. This was done manually by varying the capacitor, and then the frequency. These two steps were then repeated until the VSWR was below an acceptable level, which was 1.1:1. The 400 kHz matched a load impedance of 45-j372, with a capacitance of approximately 12,197 and frequency of 416.9 kHz with a VSWR of 1.03:1. The 13.56 MHz unit also tuned into a fixed load with a frequency of 13.99 MHz and capacitance of about 425 pF.

Figure 13:
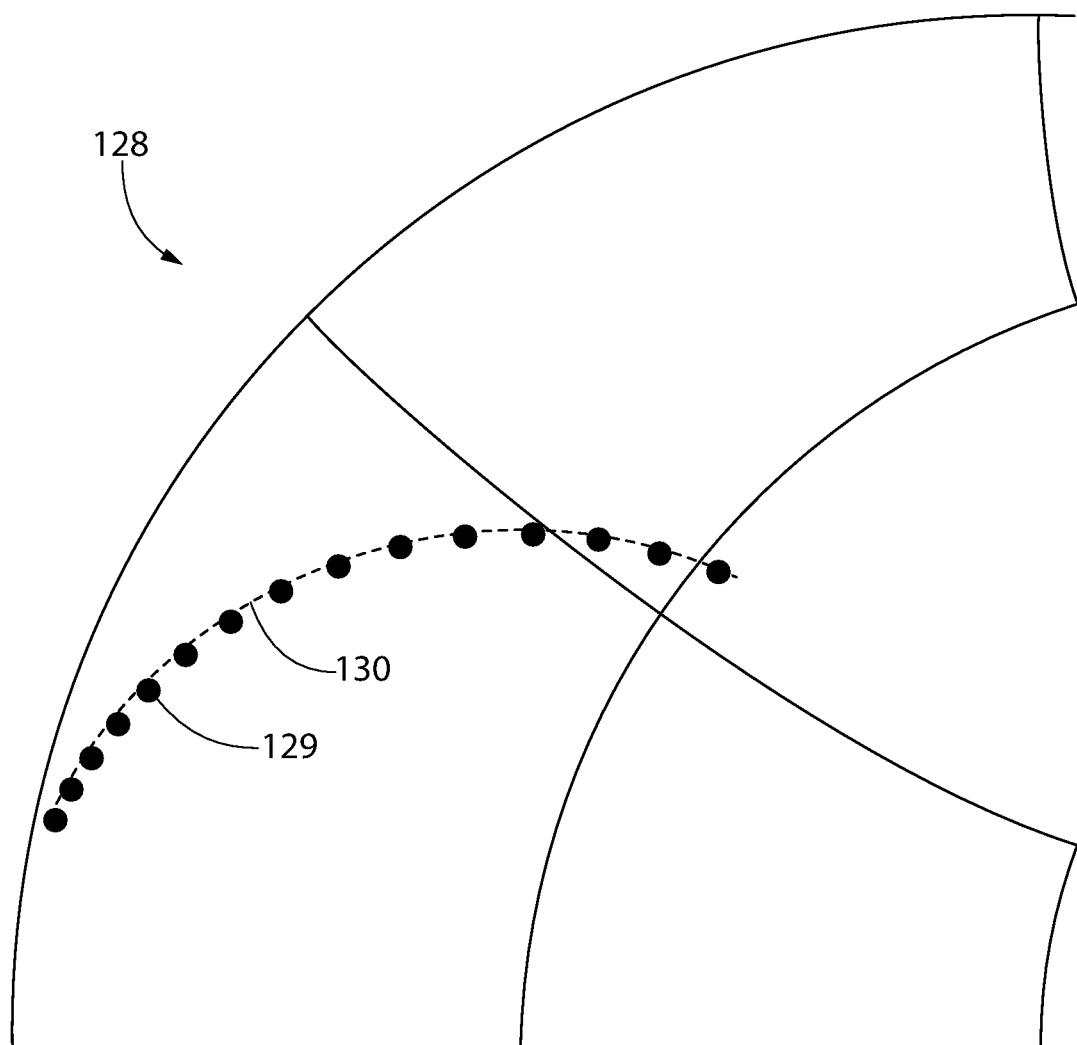
FIG. 13 is a portion of a Smith chart showing simulation results for a one-dimensional match.

The next set of testing assumed that the matching network neither has control of the generator, or any knowledge of the frequency. There are multiple reasons why this could be the case, as stated above. The first step was to remove the frequency-sensitive portion of the match. This leaves only the variable capacitor. This was done using a circuit similar to matching network 11B of FIG. 12, but where frequency-sensitive portion 37B and capacitor 39B are eliminated. The next step was to simulate and measure the two-port network parameters. FIG. 13 is a portion of a Smith chart 128 showing the simulation for fifteen different capacitor values 129 measured at 13.56 MHz, and their response 130 over frequency. It is shown that, as the frequency shifts, the impedance shifts towards the nearest point, filling in the arc.

This was noteworthy, because it indicates that the change in impedance caused by an increase or decrease in percentage of capacitance is equivalent to the change in impedance due to an increase or decrease in percentage of frequency, as one would expect in view of Equation 1 below.

$$X_c = \frac{1}{2\pi * \Delta\% \ freq * C} = \frac{1}{2\pi * freq * \Delta\% \ C}$$

Further, one could say that this is similar to adding or removing a shunt capacitor in parallel to the variable capacitor. The capacitor in parallel with the variable capacitor could be considered part of the load, as it is attached to the same node.

Thus, it can be assumed for a one-dimensional match that the change in capacitance due to frequency is equivalent to a change in the load, having a capacitor at the input shunt leg. When running in auto-tune mode, the match would see this change in frequency as a change in the load. Thus, if the load changes by a certain percentage due to frequency, the variable capacitor would adjust by a proportionate difference but in the opposite sign to counteract the change in impedance.

The next step was to look at the matching algorithm and how it would react to changes in frequency. To do this, the one-dimensional match circuit was simulated at three different frequencies, 13.56 MHz and at ±5%, and with 169 different capacitor values ranging from 290 pF to 1910 pF. The Z-Parameters were calculated for each combination, and then the best matching capacitance table was generated by inputting a different load impedance with each set of Z-Parameters and finding which position had the lowest gamma for each load at each frequency.

The next step was to use a list of various input impedances and the Z-Parameters to calculate different load impedances for each frequency at different capacitor positions. For example, when the variable capacitor is at 50%, and the input impedance is determined to be 20+j0Ω, the load impedance for each frequency can be calculated. These calculated load impedances are then used to find the best match position on the lookup table.

Since the V/I sensor has little change when the frequency is swept, we can assume the input impedance reading would not be affected by it changing. The V/I sensor also assumes that the frequency is 13.56 MHz. To measure the accuracy of the match over frequency, the best match capacitor percentage will be compared to the other two frequencies finding their perspective best matches for their calculated loads. So, at 50% capacitance and an input impedance of 20+j0Ω, the 13 MHz match will have a load of 4.9+j10.3Ω, the 12.88 MHz will have a load of 5.5+10.6Ω, and the 14.24 MHz will have a load of 4.4+j10.0Ω. Multiple input impedances were randomly picked and their data can be found below in Table 2.

TABLE 2

Frequency versus Best Match Capacitor Position

| Input Impedance | Capacitor Start Position | Capacitor End Position | | |
|---|---|---|---|---|
| | | 12.88 MHz | 13.56 MHz | 14.24 MHz |
| 20 + j0 | 25.0% | 11.3% | 11.9% | 11.9% |
| 20 + j0 | 50.0% | 36.3% | 36.9% | 36.9% |
| 20 + j0 | 75.0% | 61.9% | 61.9% | 61.9% |
| 50 + j50 | 25.0% | 36.3% | 35.7% | 35.7% |
| 50 + j50 | 50.0% | 61.3% | 60.7% | 60.1% |
| 50 + j50 | 75.0% | 86.3% | 85.1% | 85.1% |
| 50 − j50 | 25.0% | 20.8% | 21.4% | 21.4% |
| 50 − j50 | 50.0% | 45.8% | 46.4% | 47.0% |
| 50 − j50 | 75.0% | 70.8% | 72.0% | 72.0% |
| 200 + j0 | 25.0% | 28.6% | 28.6% | 29.2% |
| 200 + j0 | 50.0% | 54.2% | 54.2% | 54.2% |
| 200 + j0 | 75.0% | 80.4% | 79.8% | 79.2% |

As it can be seen in Table 2, the best match positions are extremely close to one another across frequency. The major source of error is from quantization, where the load impedances were calculated to the nearest 0.1Ω for the lookup table, and there are only 169 different capacitor positions.

Testing was done with both the 400 kHz unit and the 13.56 MHz unit. The S-parameters were measured and the best match table was calculated for specified load impedance ranges. The unit was set to automatically change the capacitor position while the frequency was varied manually. For the 400 kHz unit, the load was again set to 45-j372Ω. The matched condition was at frequency 417 kHz, 100 Hz higher than the manually tuned test, and a capacitance of approximately 12,428 pF, one fine cap position more than in the manually tuned test, giving a VSWR of 1.04:1. The 13.56 MHz match was also tuned to its load. The matched condition was at frequency 13.98 MHz, which was 10 kHz less than the manually tuned test, and the capacitance was about 435 pF, one fine position higher than the manually tuned test. This gave a VSWR of 1.07:1.

It was concluded that a one-dimensional EVC match with variable frequency sweep tuning was capable of working. With the input V/I sensor and two-port network parameters, the change in impedance due to frequency was equivalent to a load with a change in an input shunt capacitor. The tuning tables show that the variable capacitor's value will be the same at different frequencies for a given input impedance. The testing showed that the algorithm works with a manually adjusted frequency.

Matching with Multi-Level Power Setpoints (Level-to-Level Pulsing)

In modern semiconductor processes, there are instances where the process requires the RF source to generate a multi-level pulse signal such that the RF signal has cyclically recurring pulse intervals with differing amplitude levels. In some cases, the change in the power setpoint amplitude level can be very frequent and of the order of a few tens of hundreds of microseconds. The multi-level power setpoint can be two levels or more. Such pulsing is sometimes referred to as level-to-level pulsing because the power setpoint goes from one level to another and not just between a level and zero. While such cyclic adjustment of the intensity level of the RF energy used to generate the plasma can provide advantages, it also creates challenges with regard to impedance matching, due to the rapid variations in the load impedance caused by the differing pulse levels.

Typical RF matching networks based on electromechanical components, such as vacuum variable capacitors, cannot move their positions for the short pulses of level-to-level pulsing, and therefore they are set to (or their internal automatic matching algorithms set themselves to) an average position for the electromechanical components setting. This is not an optimal method, since the electromechanical matching network is not tuned to either one level or the other and thus the RF source in the system is exposed to high reflected power for each of the levels.

An RF matching network utilizing solid state technology, which may include the use of EVCs, is able to tune significantly faster, and thus is able to match for each of the power setpoint levels. The methods described below provide methods for performing RF impedance matching when the RF signal has multi-level power setpoints. The methods can be applied to various types of RF matching networks based on solid state technology, including as those matching networks discussed above that utilize one or more EVCs.

Figure 14:
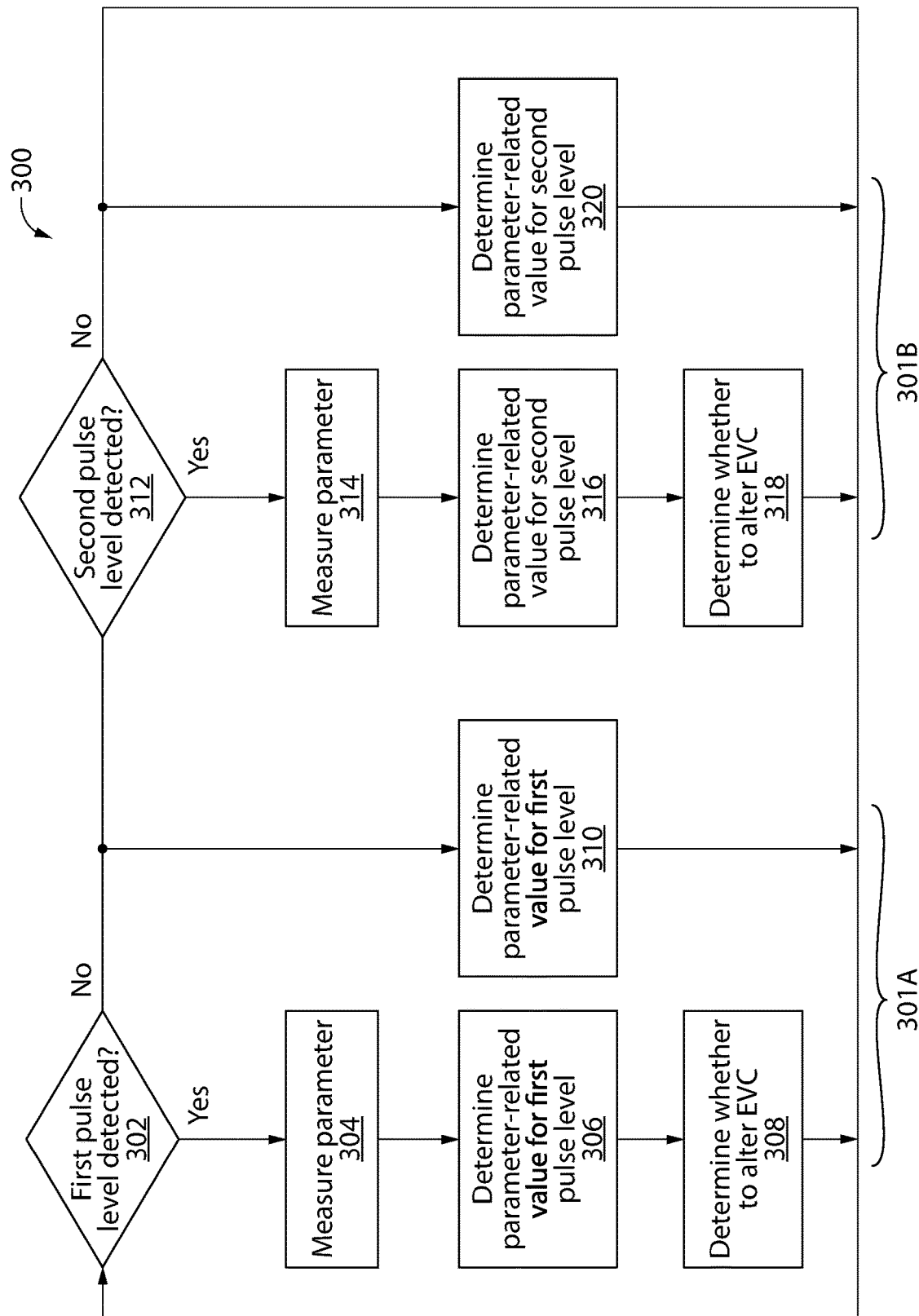
FIG. 14 is flow chart of an embodiment of a process for impedance matching when the RF input signal has multi-level power setpoints according to one embodiment.
Figure 15:
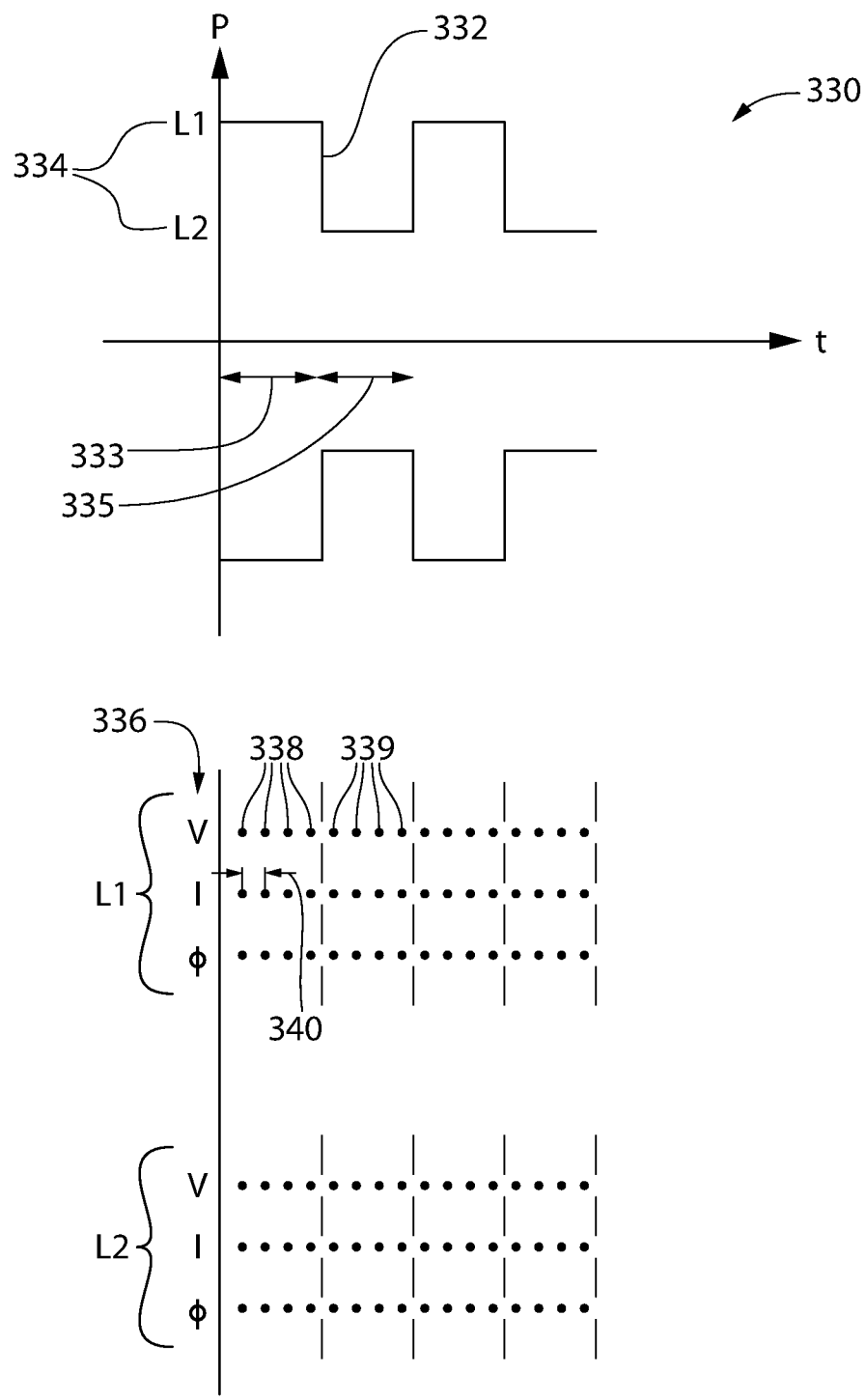
FIG. 15 is a graph showing the pulse levels and timing of parameter-related value determinations according to the embodiment of FIG. 14.

FIGS. 14 and 15 are discussed below to describe an embodiment for performing level-to-level pulsing. In the exemplified embodiment, two non-zero pulse levels are utilized. The invention is not so limited, however, as any number of two or more pulse levels may be used. Further, the exemplified embodiment measures the parameters voltage, current, and phase at the RF input, and generates running parameter-related values (described below) based on these values, but the invention can measure any parameter (one or more) related to the load, and make that measurement at other locations in the system (e.g., the RF output of the matching network), and base the parameter-related values on any of those different parameters.

FIG. 14 provides a flow chart of the exemplified process 300 for impedance matching when the RF input signal has multi-level power setpoints. FIG. 15 provides a graph 330 of RF signal 332 having a first pulse level L1 and second pulse level L2, as well as the times 338, 339 for determining the parameter-related value. In the exemplified embodiment, the pulse level changes periodically at a pulse level interval 333, 334.

Returning to FIG. 14, the control circuit of the matching network detects whether the first pulse level is being provided (operation 302). If so, the control circuit measures the parameter related to the load for the first pulse level (operation 304), which in this embodiment includes the voltage (V), current (I), and phase (Φ) at the input of the matching network (see parameters 336 in FIG. 15). These values can be measured independent of the RF source, or the system can synchronize sampling with when the RF source samples them. Based on the measured parameter, the control circuit will determine a parameter-related value for the first pulse level (operation 306), which will be used to alter the EVC (operation 308), provided the control unit determines that an alteration to the EVC is warranted.

The parameter-related value can be any value based on the one or more measured parameters. In its simplest form, the parameter-related value may be the measured parameter(s) itself. In the exemplified embodiment, however, the parameter-related value is based on previously-determined parameter-related values. Specifically, the new parameter-related value is an average of the current measured parameter and a predetermined number of previously-determined parameter-related values. For example, at the last time of times 338, the parameter-related value is the average of the parameter value at the last time of times 338 (the current time) and the parameter-related values determined at the first three times of times 338 (the previous three times). In other embodiments, other methods of using prior parameter-related value(s) may be used.

In the exemplified embodiment, the parameter-related value is used to calculate the input impedance at the RF input of the matching network ($Z_{input\ low}$). In other embodiments, other values can be determined, such as the reflection coefficient at the RF input of the matching network ($\Gamma_{input\ low}$). The exemplified system uses the calculated input impedance ($Z_{input\ low}$) (or related value such as $\Gamma_{input\ low}$) and the matching network's parameter matrix (such as one of the parameter matrices discussed above) to determine the load impedance ($Z_{output\ low}$). The system next uses the determined load impedance along with the desired input impedance at the input of the match (typically 50+j0) to determine the best configuration for the EVCs of the matching network—that is, to determine the best positions for the discrete capacitors of the EVCs ($EVC1_{low1}$ and $EVC2_{low2}$). In the exemplified embodiment, the matching network uses two EVCs, though in other embodiments more or less EVCs can be used. In another embodiment, the system could alter one or more EVCs in conjunction with altering an RF frequency, thus using a combination of capacitor tuning and frequency tuning. In this embodiment, the system will determine both the best EVC configuration and the best RF frequency value (e.g., $EVC_{low1}$ and $freq_{low1}$). In the exemplified embodiment, the matching network next changes the EVCs to their new configurations. Accordingly, EVC1 is changed to the $EVC_{low1}$ position, and EVC2 is changed to the $EVC2_{low2}$ position. In other embodiments, other configurations may be used, such as changing to $EVC_{low1}$ and $freq_{low1}$. Note that the invention is not limited to the method for determining a match impedance discussed above. One or more of these steps may be omitted between determining the parameter-related value and the match configuration, and/or be substituted with another step for ultimately determining the new match configuration. For example, while the foregoing embodiments performed matching based on input impedance or a reflection coefficient, in other embodiments matching can be performed based on alternative values, such as maximum delivered energy during a pulse or minimum loss of energy during a pulse. Further, matching can be based on RF input phase and/or magnitude errors, on the measured reflected power, or on a load impedance measured directly at the output of the matching network.

Note that the system may include certain schemes that limit the extent to which the capacitor positions may be changed at a given time. For example, the alteration of the at least one EVC to provide the match configuration may be prevented from being carried out until a predetermined time has passed since a previous alteration of the at least one EVC. This scheme can ensure sufficient time has passed to allow the previous capacitor change to take effect. Further, in certain circumstances, a protection scheme may allow one of the EVCs to change to a newly determined position, but will not allow the other EVC (or EVCs) to move to a newly determined position (or positions). In other embodiments, the protection scheme may prevent any number of changes to the capacitor positions or frequency. In the exemplified embodiment, the changes that are permitted by the protection scheme will be made, while the other capacitor positions (or RF frequency) will be held at its current position (or frequency).

As shown in FIG. 15, during the first pulse interval 333, the control circuit will measure the parameter at several times 338 and repeat steps 302-308 for each time 338, regularly updating the parameter-related value. In the exemplified embodiment, the times 338 (and times 339) for calculating a new parameter-related value are separated by a time interval 340 that is 4 microseconds. In other embodiments, the time interval 340 can be of a different duration.

During first pulse interval 333, while a first level process 301A is being carried out, an independent second level process 301B is being carried out. While the first pulse level is being detected (operation 302), the second pulse level is not being detected (operation 312). During this first pulse interval 333, while the first level process 301A is measuring the parameter to determine the parameter-related value and alter the EVCs accordingly, second level process 301B is determining a parameter-related value for the second pulse level (operation 320) without measuring the parameter. This can be done by several methods. In the exemplified embodiment, presuming there were prior parameter measurements when the second pulse level L2 was ON, the parameter-related value will be based on a predetermined number of previously-determined parameter-related values. For example, the current parameter-related value may be based on an average of a predetermined number of previously determined parameter-related values. For example, while when the pulse is ON the parameter-related value is the average of the currently measured parameter value and three previously-determined parameter-related values, when the pulse is OFF the parameter-related value is the average of the four previously-determined parameter-related values. Thus, even when a given pulse level is OFF, a new parameter-related value can regularly be generated at each time interval 340. The parameter-related value is not simply a previously measured parameter value being held in memory until the pulse level is turned back ON, but is a value (for each pulse level) being newly determined at regular intervals, even when a given pulse level is OFF, to create a data bus of values.

At second pulse interval 335, the first pulse level L1 is OFF and the second pulse level L2 is ON. When this occurs, the first pulse level L1 and the second pulse level L2 switch roles. For the first pulse level (which is OFF), parameter-related values are determined at times 339 without use of a newly measured parameter (operation 310), similar to the process described with respect to operation 320 of the second-level process. For the second pulse level (which is ON), parameter-related values are determined (operation 316) at times 339 using new parameter measurements (314), and the at least one EVC is altered accordingly (operation 318). The different options for determining the parameter, the parameter-related value, and the match configuration apply to both the first level process 301A and the second level process 301B.

The above-disclosed process for impedance matching during level-to-level pulsing provides several advantages. There is no interruption in collecting parameter-related data, and the data set collected for each power level is practically continuous. As a result, the control loop can access this data at any time for determining new EVC and/or frequency settings. Because in a preferred embodiment this data also relies upon averaging the last few measured values, the disclosed method reduces the noise and sudden measurement changes associated with stopping and starting the measurement process. Further, the disclosed method of determining parameter values for each level, irrespective of whether the level is ON or OFF, allows the control system to treat each level as if it is its own matching network, thus increasing the flexibility and scalability of the control system to multi-level pulsing.

The above process may be carried out as part of a method of manufacturing a semiconductor. Such a manufacturing method may include placing a substrate in the plasma chamber configured to deposit a material layer onto the substrate or etch a material layer from the substrate; and energizing plasma within the plasma chamber by coupling RF power from the RF source into the plasma chamber to perform a deposition or etching. Further, the matching network described above may form part of a semiconductor processing tool (such as tool 86 in FIG. 3), the tool including the plasma chamber 19 and the matching network 11A.

Level-to-Level Control Loops and Parameters

It is noted that, for the level-to-level pulsing discussed herein, the system may, for each of the pulse levels, carry out a separate matching process based on determined parameter values for the pulse level. In one example where there are two pulse levels, the firmware may run a single control loop every 200 µs (or another predetermined time period) and, within each iteration of the control loop, the system may use two separate processing loops for the two pulse levels. There can be two different match control structures, one per pulse cycle. Reference values upon which matching is based can be different for each of the pulse levels. Such differing reference values may include a reflected power value, a reflection coefficient, a time period for ignoring data, or a time period for holding a preset value. Programs may contain data, for example, as a single frequency match system with separate on/off preset values for each of the pulse levels. When programs get loaded, the match structures for each pulse level can be populated with the same set points, except the presets. Match tune logs may be populated in a single data structure with entries for each pulse level with validity bits set appropriately. Tune logs may be printed to enable viewing pulse level logs independently or, alternatively, the entries for each level may be printed one after another.

In another example where there are two pulse levels, the control loop may run every 100 µs (or another predetermined time period) and alternate between pulse levels in those iterations instead of processing both pulse levels in a single iteration. Thus, in this embodiment, the separate matching processes of the different pulse levels are carried in sequence one after another, each of the separate matching processes being carried out for a predetermined period of time. When there is no level-to-level pulsing, the system can speed up the processing cycle time for continuous wave mode to 100 µs by using this approach.

Switching Circuit for Electronically Variable Capacitor

Figure 16:
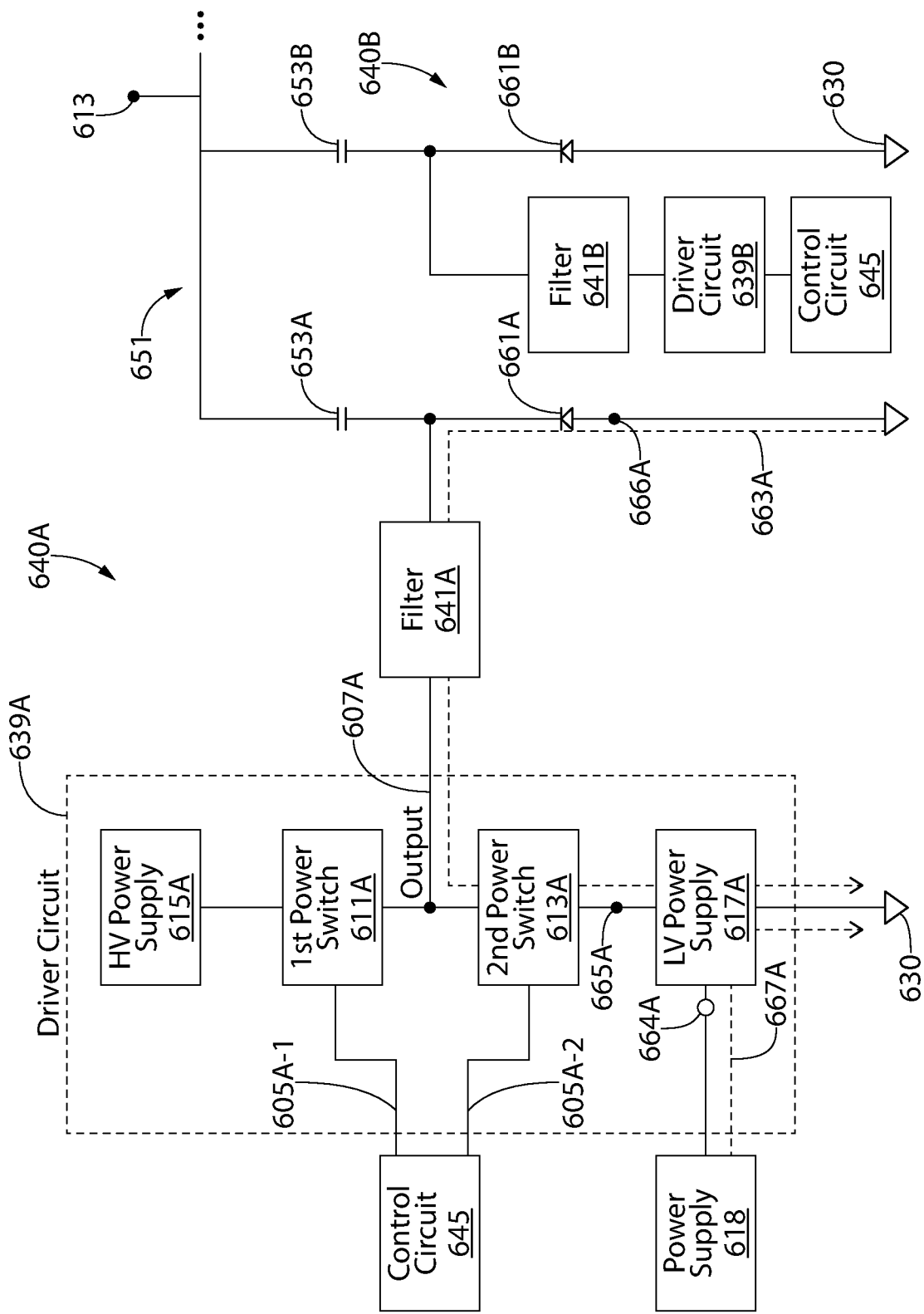
FIG. 16 is a block diagram of a switching circuit for an electronically variable capacitor of a matching network according to one embodiment.

FIG. 16 shows an embodiment of a switching circuit 640A for an EVC 651 of a matching network according to one embodiment. In the exemplified embodiment, the EVC 651 is the EVC of FIG. 5, but the EVC is not so limited, as it can have any of the alternative features discussed herein, including a different number of discrete capacitors 653, and discrete capacitors of different values than those discussed with respect to FIG. 5. Further, the EVC can form part of any type of matching network, including the various types of matching networks discussed herein. The exemplified matching network is coupled between an RF source and a plasma chamber, as shown, for example, in FIGS. 1-3.

The exemplified EVC comprises a plurality of discrete capacitors 653A, 653B coupled to a first terminal 613. Each discrete capacitor 653A, 653B has a corresponding switch 661A, 661B configured to switch in (or "ON") the discrete capacitor and switch out (or "OFF") the discrete capacitor to alter a total capacitance of the EVC 651. In the exemplified embodiment, the switch 661A is in series with the discrete capacitor 653A, but the invention is not so limited. Further, in the exemplified embodiment, the switch 661A is a PIN diode, but the invention is not so limited, and may be another type of switch, such as a NIP diode. In yet other embodiments, the switch may be a MOSFET, a JFET, or another type of switch. Further, in the exemplified embodiment, the PIN diode has a common anode configuration such that the anode of each PIN diode 661A, 661B is coupled to a ground 630, which may be any common node. The invention is not so limited, however, since in other embodiments the EVC may use a common cathode configuration such that the cathode of each PIN diode is coupled to the ground 630 (and the components of the driver circuit are altered accordingly). Further, it is noted that two or more switches may be used in series to increase the voltage rating and/or two or more switches may be used in parallel to increase the current rating of the channel.

Each PIN diode switch 661A, 661B has its own switching circuit 640A, 640B, which is connected to a control circuit 645. Switching circuit 640B is shown as including switch 661B, filter 641B (which may be similar to the filter circuits 37, 41 discussed above), and driver circuit 639B. The filter 641B can be, for example, an LC circuit similar to filter circuit 9 of U.S. Pat. No. 10,340,879, or the filter circuit beside output 207 in FIG. 6A of U.S. Pat. No. 9,844,127. Each of these patents is incorporated herein by reference in its entirety.

Exemplified switching circuit 640A has the same components as switching circuit 640B, but shows the driver circuit 639A in greater detail. The driver circuit 639A may be integrated with the PIN diode 661A (or other type of switch), or may be integrated with the discrete capacitors of the EVC of the matching network. One of skill in the art will also recognize that certain components of the driver circuit 639A may be replaced with other components that perform the same essential function while also greater allowing variability in other circuit parameters (e.g., voltage range, current range, and the like).

The exemplified driver circuit 639A has two inputs 605A-1, 605A-2 for receiving control signals from the control circuit for controlling the voltage on the common output 607A that is connected to and drives the PIN diode 661A. The voltage on the common output 607A switches the PIN diode 661A between the ON state and the OFF state, thus also switching in/ON and out/OFF the discrete capacitor 653A to which the PIN diode 661A is connected. The state of the discrete capacitor, in this exemplary embodiment, follows the state of the corresponding PIN diode, such that when the PIN diode is ON, the discrete capacitor is also in/ON, and likewise, when the PIN diode 661A is OFF, the discrete capacitor is also out/OFF. Thus, statements herein about the state of the PIN diode 661A inherently describe the concomitant state of the corresponding discrete capacitor 653A of the EVC 651.

Figure 18:
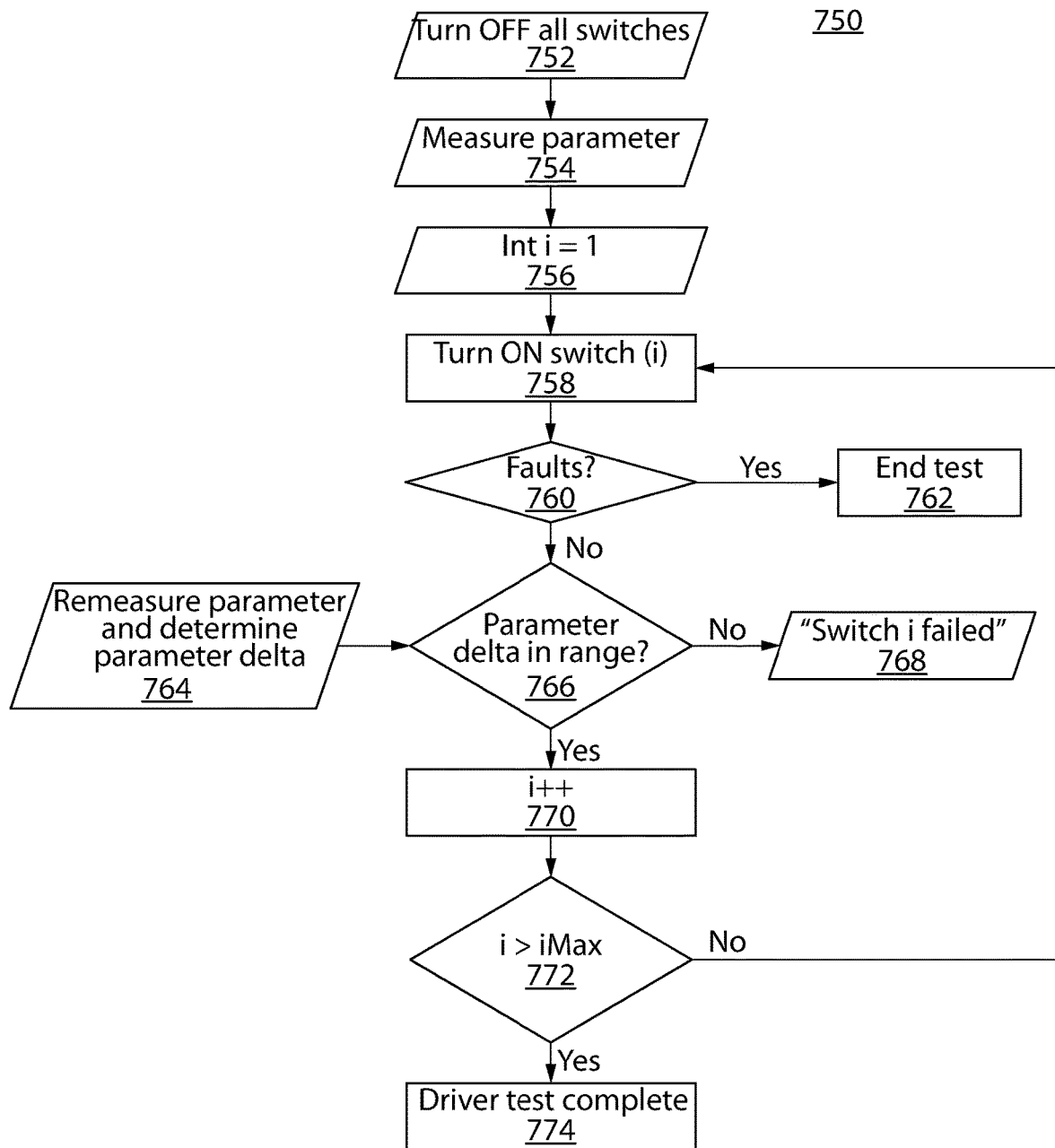
FIG. 18 is a flow chart for performing a driver test on a matching network according to one embodiment.

In a preferred embodiment, each of the first power switch 611A and the second power switch 613A is a MOSFET with a body diode, though in other embodiments either of the power switches can be another type of switch, including any other type of semiconductor switch. The invention may utilize a variety of switching circuit configurations. For example, the invention may utilize any of the switching circuits disclosed by U.S. Pat. No. 9,844,127, such as those shown in FIGS. 3, 6A, 6B, and any of the switching circuits disclosed by U.S. Pat. No. 10,340,879, such as the switching circuit shown at FIG. 18. As stated above, each of these patents is incorporated by reference in its entirety.

In the exemplified embodiment, a high voltage power supply 615A is connected to the first power switch 611A, providing a high voltage input which is to be switchably connected to the common output 607A. A low voltage power supply 617A is connected to the second power switch 613A, providing a low voltage input which is also to be switchably connected to the common output 607A. In the configuration of the driver circuit 639A shown, the low voltage power supply 617A may supply a low voltage input which is about −3.3V. Such a low voltage, with a negative polarity, is sufficient to provide a forward bias for switching the PIN diode 661A. For other configurations of the driver circuit 639A, a higher or lower voltage input may be used, and the low voltage input may have a positive polarity, depending upon the configuration and the type of electronic switch being controlled.

In the exemplified embodiment, the control circuit provides separate control signals to separate inputs 605A-1, 605A-2 of the driver circuit 639A. In this embodiment, the separate inputs 605A-1, 605A-2 are coupled to the first and second power switches 611A, 613A, respectively. The control signals to the separate inputs may be opposite in polarity. In a preferred embodiment, the first and second power switches 661A, 613A are MOSFETS, and the separate control signals go to separate drivers for powering the MOSFETs. In an alternative embodiment, the control circuit 645 provides a common input signal. The common input signal may asynchronously control the ON and OFF states of the first power switch 611A and the second power switch 613A, such that when the first power switch 611A is in the ON state, the second power switch 613A is in the OFF state, and similarly, when the first power switch is in the OFF state, the second power switch 613A is in the ON state. In this manner, the common input signal controls the first power switch 611A and the second power switch 613A to asynchronously connect the high voltage input and the low voltage input to the common output for purposes of switching the PIN diode 661A between the ON state and the OFF state. The invention, however, not limited to such asynchronous control.

The inputs 605A-1, 605A-2 may be configured to receive any type of appropriate control signal for the types of switches selected for the first power switch 611A and the second power switch 613A, which may be, for example, a +15 V control signal. In a preferred embodiment, the driver circuit has a separate driver for driving each of the first power switch 611A and second power switch 612A. In another embodiment, the first and second power switches 611A, 613A are selected so that they may receive a common input signal.

In the exemplified embodiment, a power supply 618 is coupled to an input of the low voltage power supply 617A. In a preferred embodiment, the power supply 618 provides 24 VDC. The invention, however, is not so limited, as other power supplies may be utilized.

In the exemplified embodiment, when the second power switch 613A is ON, a current 663A flows between the PIN diode 661A and the low voltage power supply 617A. At the same time, current flows from the power supply 618 to the input of low voltage power supply 617A, and to the ground 630. A sensor may be positioned at a node of the switching circuit 640A to measure a parameter associated with the current 663A flowing between the low voltage power supply 617A and the PIN diode switch 661A. In the exemplified embodiment, sensor 664A is positioned at an input of the low voltage power supply 617A, and measures the current 667A flowing into the input from the power supply 618, which is related to current 663A. In other embodiments, the sensor can be at other positions in the switching circuit 640A, such as at node 665A (the output of the low voltage power supply) or node 666A (the anode of PIN diode 661A) or in the path of the filter 641A between the driver circuit and the switch (e.g., driver output 607A or the output of filter 641A). In the exemplified embodiment, the parameter is the value of the current flowing at the node, but in other embodiments the parameter measured may be any parameter (including voltage) associated with current flowing through the switch or switches. In yet other embodiments, the parameter is any parameter associated with the driver circuit.

EVC Diagnostic System and Method

EVC-based impedance matching network units can fail for various reasons, during testing or even in the field. It would be beneficial if a matching unit could provide detailed feedback as to why it was not operating. The system and method discussed below discloses an embodiment of an automated self-diagnostic function that an impedance matching network can run to give more information when a problem arises, and/or can run at bootup.

The most common failure that a matching network unit will see occurs with the driver of a switch for an EVC. The bottom switching element (e.g., second power switch 613A coupled to the low voltage power supply), the top element (e.g., the first power switch 611A coupled to the HVDC 615A), or even both can fail. Occasionally, more than one driver channel will fail. Less likely, PIN diodes have failed, while the driver is fine. There have also been cases where an assembly issue occurred or an unforeseen circumstance from shipping, causing a switch to not operate properly, which is usually from a loose connector. Another potential problem is a failed power supply. Although this typically comes with a driver failure, a failed power supply is a possibility, especially when the unit is first turned ON.

For the self-diagnostic test described herein to operate, the matching unit will need to have integrated hardware (e.g., sensors) to measure different parameters. These measurements may include anything vital to the operation of the matching unit, such as voltage monitors for each power supply, a current sensor for measuring bias current, a sensor for measuring fan speed from its tachometer output, and a sensor or other means to determine that all the interlocks are closed. Once implemented, these measurements are calibrated, if necessary, and have some predefined pass-fail criterion.

Figure 17:
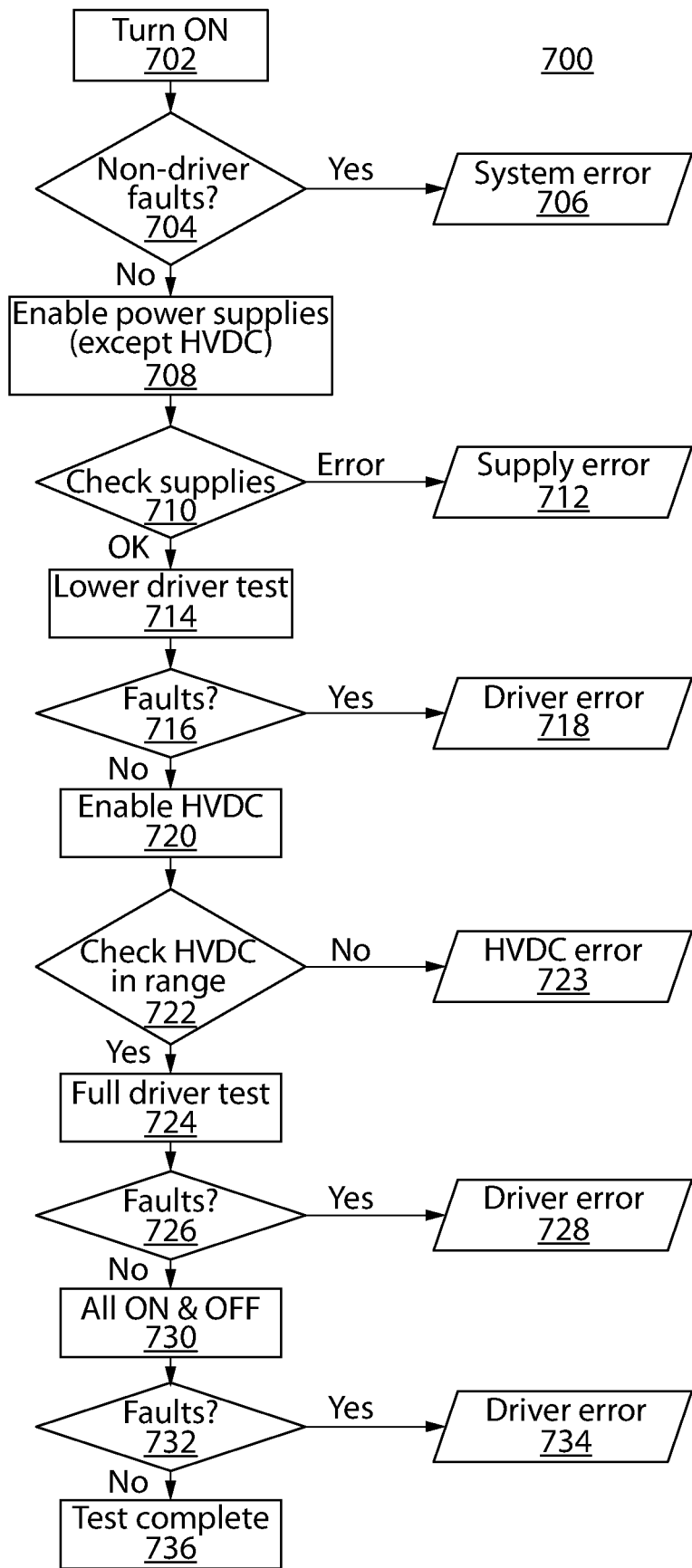
FIG. 17 is a flow chart for performing diagnostics on a matching network according to one embodiment.

FIG. 17 is a flow chart for a method 700 for performing diagnostics on a matching network according to one embodiment. In operation 702, the matching network is turned ON. In operation 704, the system checks for any faults that are not related to the driver circuit, such as fans, interlock, issues with any calibration data or parameters, etc. This may be checked when the unit boots up and be constantly checked while the unit is operating. If any of these faults occur, the unit should warn the user of a system error (operation 706) before running a self-diagnostic test.

Since the self-diagnostic test will most likely be run after a failure, turning ON the driver circuit's high voltage power supply (such as high voltage reverse-biasing supply 615A, referred to as "HVDC") should be avoided initially to prevent further damage to the matching unit. The other power supplies (e.g., low voltage (forward biasing) power supply 617A and power supply 618), however, are capable of testing most of the functionality of the unit. In operation 708, these other power supplies are enabled. In operation 710, it is verified that these power supplies can all be powered ON. If any supplies do not turn ON (and/or a voltage for any of the supplies is not in a predetermined range) the test will be terminated, and the unit will alert the user which supply or supplies were not functioning properly (operation 712).

In operation 714, a lower driver test is performed. An embodiment of a driver test method 750 is provided in FIG. 18. In operation 752, all the switches of the driver circuit are turned OFF (e.g., switches 661A, 661B of driver circuit 639A), thus switching out all the discrete capacitors of the plurality of discrete capacitors of the EVC. In operation 754, a sensor at a first node measures a parameter associated with a current flowing between a power supply of the switching circuit and one or more of the switches of the discrete capacitors. Referring to FIG. 16, in the exemplified embodiment, the sensor may be positioned at node 664A, which is at an input of the low voltage (and forward bias) power supply 617A, and measures the current 667A flowing into the input from the power supply 618, which is associated with current 663A flowing between the low voltage power supply 617A and PIN diode switch 661A. It is noted that the a relationship between current 663A and current 664A is such that (assuming the low voltage power supply 617A is 100% efficient or loss less) the current at 667A would be the voltage of the low-voltage power supply 617A (e.g., 3.3V) divided by the voltage of the power supply 618 (e.g., 24), multiplied by current value of current 663A. In other embodiments, the node can be at other positions in the switching circuit 640A, such as at node 665A (the output of the low voltage power supply) or node 666A (the anode of PIN diode 661A) or in the filter path between the driver circuit and the switch (e.g., output 607A). In the exemplified embodiment, the parameter is the value of the current flowing at the node, but in other embodiments the parameter measured may be any parameter (including a voltage value) associated with current flowing between a power supply and one or more of the switches 661A, 661B of the discrete capacitors. In yet other embodiments, the parameter is any parameter associated with the driver circuit. The parameter measurement at operation 754 value provides a baseline value for later comparison.

In the exemplified driver test 750, the matching unit tests each individual bottom side (e.g., second power switch 613A), driver, filter, and PIN diode switch by switching them all from the OFF position to the ON position individually. In operation 756, integer "i" is assigned the value of 1. Switch i (initially, switch 1) is then turned ON. According to operation 760, the system may check for faults, such as ensuring that the power supplies are healthy by having a voltage monitor on each power supply, and end the test if the power supplies are not healthy (operation 762). In operation 764, the parameter measured at operation 754 is remeasured to determine a difference between the original parameter value and the new parameter value. In operation 766, it is determined whether the difference between the initial parameter value and the present parameter value (the "parameter delta") is within a predetermined range. If it is not, it is indicated that switch i, its driver circuit, or its filter (the components of channel i) has failed (operation 768). At this stage, the test may stop or continue.

If the parameter delta is within range, the integer i is increased by 1 (operation 770). If i is not greater than the total number of discrete capacitors ("iMax") (operation 772), the next switch is turned on and steps 760-770 can be repeated. Once all the discrete capacitors are switched in, the test is complete (operation 774). The parameter measurements at operation 764 allow the matching unit to know if each channel is working properly. After all the channels are tested, the matching unit can tell the user which channel(s) gave an error during the test. The parameter measurement can be done in two different ways, namely, either the switches are turned ON and left in the ON state as the next switch is turned ON, or they are turned ON then turned OFF when the next switch is turned ON. If the switches are each turned OFF after the measurement, then the current measurement may be more accurate because there may be other factors that affect the measurement. Such factors could include the bias power supply's efficiency changing with the load, the line drop from the cabling that delivers the bias voltage to the driver boards, which would also increase the bias voltage if the Kelvin connection is implemented, or some other factor not mentioned. It also allows for a single threshold to be used as a pass fail, which will reduce the chances of an error. It is noted also that in certain embodiments the predetermined parameter delta range can be different depending on which switches are being switched ON.

Returning to FIG. 17, if the lower driver test (operation 714) determines faults (operation 716), a driver error is output (operation 718). If not, the HVDC is enabled (operation 720). All the channels and their switches should be in the ON position before turning ON the HVDC. This way, if there is a top side (e.g., first power switch 611A) driver failure, the HVDC will not be given the opportunity to charge up, because it will be shorted to the negative bias. If this occurs, the unit can display "HVDC Too Low," and the test can terminate.

In operation 722, the HVDC is checked to determine whether its voltage output is within a predetermined range. If not, an HVDC error is registered (operation 723). If so, a full driver test with the HVDC ON is performed. Thus, the driver test 750 of FIG. 18 can once again be performed (operation 724), but for when the HVDC is ON. Further, the measuring and re-measuring of the parameter is a measuring and a re-measuring of any parameter (e.g., current or voltage) associated with a current flowing between the high-voltage power supply and one or more of the switches of the discrete capacitors. This can be measured, for example, by a sensor in the current path. A fault may also be detected by monitoring the voltage output of the HVDC, which will drop if one of the channels draws excessive current. If there are faults (operation 726), a driver error is registered (operation 728).

The self-diagnostic test can further include switching all the drivers ON then OFF to verify that there are no issues with the most extreme possible switching condition (operation 730). If there are faults (operation 732), a driver error is registered (operation 734), and if not the test is complete (operation 736). It is noted that in other embodiments, certain operations may be omitted and/or added.

Another self-diagnostic test would be to test whether the RF cavity or RF sensors were damaged during shipping or installation. This would require external hardware to be added to the unit, such as an RF generator at the input and a load of some sort. If the unit has a large signal at the input, it could calculate what the output voltage should be based on the input V/I-sensor and the measured S-parameters stored in the unit. Since the units have an output voltage measurement, the unit could compare the calculated value to the measured. If there is too much of a discrepancy, the unit would trigger an alarm.

There are many benefits of internal testing. The biggest benefit is if the unit is damaged, the unit will be able to prevent other components or parts of the system from failing. The unit can also be repaired in the field without additional test equipment. The technician could be told which PCB(s) and/or component(s) need to be replace. Depending on the failure, the unit could potentially be repaired without removing the unit from the tool. This is not possible when using certain test equipment, or if there is no indication on what the failure is. Depending on the damage, there is the possibility that the unit runs in a modified state. As an example, if a single channel is damaged, and that channel can stay in the OFF state, and the matching unit could avoid turning that channel ON. This would allow the user to continue production until the unit can be serviced.

It is noted that the above diagnostic method may form part of a method of manufacturing a semiconductor. Further, a matching unit utilizing the diagnostic method may form part of a semiconductor processing tool, which further includes a plasma chamber for manufacturing semiconductors.

Level-to-Level Matching with Pre-Pulse Capacitor Switching

Returning to the concept of level-to-level pulsing discussed above (see section entitled Matching with Multi-Level Power Setpoints), a matching network typically has three modes of operation related to RF power levels: continuous wave, pulsing between non-zero and zero power levels, and pulsing between two non-zero power levels (level-to-level pulsing). Capacitor positions are not relevant when RF power is zero, so non-zero to zero pulsing can be treated similarly to continuous wave. That is, the system can switch the capacitors at any time with respect to pulse state and they will only affect RF power when it is non-zero. In those two modes, the system calculates the best matching capacitor position (EVC configuration) and immediately switches the caps without regard to the power level at that moment.

With level-to-level pulsing, however, plasma impedance can differ significantly between the two RF power levels, and therefore appropriate capacitor positions (EVC configurations) for the two power levels can be different. The match in this mode switches the capacitors at the beginning of each pulse state, that is, when the RF power level changes. The EVC configurations for each pulse level are independently calculated during one or more pulses and then automatically applied at the power level change. This mechanism removes a need for synchronizing the control loop with the pulse transitions. If pulses are long enough to accommodate multiple capacitor switches, it may happen that a new capacitor matching position is calculated and applied immediately if appropriate, that is, there is no requirement to wait until the next pulse change.

During level-to-level pulsing mode, RF power is on all the time, but for each pulse level, power levels during pulse on and pulse off states are different. This results in possibly different plasma impedances and consequently different best capacitor positions (EVC configurations) during pulse on and off states. Ideally, the capacitors would be in the appropriate positions throughout the pulse on and off states.

A system can detect pulse state changes and trigger capacitor changes at the moment of the pulse state change. The problem with this approach is that the capacitor change (the switching of the EVC's discrete capacitors from one capacitor configuration to another) takes a non-zero amount of time, typically, several microseconds. If the capacitor switching is triggered at the moment of the pulse state change, the effect of the new capacitor configuration will not be felt by plasma for some time. In fact, the capacitor change may not be complete until near the end of the capacitor change interval.

To address this issue, the disclosed system is designed to predict when the next pulse state change will occur and initiate capacitor switching to a new configuration before the pulse state changes. The initiation of capacitor switching can precede the pulse state change by about the duration of the time it would take for the capacitor switching to occur, thus causing the new capacitor configuration to coincide in time with the pulse state change.

Figure 19:
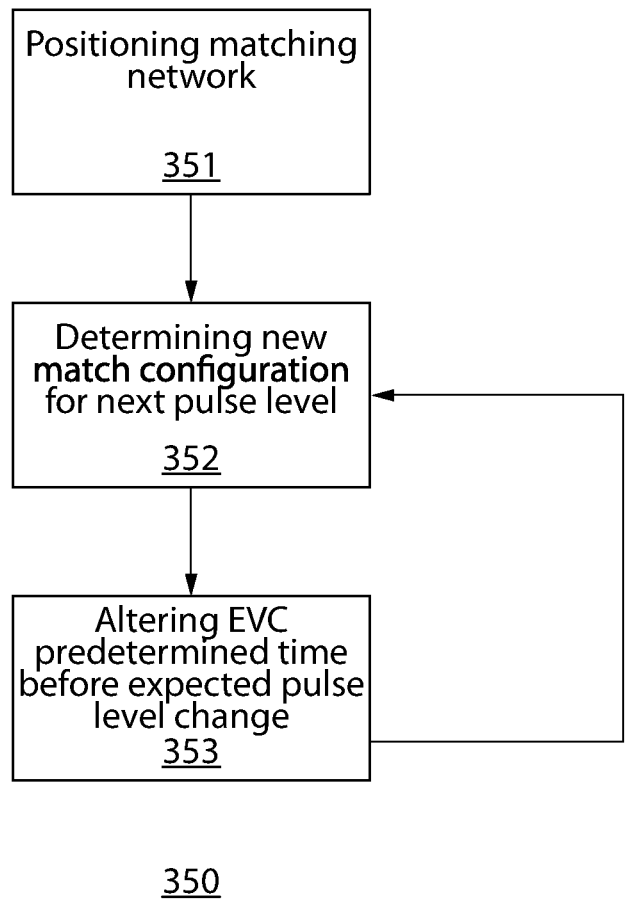
FIG. 19 is a flow chart for a level-to-level impedance matching method using pre-pulse capacitor switching according to one embodiment.

FIG. 19 is a flow chart for a level-to-level impedance matching method 350 using such pre-pulse capacitor switching according to one embodiment. In a first operation, the matching network is positioned between a radio frequency (RF) source and a plasma chamber (operation 351). The RF source is configured to provide at least two repeating, non-zero pulse levels, the at least two pulse levels comprising a first pulse level and a second pulse level. Note that any number of two or more pulse levels may be used. The plasma chamber has a variable impedance. Further, the matching network comprises at least one electronically variable capacitor (EVC) configured to switch between a plurality of match configurations for reducing a reflected power at an output of the RF source as the variable impedance of the plasma chamber changes. As examples, the system may be any of the systems shown in FIGS. 1-3.

In the exemplified embodiment, the system determines, from among the plurality of match configurations, a new match configuration to be used when there is an expected pulse level change from a first of the pulse levels to a second of the pulse levels (operation 352). In the exemplified embodiment, each EVC of the at least one EVC comprises discrete capacitors configured to switch in and out to vary the capacitance of the EVC and thereby provide the plurality of match configurations. Thus, each "match configuration" comprises a positioning in or out for each of the discrete capacitors. Different match configurations have different combinations of discrete capacitors switched in to provide different total capacitances.

The system then sends a control signal to alter the at least one EVC to provide the new match configuration (operation 353). The control signal can be any type of signal for causing, enabling, or helping enable the alteration of the EVC. The control signal is sent a predetermined time period before a time for the expected pulse level change. This predetermined time period will be substantially similar to a time period for the EVC to switch between two match configurations of the plurality of match configurations (e.g., 75-80 μsec). In this regard, a "substantially similar" time period is considered ±20% of the estimated time period for the EVC to switch between two match configurations of the plurality of match configurations. If the time periods are not identical, it is preferred that the switching be completed after the new pulse has started, rather than before the new pulse has started. Further, it is noted that the importance of aligning the switching completion and the pulse change varies with the duration of the new pulse. For example, if the pulse is only 100 μsec long for its RF ON period, then the alignment of the capacitor switch and the pulse change (and the similarity between the predetermined time period for switching and the estimated time period for the EVC to switch) should be as close as possible, such as ±10% or ±5%. On the other hand, if the pulse was significantly longer (e.g., 10 ms long), then there would be more leeway in aligning these times, such as ±20%.

The estimated time period can be obtained in a variety of ways. For example, this time period can be measured or calculated in advance. However the estimated time period is determined, the predetermined time period will be chosen such that the switching is completed at or near the time of the pulse change. As shown in FIG. 19, the operations 352, 353 may be repeated for a subsequent expected pulse level change.

There are different methods for determining the time for the expected pulse change. For example, the method may include measuring a duration for each of the pulse levels, and determining the time for the expected pulse level change based on the measured durations for each of the pulse levels. Alternatively, a control circuit may receive from the RF source or from a semiconductor processing tool (e.g., from a pulse information signal), the durations of each of the at least two pulse levels, and a start time for one of the at least two pulse levels. From this data, the control circuit may determine the time for the expected pulse level change.

The determination of the new match configuration may be accomplished using any of the means for determining a match configuration discussed herein. For example, the determination of the new match configuration may be based on a value of the second pulse level and a measured parameter related to the plasma chamber. The measured parameter value may be, for example, at least one of a voltage, a current, or a phase at an input of the matching network. Further, the determination of the new match configuration may be based on a parameter-related value and a previously-determined parameter-related value. Further, the new match configuration may be based on a load impedance value, which is determined based on an input impedance value at the input of the matching network or a reflection coefficient, which is determined based on the measured parameter value. Further, the load impedance value may be determined using a parameter matrix.

As indicated, the above process may be carried out by an impedance matching network, such as those shown in FIGS. 1-3. The matching network may include an RF input configured to operably couple to the RF source, and an RF output configured to operably couple to the plasma chamber, and the at least one EVC. A control circuit of the matching network may be programmed to carry out the method discussed above and shown in FIG. 19.

The above process may be carried out as part of a method of manufacturing a semiconductor. Such a manufacturing method may include placing a substrate in the plasma chamber configured to deposit a material layer onto the substrate or etch a material layer from the substrate, and energizing plasma within the plasma chamber by coupling RF power from the RF source into the plasma chamber to perform a deposition or etching. Further, the matching network described above may form part of a semiconductor processing tool (such as tool 86 in FIG. 3), the tool including the plasma chamber 19 and the matching network 11A.

The above-described invention addresses the issue of delays in capacitor switching and allows for better synchronization between capacitor switching and pulse level changes, allowing the desired EVC configuration to be in place at the beginning of a new pulse level. As a result, impedance matching is enhanced, reflected power is decreased, and efficiency in the delivery of RF power is improved.

Assigning Parameter Values to Different Activities

During impedance matching, control systems can continuously measure several signals. Some of those signals are useful for providing to a user interface, some for monitoring unit health, and some for matching. Further, some signals are useful for multiple functions. For example, voltage at the matching network's RF input may be useful both for unit protection (health monitoring) and for matching.

Certain measurement signals are not reliable or usable for matching. For example, immediately after a pulse state change, the plasma is usually in a transient state, and therefore measurements taken during that time are not useful for matching. Further, during capacitor switching, the match may be for a moment in an unknown state and so correct interpretation of some signals is impossible. Further, sometimes it may be advantageous to only consider measurement signals from a short, predefined time interval for matching. Such a time constraint can create multiple time intervals when measurement signals are valid for matching, while outside those intervals the signals are not valid for matching. Those invalid signals, however, may be useful for other purposes, such as unit protection.

Figure 20:
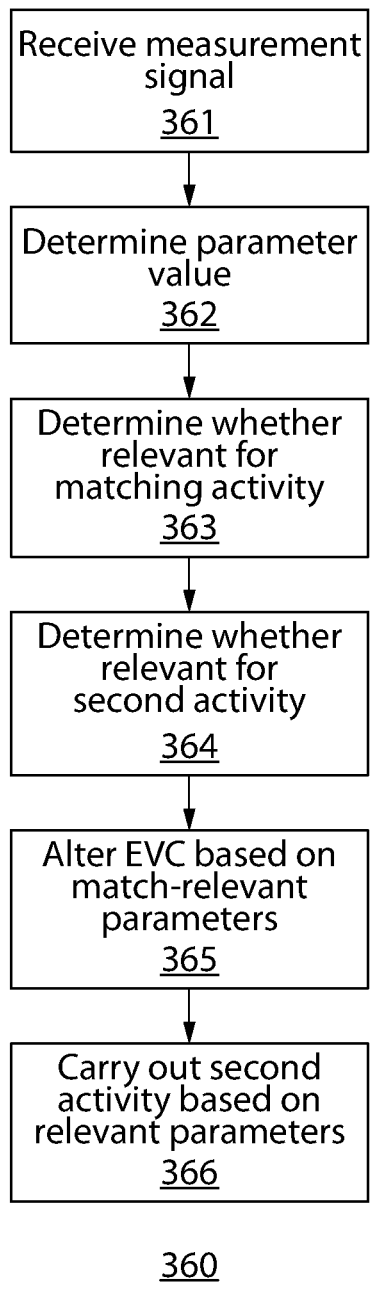
FIG. 20 is a flow chart for an impedance matching method where parameter values are assigned to different activities according to one embodiment.

FIG. 20 is a flow chart for a method 360 of impedance matching where parameter values are assigned to different activities according to one embodiment. This method may be performed by a matching network having an RF input configured to operably couple to an RF source, an RF output configured to operably couple to a plasma chamber, and at least one electronically variable capacitor (EVC) configured to carry out a matching activity of altering its capacitance to provide match configurations (see, e.g., FIGS. 1-3). The matching network also may include at least one device, each device outputting parameter signals indicative of at least one changing value of a parameter related to the plasma chamber or the matching network. The device may be a sensor outputting signals of a parameter value such as voltage, current, phase, or temperature. The sensors may be located, for example, at the RF input or RF output of the matching network (see, e.g., sensors 41, 49 of FIGS. 2 and 3). The device providing the parameter signal may alternatively be outside the matching network. For example, the device may be the RF generator or the semiconductor processing tool that the matching network forms part of. In this case, the parameter signal may be, for example, a pulse information signal indicative of information about one or more pulses (such as a duration of a pulse, an amplitude of a pulse, and/or a start time of a pulse or pulse train).

According to method 360 of FIG. 20, a control circuit of a matching network (see, e.g., control circuit 45 of FIGS. 2 and 3, which may comprise, for example, an FPGA) receives the parameter signals (operation 361). The control circuit then determines a parameter value for each parameter signal based on the parameter signal (operation 362). For each parameter value, the control circuit determines whether the parameter value is relevant to the matching activity of altering the EVC configuration (operation 363), and determines whether the parameter value is relevant to a second activity of the matching network different from the matching activity (operation 364). For example, as discussed above, parameter values relevant to matching activity can be limited to those output within a predetermined time interval, and thus exclude those values outside that time interval. Those excluded values, however, may still be used for the second activity. The method then carries out the matching activity based on the parameter values determined to be relevant to the matching activity (operation 365), and carries out the second activity based on the parameter values determined to be relevant to the second activity (operation 366).

In one embodiment, the second activity is a protective action on behalf of a matching network, the RF source, or the plasma chamber, such as monitoring for unsafe voltages or temperatures, and under certain circumstances shutting down or limiting a function to protect the system from damage. In another embodiment, the second activity can be providing information to a user interface. In yet other embodiments, different values can be used for the three or more different activities (such as matching, protective action, and user interface displaying). It is noted that any parameter value can be considered relevant to one or more of the activities (or none of the activities). For example, RF input voltages taken within a certain time interval may be relevant to all activities, while other RF input voltages may be relevant only to protective action and/or display.

In one embodiment, the second activity is protective action on behalf of the matching network, the RF source, or the plasma chamber. Further, the parameter values relevant to the protective action comprise temperature values, the temperature values not being relevant to the matching activity.

Further, similar to certain matching networks discussed above, the matching network may use level-to-level pulsing, where the matching network's RF input is configured to receive at least two non-zero pulse levels from the RF source. Where the second activity is protective action on behalf of the matching network, the RF source, or the plasma chamber, the parameter values relevant to the protective action may comprise at least one of (a) parameter values whose corresponding parameter signals were output immediately after a change between the at least two pulse levels, (b) parameter values whose corresponding parameter signals were output during an altering of the at least one EVC, and/or (c) parameter values whose corresponding parameter signals were output outside a predetermined time interval.

The matching network may include any of the relevant features discussed above. For example, each EVC may comprise discrete capacitors configured to switch in and out to alter the capacitance of the EVC, each of the match configurations comprising a positioning in or out for each of the discrete capacitors. Further, each match configuration may be determined based on current parameter values determined to be relevant to the matching activity and previous parameter values determined to be relevant to the matching activity. Further, the parameter values may comprise values of the measured parameter, or values derived from the values of the measured parameter. The term "parameter value" may refer to any of "parameter values" or "parameter-related values" discussed herein. Further, in one embodiment, the determination of each match configuration is based on a load impedance value, which is determined based on an input impedance value at the input of the matching network or a reflection coefficient, which is determined based on an RF input voltage, the RF input voltage being a parameter value.

The above process may be carried out as part of a method of manufacturing a semiconductor. Such a manufacturing method may include placing a substrate in the plasma chamber configured to deposit a material layer onto the substrate or etch a material layer from the substrate, and energizing plasma within the plasma chamber by coupling RF power from the RF source into the plasma chamber to perform a deposition or etching. Further, the matching network described above may form part of a semiconductor processing tool (such as tool 86 in FIG. 3), the tool including the plasma chamber 19 and the matching network 11A.

By assessing each parameter value and determining its relevance to each of different purposes, the matching network can ensure it is using the best data for each of its functions. This will allow for enhanced impedance matching, while also ensuring protection of the system and reliable information.

Prioritization of Pulse Level

With level-to-level pulsing, the matching network may tune for a short duration for a first pulse, and then tune again when the next pulse is initiated. Depending on the period and duty cycle, this may require the matching network to switch continuously.

Commonly-owned U.S. patent application Ser. No. 16/778,181, filed Jan. 31, 2020, is incorporated herein by reference in its entirety. FIG. 19 of this application's shows a switching circuit for an EVC-based matching network. There is a discussion of the various challenges that may arise, including power dissipation caused by rapid, continuous switching. The power dissipation will generate heat that can degrade components and reduce their lifetime. For the reasons discussed therein, and in U.S. Provisional Application No. 62/812,025 (incorporated by reference above) a preferred option for reducing power dissipation is to reduce switching frequency.

For level-to-level pulsing applications, the RF power is switched between two power settings, e.g., a high power and a low power. The frequency, duty cycle, and power levels will have an effect on the plasma's impedance. There is even a difference in impedance between the high and low power states during pulsing. Thus, an EVC-based matching network may switch between two separate combinations of capacitors for both pulse states to ensure maximum delivered power during the process and repeatability in tuning from run to run.

In an exemplified embodiment, a maximum switching frequency is determined. This can be done by a variety of means. For example, the maximum switching rate can be calculated based on the HVDC power supply's maximum power delivery. In the following example, it is assumed that temperature rise is not the limiting factor, which should be found in testing as there are many factors that contribute to it. The invention, however, is not so limited. Further, various forms of testing may be used to determine a maximum switching rate.

The minimum off-to-off period (period to switch a discrete capacitor in and then back out) can be calculated using the following equation. In one example, the HVDC supply can deliver 23 W. There will be 50 capacitors switching with 330 pF each. This gives a minimum period of just under 1 ms, or a maximum switching frequency of about 1 kHz. This would be the limit for level-to-level pulsing.

$$t=CV^2/2P$$

This maximum level-to-level pulsing frequency, however, should not be used as the switching frequency. As in the case of a non-pulsing application, the unit could switch multiple times in a short period of time, and if no tuned position is found, wait for a period of time as to not discharge the power supply or over dissipate the various components.

If 2.1 ms is used as the time for the maximum number of switches for discharging the HVDC supply, the unit can switch 42 times, or have 21 off-to-off transitions. Giving some margin for the HVDC supply, a limit of 30 switches in a window of 15 ms can be implemented. If there are 50 discrete capacitors as in the current example, this would result in a switching limit of 1500 switches in 15 ms. This switching limit allows the matching network to tune in a short amount of time, as it rarely takes more than a couple milliseconds to match. This is also the case for normal on/off pulsing. The unit can switch during the on condition as long as it follows the same limits as in the non-pulsing application. In the off condition, the HVDC supply will have the opportunity to recharge. It should be noted that the above numbers are examples and the invention is not so limited.

The exemplified matching network is required to tune at both the high and low levels, and therefore reserves a minimum number of switches for the pulse transitions. The exemplified matching network is also attempting to achieve the fastest possible match. In the exemplified level-to-level pulsing, knowledge of the pulsing frequency, duty cycle, and the maximum number of switches in a period of time are used, as well as a way to synchronize the switching with the pulsing envelope. With this information the matching network can switch at the appropriate times and also maximize the number of additional switches to decrease the tune time.

To find the maximum number of additional switches, the number of reserved switches is determined, and can be calculated as two times the period, or the reciprocal of frequency. This is subtracted from the maximum number of switches in a period of time. The difference is now the new number of switches allowed in the same given amount of time. The following equation shows how to calculate the maximum number of additional switches, $Sw_{L2L\_Max}$, where $Sw_{Max}$ is the maximum number of switches in the window, $Sw_{Window}$ is the period of time where the switches are counted, and $f_{L2L}$ is the pulsing frequency. This calculated value may then be rounded down to the nearest integer value as to not exceed the maximum number of switches.

$$Sw_{L2L\_Max}=(Sw_{Max}/Sw_{Window}-2/f_{L2L})*Sw_{Window}$$

At the maximum pulsing frequency, the number of reserved pulses is equal to the number of maximum pulses. So, the fastest way to tune in this situation for each pulse state is to tune during pulse transitions. As the pulsing frequency is decreased, more switches become available. There are multiple tuning techniques that can be implemented.

A first strategy is to take the available number of switches and tune when needed. This is a first come, first served approach. A disadvantage of this is that for low frequency pulsing, all of the available switches can be used up to tune one pulse state, and the other will only be able to tune during transitions. Another strategy is to divide the available number of switches between the pulse states. They can be divided evenly or be weighted to some ratio to give priority to one state. This give the advantage that both states will have the ability to tune quickly, and with the weighted, the more critical state can be tuned more quickly.

A final strategy gives priority to one of the pulsing states. The advantage of this is to allow the more critical state to be tuned first. For example, the high-power state may need maximum power delivery as quickly as possible, or the low power state is required to keep the plasma from flickering.

Figure 21:
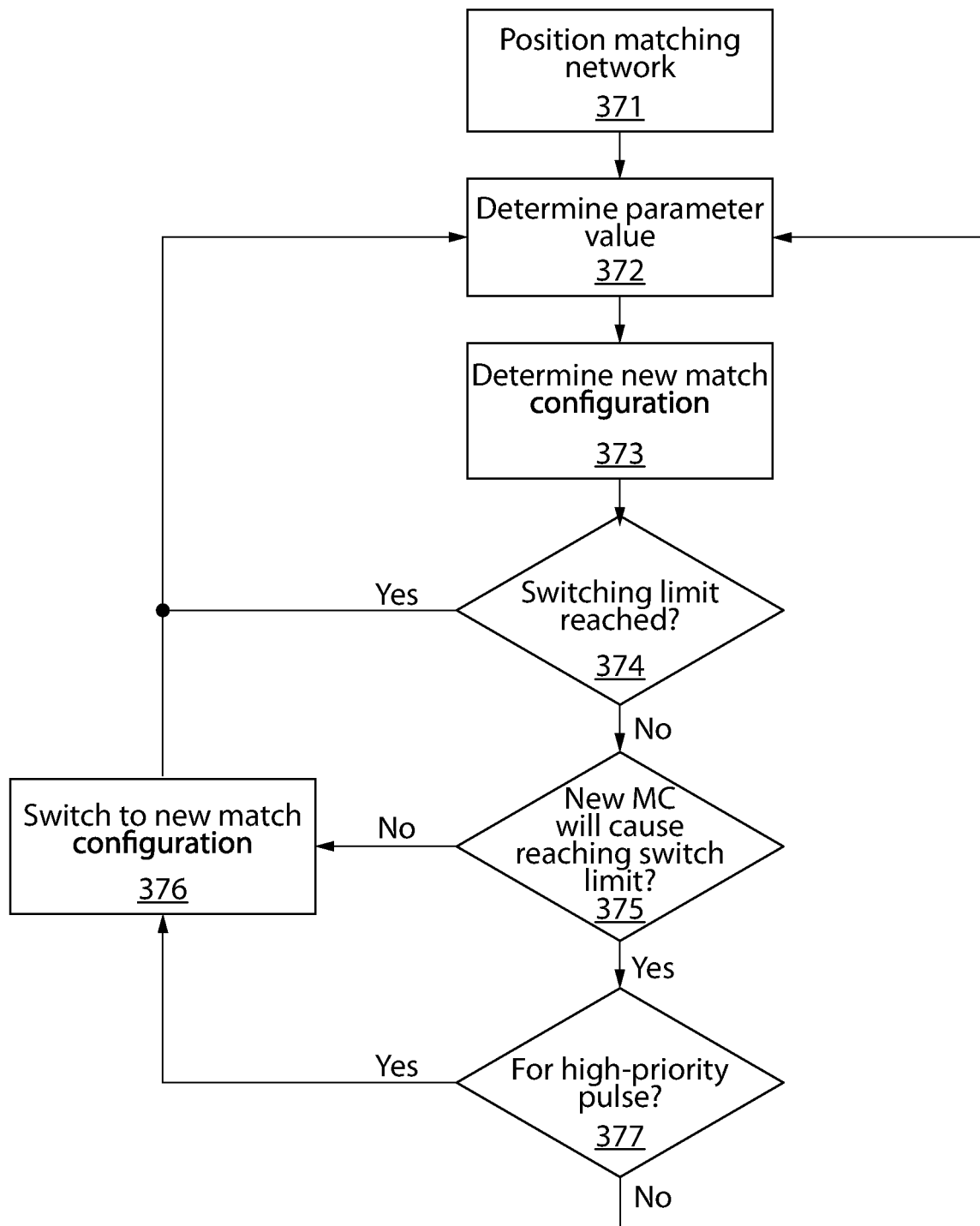
FIG. 21 is a flow chart for a level-to-level impedance matching method where a pulse level is prioritized according to one embodiment.

FIG. 21 is a flow chart for a level-to-level impedance matching method 370 where a pulse level is prioritized according to one embodiment. In a first operation, the matching network is positioned between the RF source and the plasma chamber (operation 371). These components (matching network, RF source, and plasma chamber) can have any of the various features discussed herein. In the exemplified embodiment, the RF source provides two repeating, non-zero pulse levels, one being the high-priority pulse level and the other being the low-priority pulse level. In other embodiments, additional pulse levels may be included. The plasma chamber has a variable impedance, and the matching network comprises at least one EVC for providing an impedance match (see, e.g., FIGS. 2-3). Similar to embodiments discussed above, the exemplified EVC comprises discrete capacitors configured to switch in and out to vary a total capacitance of the EVC and provide a plurality of match configurations for reducing a reflected power at an output of the RF source as the variable impedance of the plasma chamber changes.

In this embodiment, each EVC has a switching limit. The switching limit comprises a predetermined number of switches in or out of the EVC's discrete capacitors in a prior time interval of a predetermined time. For example, as discussed above, an EVC may have a limit such that its discrete capacitors can only make 1500 switches (from in to out or from out to in) in a 15 millisecond time interval. The invention is not so limited, however, as the limit can be any number of switches for any time interval.

Returning to the exemplified method 370, the system determines a parameter value related to the plasma chamber or the matching network (operation 372), and determines a new match configuration for the at least one EVC based on the determined parameter value (operation 373). These steps can be performed in any of the manners discussed herein.

The system may then determine whether the system has already reached the switching limit (operation 374). If it has, the system may prevent the next match configuration from being carried out and instead determine the next match configuration (operations 372, 373). Note, however, that operation 374 is not required.

The system may further determine whether switching to the new match configuration will cause an EVC to reach the switching limit (operation 375). If not, the system may switch to the new EVC configuration(s) (operation 376). If so, the system then determines whether the new match configuration is for the high-priority pulse level or the low-priority pulse level (operation 377). If for the low-priority pulse level, the system prevents the switching of the at least one EVC to the new match configuration. If for the high-priority pulse level, however, the system switches to the new match configuration (operation 376). As shown, the process (starting at operation 372) may then be repeated. In this embodiment, there are only two pulse levels, and thus one is high-priority and one is low-priority. The invention is not so limited, as there may be more than two pulse levels. For example, if there were three pulse levels, one could be high-priority and two could be low priority, or two could be high-priority and one could be low priority. It is only required that one of the pulse levels is given a higher priority treatment in switching than one of the other pulse levels.

The number of discrete capacitors of an EVC that may be switched in or out may be limited based on pulse frequency. For example, there may be a limit of 5 discrete capacitors (each with a corresponding switch) that may be switched in or out for a 10 kHz level-to-level pulse frequency. If the determined match configuration requires more discrete capacitors to switch in or out than are allowed by the limit, the high priority state can be held. The system may be designed such that switching only occurs when the pulse state changes. Further, this limit on the discrete capacitors that may be switched in or out may be altered during matching.

In one embodiment, the higher-amplitude pulse level is the high priority pulse. This may allow, for example, maximum power delivery as quickly as possible. Alternatively, the lower-amplitude pulse level may be the high priority pulse. This may, for example, help prevent the plasma from flickering. It is further noted that the determination of the new match configuration may be based on, in addition to the parameter value, an amplitude of an upcoming pulse level of the at least two pulse levels.

As indicated, the above process may be carried out by an impedance matching network, such as those shown in FIGS. 1-3. The matching network may include an RF input configured to operably couple to the RF source, and an RF output configured to operably couple to the plasma chamber, and the at least one EVC. A control circuit of the matching network may be programmed to carry out the method 370 discussed above or a similar method.

The above process may be carried out as part of a method of manufacturing a semiconductor. Such a manufacturing method may include placing a substrate in the plasma chamber configured to deposit a material layer onto the substrate or etch a material layer from the substrate, and energizing plasma within the plasma chamber by coupling RF power from the RF source into the plasma chamber to perform a deposition or etching. Further, the matching network described above may form part of a semiconductor processing tool (such as tool 86 in FIG. 3), the tool including the plasma chamber 19 and the matching network 11A.

Finally, it is noted that there is also the potential to tune with disregard to the pulsing. In this case, the unit will switch until a tune state is met, and hold that state until more switches become available. This process will continue until both states have a known tune position. The disadvantage of this is, it will hold the tune position for a period of time which may cause a high reflected power ratio during the other pulse state. The advantage is, it will have the fastest possible tuning for the first state or the state that is given priority.

Restricted Switching Based on Blocking Voltage Value

As discussed with respect to FIG. 16, a switching circuit 640A for an EVC 651 of a matching network may include one or more power supplies 615A, 617A. In the exemplified switching circuit 640A, the first power switch 611A and the second power switch 613A are configured to asynchronously connect the high-voltage power supply 615A and the low voltage power supply 617A to the common output 607A for purposes of switching the PIN diode 661A between the ON state and the OFF state, and thereby switching the corresponding discrete capacitor 653A in and out.

In the exemplified embodiment, high-voltage power supply 615A provides a reverse-biasing DC voltage for the PIN diode switch 661A. This may be referred to as a "blocking voltage" as it reverse-biases the PIN diode 661A and thus prevents current from flowing, thus switching out its corresponding discrete capacitor 653A. As used herein, the term "blocking voltage" will refer to any voltage used to cause a switch to switch out or in its corresponding discrete capacitor. It is further noted that the switching circuit is not limited to that shown in FIG. 16, but may be any circuit for switching in and out discrete capacitors, including those shown in U.S. Pat. No. 9,844,127, which is incorporated herein by reference in its entirety.

In the exemplified switching circuit 640A, every time a switch 661A, 661B switches for a discrete capacitor 653A, 653B of the EVC 651, the switching pulls current from the high-voltage power supply 615A. If too much switching happens in a small period of time, the voltage level may drop such that it may no longer provide sufficient voltage to provide reverse-biasing of the switch. Thus, there is need for a method of restricting switching during impedance matching to prevent the blocking voltage from becoming too low while still ensuring sufficient impedance matching to minimize reflected power.

Figure 22:
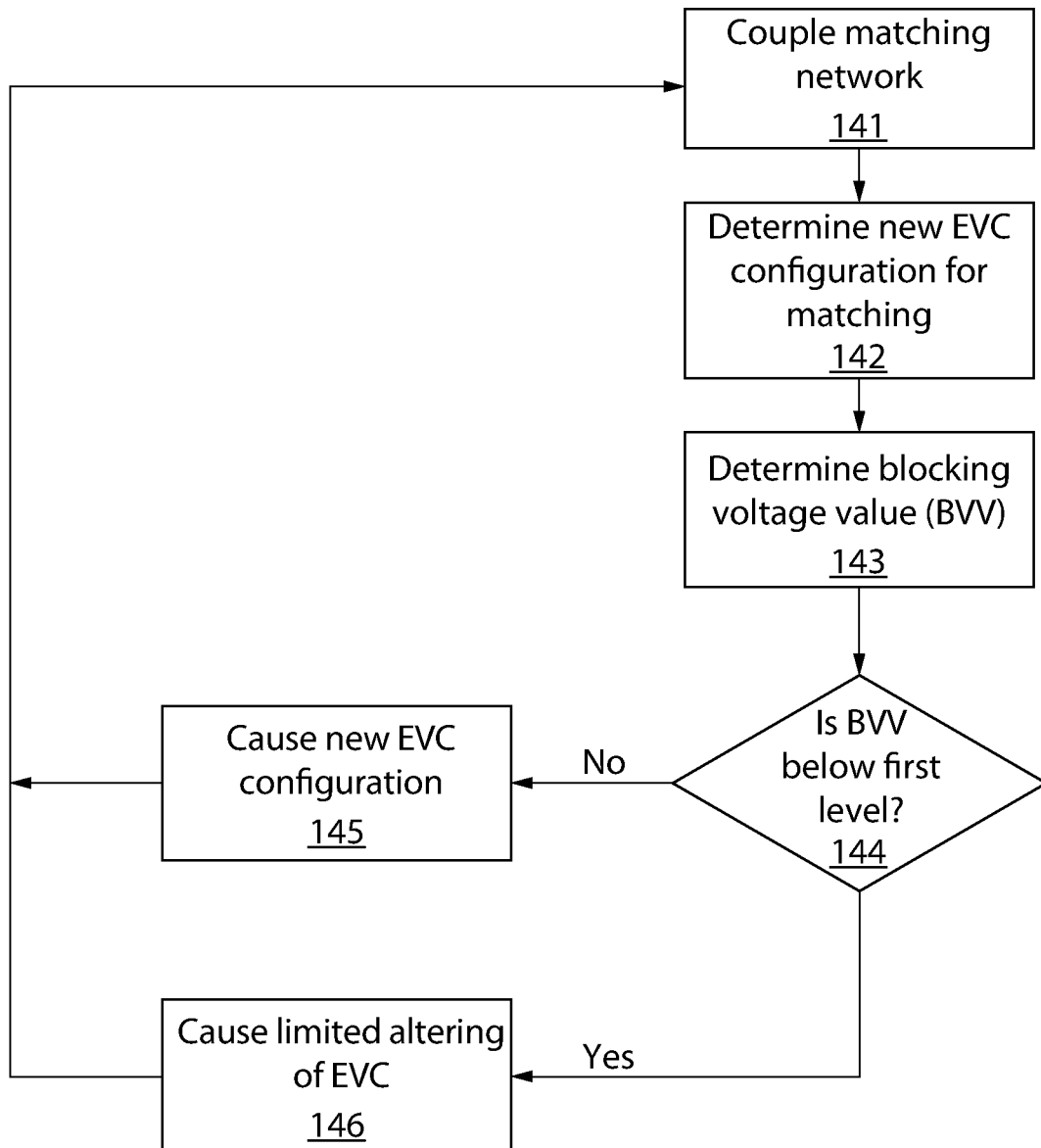
FIG. 22 is a flow chart of an impedance matching method where switching is limited based on a blocking voltage value according to one embodiment.

FIG. 22 is a flow chart of a method 140 of impedance matching according to one embodiment. In a first step 141, the impedance matching network is coupled between an RF source and a plasma chamber. The impedance matching network may include any of the features discussed herein, and shown, for example, in FIGS. 2-3. For example, the matching network may include one or more EVCs comprising discrete capacitors and corresponding switches, each switch configured to switch in and out one of the discrete capacitors to alter a capacitance of the EVC. Further, the switches may be operably coupled to a power supply (such as HV power supply 615A of FIG. 16) that is configured to provide a blocking voltage to the switches. As used herein, the term power supply may refer to a single power supply or a collection of two or more power supplies.

A control circuit (which may comprise one or more circuits) determines a new EVC configuration for the discrete capacitors to provide a new capacitance value that will enable impedance matching or at least reduce reflected power (step 142). The control circuit may be, for example, control circuit 645 of FIG. 16, which is operably coupled to the EVC. Next, the control circuit (or a different control circuit) determines a blocking voltage value of the power supply (step 143). This value may be based on a measured parameter related to the matching network (e.g., a measured voltage at the discrete capacitors or their switches). Next, the control circuit determines whether the blocking voltage value is at or below a first voltage level (step 144). If the blocking voltage value is not at or below a predetermined first level voltage, the system may carry out the new EVC configuration for impedance matching without any limitations on the discrete capacitors that may be switched (step 145). But if the blocking voltage value is at or below a predetermined first level voltage, the control circuit may cause a limited altering of the capacitance of the EVC (step 146). The limited altering may limit the number or type (or both number and type) of discrete capacitors to switch in or out based on the extent to which the blocking voltage value is at or below the first level. This limited altering may prevent the previously determined positioning of the discrete capacitors (for achieving an impedance match) from being fully carried out. This limited altering may be carried out in a number of ways, which will be described in detail below.

Methods for Restricted Switching

In the following methods and examples, the relevant EVC of the matching network comprises fine and coarse capacitors (e.g., coarse capacitors each have a capacitance at least twice as large as the capacitance any one of the fine capacitors). The fine capacitors may be referred to as Fine1, Fine2, Fine3, etc. A circuit monitors the output voltage level of the high voltage DC power supply. The system may prioritize limiting fine capacitors over limiting coarse capacitors, since limiting fine capacitors will generally have a lesser on the total capacitance of the EVC.

METHOD 1: In this method, the control software has multiple high voltage DC levels defined, such as:

| DC Voltage Level | Restrictions |
|---|---|
| Level 0 | No restrictions |
| Level 1 | Restrict Fine1 switch |
| Level 2 | Restrict Fine1 and Fine2 switches |
| Level 3 | Restrict Fine1, Fine2, and Fine3 switches |
| ... | ... |
| Level n (minimum level) | Restrict all switches |

When the monitored voltage reduces to one of the above levels, then the corresponding switch(es) are restricted from switching. Thus, as the blocking voltage value becomes lower, additional discrete capacitors are prevented from switching, until all discrete capacitors are prevented from switching. Put differently, when the blocking voltage value is at or below the first level, a first number of the discrete capacitors (one capacitor in this example) is prevented from switching; and when the blocking voltage value is at or below a second level, the second level lower than the first level, a second number of the discrete capacitors (two capacitors in this example) is prevented from switching, the second number being greater than the first number; and when the blocking voltage value is at or below a third level, the third level lower than the second level, a third number of the discrete capacitors (three capacitors in this example) is prevented from switching, the third number being greater than the second number, and so on. In other embodiments, such as method 2 discussed below, the first, second, and third number may increment by a number larger than one.

The voltage levels discussed herein (for this method as well as others) can be set to some calculated intervals (e.g., linear, quadratic, or exponential) or may be set with irregular intervals. The restrictions discussed herein may cause slightly higher reflected power in the period following the restriction, but this will still be better than restricting all switches from switching, which could result in much higher reflected power.

The restriction algorithms discussed herein can be applied to continuous wave and pulsing modes, including multi-level pulsing (such as level-to-level pulsing as discussed herein). When it is applied to level-to-level pulsing case, the control algorithm can choose to apply the restriction to the lower power pulse state, so that the higher power pulse state does not experience high reflected power.

Once a switching restriction is applied, the load on the high voltage DC power supply is reduced and the voltage level of the high voltage DC power supply starts increasing. When the voltage exceeds a pre-determined restriction-release level, then the restricted switch is enabled and is free to switch as needed. The restriction-release level can be greater-than-or-equal-to the restriction level. Having it greater-than will make it hysteretic, which may help reduce the limiting in subsequent steps.

METHOD 2: Restricted switching based on voltage level which reduces the number of capacitors to switch simultaneously with the step in the restriction being a value other than 1. This algorithm can be understood as a "coarser" version of method 1, since more than one switch may be newly restricted when a new level is reached.

| DC Voltage Level | Restrictions |
|---|---|
| Level 0 | No restrictions |
| Level 1 | Restrict Fine1 and Fine2 switches |
| Level 2 | Restrict Fine1, Fine2, Fine3, and Fine4 switches |
| Level 3 | Restrict Fine1, Fine2, Fine3, Fine4, and Fine5 switches |
| ... | ... |
| Level n (minimum level) | Restrict all switches |

METHOD 3: Restricted switching based on voltage level which reduces the number of capacitors to switch simultaneously:

| DC Voltage Level | Restrictions |
|---|---|
| Level 0 | No restrictions (X capacitors may switch) |
| Level 1 | X-1 capacitors may switch |
| Level 2 | X-2 capacitors may switch |
| Level 3 | X-3 capacitors may switch |
| ... | ... |
| Level n (minimum level) | X-X (zero) capacitors may switch |

In this method, where there is a restriction in the number of capacitors that may switch and it must be decided which capacitor to switch and which to restrict, the capacitor with the lowest priority will be restricted from switching (Fine1 having the lowest priority and CoarseMax having the highest priority). For example, for the next tune cycle N capacitors are determined to switch for an impedance matching, but N−1 capacitors are allowed. Fine1 and Fine2 are not calculated to switch, but Fine3 is calculated to switch. In this event, Fine3 would hold its position.

METHOD 4: Limit the number of switches to prevent a voltage drop by finding a value close to the desired value. According to this method, one may prefer a "coarser" or less precise impedance matching than the EVC position calculated to cause less switching. For example, the limited altering may prevent two fine capacitors from switching in favor of allowing one of the coarse capacitors to switch. Further, the discrete capacitors switched in or out may be dependent upon the discrete capacitors already switched in.

In one example, an accumulative setup (as described above) is used and "X" is the number of fine capacitors. The coarse and or fine capacitors allowed to switch in is dependent upon the number of fine capacitors already switched in.

| Determined EVC Position for Impedance Matching | Allowed Switching |
|---|---|
| Turn ON all fine capacitors | If number of fine capacitors already ON is < X/2, increment to next coarse capacitor and turn OFF all fine capacitors. If number of fine capacitors ON is ≥ X/2; turn ON all fine capacitors |

| Determined EVC Position for Impedance Matching | Allowed Switching |
|---|---|
| Turn OFF all fine capacitors | If number of fine capacitors already ON is < X/2, turn OFF all fine capacitors<br>If number of fine capacitors ON is ≥ X/2; decrement to next coarse capacitor and turn ON all fine capacitors |

In another example, the fine capacitors increase in binary fashion such that the fine capacitors have capacitances that increase by about a factor of about two, where "about two" refers to a value of 1.5 to 2.5. In an ideal example where there are no parasitic capacitances, the fine tune capacitors could increase by a factor of exactly two (e.g., 1 pF, 2 pF, 4 pF, 8 pF). U.S. Patent Publication No. US2019/0272978 is incorporated by reference in its entirety. 4 fine capacitors (F1 to F4) create 16 potential positions for the 4 fine capacitors when combined. The following Position Table shows the 16 potential positions for the fine capacitors, where "x" is used to show that a capacitor has been switched in, and C1-C10 are the coarse capacitors.

| Position Table | | | | | | | | | | | | | | |
|---|---|---|---|---|---|---|---|---|---|---|---|---|---|---|
| Position | C10 | C9 | C8 | C7 | C6 | C5 | C4 | C3 | C2 | C1 | F4 | F3 | F2 | F1 |
| 0 | | | | | | | | | | | | | | |
| 1 | | | | | | | | | | | | | | x |
| 2 | | | | | | | | | | | | | x | |
| 3 | | | | | | | | | | | | | x | x |
| 4 | | | | | | | | | | | | x | | |
| 5 | | | | | | | | | | | | x | | x |
| 6 | | | | | | | | | | | | x | x | |
| 7 | | | | | | | | | | | | x | x | x |
| 8 | | | | | | | | | | | x | | | |
| 9 | | | | | | | | | | | x | | | x |
| 10 | | | | | | | | | | | x | | x | |
| 11 | | | | | | | | | | | x | | x | x |
| 12 | | | | | | | | | | | x | x | | |
| 13 | | | | | | | | | | | x | x | | x |
| 14 | | | | | | | | | | | x | x | x | |
| 15 | | | | | | | | | | | x | x | x | x |

In the following example, something similar to grey code is used to find a close value with the least number of switches. A new position for matching is calculated, but an alternative position is carried out that provides a similar capacitance with less switching.

| Starting Position | Calculated Position for Impedance Match | Position Carried Out |
|---|---|---|
| Position 0 | Position 3 | Position 2 (turn on F2) or Position 4 (turn on F3) |
| Position 0 | Position 7 | Position 8 (turn on F4) |
| Position 15 | Position 8 | Position 7 (turn off cap 4) |

In another example, a hybrid setup is used such that the coarse capacitors are in an accumulative setup and the fine capacitors are in a binary setup. This example uses something like grey code to find a close value with the least number of switches or uses the closest coarse position.

| Starting Position | Calculated Position for Impedance Match | Position Carried Out |
|---|---|---|
| Position 0 | Position 3 | Position 2 (turn on F2) or Position 4 (turn on F3) |
| Position 0 | Position 7 | Position 8 (turn on F4) |
| Position 15 | Position 8 | Position 7 (turn off cap 4) |
| Position 0 | Position 15 | Turn on next coarse capacitor |
| Position 15 | Position 0 | Turn off previous coarse capacitor |

METHOD 5: Limit the number of simultaneous switches to prevent a voltage drop by finding a value close to (moving towards) the desired value. In the following examples, only one discrete capacitor changes per control step. This results in slower impedance matching (and thus potentially greater reflected power) but reduces the amount of switching to prevent drawing excessive current from the power supply.

In one example, the capacitors are in an accumulative setup. If the blocking voltage value must be increased, the fine capacitors are incremented until the desired value is reached. If the blocking voltage value must be decreased, the fine capacitors are decremented until the desired value is reached.

In another example, the capacitors are in a binary setup. With each control step, the largest value is changed that gets closest to the desired capacitor position without going past the value until the calculated value is attained.

| Starting Position | Calculated Position for Impedance Match | Actions Carried Out |
|---|---|---|
| Position 0 | Position 3 | Step 1: Turn on F2 and hold (Position 2)<br>Step 2: Turn on F1 (Position 3) |
| Position 0 | Position 7 | Step 1: Turn on F3 and hold (Position 4)<br>Step 2: Turn on F2 and hold (Position 6)<br>Step 3: Turn on F1 (Position 7) |
| Position 15 | Position 8 | Step 1: Turn off F3 and hold (Position 11)<br>Step 2: Turn off F2 and hold (Position 9)<br>Step 3: Turn off F1 (Position 8) |

In another example, the capacitors are in a binary setup. The values are changed such that the number of steps to the desired position is kept to a minimum with each control step until the calculated value is attained.

| Starting Position | Calculated Position for Impedance Match | Actions Carried Out |
|---|---|---|
| Position 7 | Position 8 | Step 1: Turn off F1 and hold (Position 6)<br>Step 2: Turn off F2 and hold (Position 4)<br>Step 3: Turn on F4 and hold (Position 12)<br>Step 4: Turn off F3 (Position 8) |

The above methods may be carried out as part of a method of manufacturing a semiconductor. Such a manufacturing method may include placing a substrate in the plasma chamber configured to deposit a material layer onto the substrate or etch a material layer from the substrate, and energizing plasma within the plasma chamber by coupling RF power from the RF source into the plasma chamber to perform a deposition or etching. Further, the matching network described above may form part of a semiconductor processing tool (such as tool 86 in FIG. 3), the tool including the plasma chamber 19 and the matching network 11A.

While the embodiments of a matching network discussed herein have used L or pi configurations, it is noted that he claimed matching network may be configured in other matching network configurations, such as a 'T' type configuration. Unless stated otherwise, the variable capacitors, switching circuits, and methods discussed herein may be used with any configuration appropriate for an RF impedance matching network.

While the embodiments discussed herein use one or more variable capacitors in a matching network to achieve an impedance match, it is noted that any variable reactance element can be used. A variable reactance element can include one or more discrete reactance elements, where a reactance element is a capacitor or inductor or similar reactive device.

This application incorporates by reference in its entirety U.S. Pub. No. US2018/076788. While the inventions have been described with respect to specific examples including presently preferred modes of carrying out the invention, those skilled in the art will appreciate that there are numerous variations and permutations of the above described systems and techniques. It is to be understood that other embodiments may be utilized and structural and functional modifications may be made without departing from the scope of the present inventions. Thus, the spirit and scope of the inventions should be construed broadly as set forth in the appended claims.

What is claimed is:

1. An impedance matching network, the network comprising:
   a radio frequency (RF) input configured to operably couple to an RF source;
   an RF output configured to operably couple to a plasma chamber;
   an electronically variable capacitor (EVC) comprising discrete capacitors and corresponding switches, each switch configured to switch in and out one of the discrete capacitors to alter a capacitance of the EVC, wherein the switches are operably coupled to a power supply configured to provide a blocking voltage to the switches; and
   a control circuit operably coupled to the EVC, the control circuit configured to:
   determine a blocking voltage value of the power supply based on a measured parameter related to the matching network; and
   upon determining the blocking voltage value is at or below a predetermined first level, cause a limited altering of the capacitance of the EVC, the limited altering limiting the number or type of discrete capacitors to switch in or out based on the extent to which the blocking voltage value is at or below the first level.

2. The matching network of claim 1 wherein the control circuit is further configured to, before altering the capacitance of the EVC, determine a positioning for the discrete capacitors to achieve an impedance match, the limited altering of the EVC preventing the determined positioning of the discrete capacitors from being fully carried out.

3. The matching network of claim 1:
   wherein the switches are PIN or NIP diodes;
   the power supply is a high-voltage direct current power supply configured to provide a reverse-biasing voltage for the PIN or NIP diode; and
   the limited altering limits the number and type of discrete capacitors to switch in or out.

4. The matching network of claim 1 wherein:
   when the blocking voltage value is at or below the first level, a first number of the discrete capacitors is prevented from switching;
   when the blocking voltage value is at or below a second level, the second level lower than the first level, a second number of the discrete capacitors is prevented from switching, the second number being greater than the first number; and
   when the blocking voltage value is at or below a third level, the third level lower than the second level, a third number of the discrete capacitors is prevented from switching, the third number being greater than the second number.

5. The matching network of claim 1 wherein, when the blocking voltage value drops below the first level to subsequent lower levels, at each new lower level an additional group of the discrete capacitors is limited from switching.

6. The matching network of claim 1 wherein:
   the discrete capacitors comprise fine capacitors and coarse capacitors; and
   as the blocking voltage value becomes lower, an increasing number of the fine capacitors is prevented from switching until all the fine capacitors are prevented from switching, at which time an increasing number of the coarse capacitors is prevented from switching until all the discrete capacitors are prevented from switching.

7. The matching network of claim 1 wherein, as the blocking voltage value becomes lower, additional discrete capacitors are prevented from switching.

8. The matching network of claim 1 wherein:
   the discrete capacitors comprise fine capacitors and coarse capacitors; and
   wherein the limited altering prevents at least two of the fine capacitors from switching in favor of allowing one of the coarse capacitors to switch.

9. The matching network of claim 1:
   wherein the discrete capacitors switched in or out is dependent upon the discrete capacitors already switched in; or
   wherein the limited altering is limited to switching only one discrete capacitor for a control step over a plurality of control steps.

10. A semiconductor processing tool comprising:
a plasma chamber configured to deposit a material onto a substrate or etch a material from the substrate; and
an impedance matching network comprising:
- a radio frequency (RF) input configured to operably couple to an RF source;
- an RF output configured to operably couple to the plasma chamber;
- an electronically variable capacitor (EVC) comprising discrete capacitors and corresponding switches, each switch configured to switch in and out one of the discrete capacitors to alter a capacitance of the EVC, wherein the switches are operably coupled to a power supply configured to provide a blocking voltage to the switches; and
- a control circuit operably coupled to the EVC, the control circuit configured to:
  - determine a blocking voltage value of the power supply based on a measured parameter related to the matching network; and
  - upon determining the blocking voltage value is at or below a predetermined first level, cause a limited altering of the capacitance of the EVC, the limited altering limiting the number or type of discrete capacitors to switch in or out based on the extent to which the blocking voltage value is at or below the first level.

11. A method of matching an impedance, the method comprising:
operably coupling a radio frequency (RF) input of a matching network to an RF source, and operably coupling an RF output of the matching network to a plasma chamber, wherein the matching network comprises:
an electronically variable capacitor (EVC) comprising discrete capacitors and corresponding switches, each switch configured to switch in and out one of the discrete capacitors to alter a capacitance of the EVC, wherein the switches are operably coupled to a power supply configured to provide a blocking voltage to the switches;
determining a blocking voltage value of the power supply based on a measured parameter related to the matching network; and
upon determining the blocking voltage value is at or below a predetermined first level, causing a limited altering of the capacitance of the EVC, the limited altering limiting the number or type of discrete capacitors to switch in or out based on the extent to which the blocking voltage value is at or below the first level.

12. The method of claim 11 further comprising, before altering the capacitance of the EVC, determining a positioning for the discrete capacitors to achieve an impedance match, the limited altering of the EVC preventing the determined positioning of the discrete capacitors from being fully carried out.

13. The method of claim 11:
wherein the switches are PIN or NIP diodes;
the power supply is a high-voltage direct current power supply configured to provide a reverse-biasing voltage for the PIN or NIP diode; and
the limited altering limits the number and type of discrete capacitors to switch in or out.

14. The method of claim 11 wherein:
when the blocking voltage value is at or below the first level, a first number of the discrete capacitors is prevented from switching;
when the blocking voltage value is at or below a second level, the second level lower than the first level, a second number of the discrete capacitors is prevented from switching, the second number being greater than the first number; and
when the blocking voltage value is at or below a third level, the third level lower than the second level, a third number of the discrete capacitors is prevented from switching, the third number being greater than the second number.

15. The method of claim 11 wherein, when the blocking voltage value drops below the first level to subsequent lower levels, at each new lower level an additional group of the discrete capacitors is limited from switching.

16. The method of claim 11 wherein:
the discrete capacitors comprise fine capacitors and coarse capacitors; and
as the blocking voltage value becomes lower, an increasing number of the fine capacitors is prevented from switching until all the fine capacitors are prevented from switching, at which time an increasing number of the coarse capacitors is prevented from switching until all the discrete capacitors are prevented from switching.

17. The method of claim 11 wherein, as the blocking voltage value becomes lower, additional discrete capacitors are prevented from switching.

18. The method of claim 11 wherein:
the discrete capacitors comprise fine capacitors and coarse capacitors; and
wherein the limited altering prevents at least two of the fine capacitors from switching in favor of allowing one of the coarse capacitors to switch.

19. The method of claim 11:
wherein the discrete capacitors switched in or out is dependent upon the discrete capacitors already switched in; or
wherein the limited altering is limited to switching only one discrete capacitor for a control step over a plurality of control steps.

20. A method of manufacturing a semiconductor, the method comprising:
placing a substrate in a plasma chamber configured to deposit a material layer onto the substrate or etch a material layer from the substrate;
operably coupling a radio frequency (RF) input of a matching network to an RF source, and operably coupling an RF output of the matching network to the plasma chamber, wherein the matching network comprises:
an electronically variable capacitor (EVC) comprising discrete capacitors and corresponding switches, each switch configured to switch in and out one of the discrete capacitors to alter a capacitance of the EVC, wherein the switches are operably coupled to a power supply configured to provide a blocking voltage to the switches;
determining a blocking voltage value of the power supply based on a measured parameter related to the matching network;
upon determining the blocking voltage value is at or below a predetermined first level, causing a limited altering of the capacitance of the EVC, the limited altering limiting the number or type of discrete capacitors to switch in or out based on the extent to which the blocking voltage value is at or below the first level.

* * * * *